(12) United States Patent
Higuchi et al.

(10) Patent No.: US 11,649,539 B2
(45) Date of Patent: May 16, 2023

(54) DEPOSITION MASK GROUP, MANUFACTURING METHOD OF ELECTRONIC DEVICE, AND ELECTRONIC DEVICE

(71) Applicant: Dai Nippon Printing Co., Ltd., Tokyo (JP)

(72) Inventors: Takuya Higuchi, Tokyo (JP); Hiromitsu Ochiai, Tokyo (JP); Hiroki Oka, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 17/305,614

(22) Filed: Jul. 12, 2021

(65) Prior Publication Data

US 2021/0371968 A1 Dec. 2, 2021

Related U.S. Application Data

(63) Continuation of application No. PCT/JP2020/002312, filed on Jan. 23, 2020.

(30) Foreign Application Priority Data

Jan. 31, 2019 (JP) .............................. JP2019-016274

(51) Int. Cl.
  *H01L 21/285* (2006.01)
  *C23C 14/04* (2006.01)
  *H01L 51/52* (2006.01)
(52) U.S. Cl.
  CPC ...... *C23C 14/042* (2013.01); *H01L 21/28506* (2013.01); *H01L 51/5221* (2013.01)

(58) Field of Classification Search
  CPC . C23C 14/042; C23C 14/24; H01L 21/28506; H01L 51/5221; H01L 51/5203;
  (Continued)

(56) References Cited

U.S. PATENT DOCUMENTS 9,806,257 B2 * 10/2017 Takeda ............... H01L 51/0011
2002/0150674 A1 10/2002 Utsugi et al.
(Continued)

FOREIGN PATENT DOCUMENTS

CN    104134681 A    11/2014
CN    108866476 A    11/2018
(Continued)

OTHER PUBLICATIONS

International Search Report and Written Opinion (Application No. PCT/JP2020/002312) dated Mar. 31, 2020.
(Continued)

*Primary Examiner* — Kyoung Lee
*Assistant Examiner* — Christina A Sylvia
(74) *Attorney, Agent, or Firm* — Burr Patent Law, PLLC

(57) ABSTRACT

A deposition mask group includes a first deposition mask having two or more first through holes arranged along two different directions, a second deposition mask having two or more second through holes arranged along two different directions and a third deposition mask having two or more third through holes. The first through hole and the second through hole or the third through hole partly overlap when the first deposition mask, the second deposition mask and the third deposition mask are overlapped.

8 Claims, 41 Drawing Sheets

(58) Field of Classification Search
CPC ............. H01L 51/0023; H01L 51/5228; H01L 51/0011; H01L 51/5225
See application file for complete search history.

(56) References Cited

U.S. PATENT DOCUMENTS

| | | |
|---|---|---|
| 2006/0062978 A1 | 3/2006 | Yotsuya et al. |
| 2011/0037065 A1 | 2/2011 | Ueno et al. |
| 2011/0163327 A1 | 7/2011 | Ueno et al. |
| 2012/0146010 A1 | 6/2012 | Ueno et al. |
| 2014/0008638 A1 | 1/2014 | Otsuki et al. |
| 2016/0260923 A1 | 9/2016 | Wu |
| 2016/0322595 A1 | 11/2016 | Choi et al. |
| 2017/0269745 A1 | 9/2017 | Ding et al. |
| 2020/0357998 A1 | 11/2020 | Bai et al. |
| 2021/0257423 A1* | 8/2021 | Furuie ................. H01L 51/0011 |

FOREIGN PATENT DOCUMENTS

| | | |
|---|---|---|
| JP | 2000-082582 A1 | 3/2000 |
| JP | 2003-231961 A1 | 8/2003 |
| JP | 2010-272891 A1 | 12/2010 |
| JP | 2011-119681 A1 | 6/2011 |
| JP | 2012-069963 A1 | 4/2012 |
| TW | 200615389 A | 5/2006 |
| WO | 2012/018082 A1 | 2/2012 |
| WO | 2012/132126 A1 | 10/2012 |

OTHER PUBLICATIONS

Taiwanese Office Action (with English translation) dated Apr. 13, 2022 (Application No. 109102973).
U.S. Office Action dated May 6, 2022 (U.S. Appl. No. 17/644,404).
Extended European Search Report dated May 24, 2022 (Application No. 22154551.0).
English translation of International Preliminary Report on Patentability (Chapter I) (Application No. PCT/JP2020/002312) dated Aug. 12, 2021, 7 pages.
Extended European Search Report dated Oct. 7, 2022 (Application No. 20748708.3).

* cited by examiner

DEPOSITION MASK GROUP, MANUFACTURING METHOD OF ELECTRONIC DEVICE, AND ELECTRONIC DEVICE

CROSS-REFERENCE TO RELATED APPLICATIONS

This application is a continuation application of International Application No. PCT/JP2020/2312, filed on Jan. 23, 2020, which claims the benefit of priority from Japanese Patent Application No. 2019-16274, filed on Jan. 31, 2019. The entire contents of these applications are incorporated herein by reference.

BACKGROUND

Field

Embodiments of the present disclosure relate to a deposition mask group, a manufacturing method of an electronic device and an electronic device.

Background Art

A display used in a portable device such as a smartphone and a tablet PC is desired to be of high definition. For example, such a display preferably has a pixel density of 400 ppi or more. There is also an increasing demand for a portable device which supports ultrahigh definition. In the case of ultra high definition, a pixel density of a display is preferably 800 ppi or more, for example.

Among displays, an organic EL display is attracting attention because of its good responsiveness, low power consumption and high contrast. A method of forming pixels and electrodes by means of a deposition mask with through holes is known as a method of forming pixels of an organic EL display. For example, a substrate on which an anode is formed in a pattern corresponding to pixels is prepared first. Then, an organic material is deposited onto the anode via the through holes of the deposition mask to form the organic layer on the anode. Following thereto, a conductive material is deposited onto the organic layer via the through holes of the deposition mask to form a cathode on the organic layer.
Patent Document 1: JP2000-82582A

SUMMARY

When seen along a normal direction of the substrate, the cathode of the electronic device, such as the organic EL display, may be formed not only at a portion overlapping the anode and the organic layer, but also at a portion not overlapping the anode and the organic layer. The larger planar dimension the cathode has, the lower an electric resistance of the cathode becomes, which results in better electric properties. On the other hand, the larger planar dimension the cathode has, the lower a light transmittance of the electronic device including the substrate, the anode, the organic layer and the cathode becomes.

The object of the embodiment of the preset disclosure is to provide a deposition mask group capable of effectively solving such a problem.

A deposition mask group according to one embodiment of the present disclosure comprises a first deposition mask having two or more first through holes arranged along two different directions, a second deposition mask having two or more second through holes arranged along two different directions and a third deposition mask having two or more third through holes. The first through hole partly overlaps the second through hole or the third through hole when the first deposition mask, the second deposition mask and the third deposition mask are overlapped.

At least one embodiment of the present disclosure can regulate a resistance and a planar dimension of an electrode formed on a substrate.

DETAILED DESCRIPTION

Figure 1:
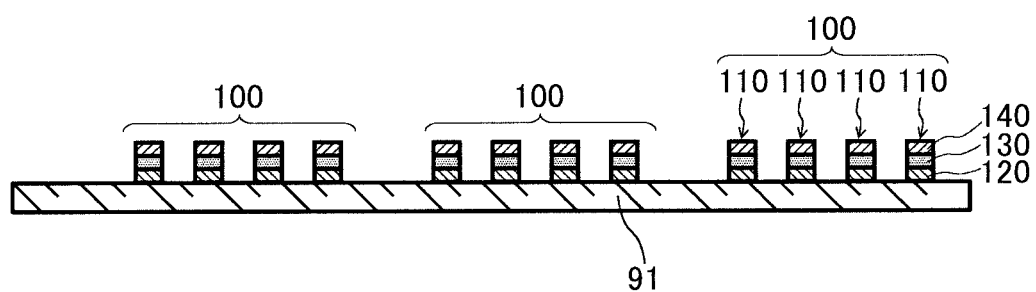
FIG. 1 is a sectional view showing an example of an electronic device produced by using a deposition mask group according to one embodiment of the present disclosure.

In the specification and the drawings, terms meaning a substance that forms basis of a composition, such as "substrate", "base member", "plate", "sheet", "film", etc. are not differentiated from one another based only on the difference of terms, unless otherwise specified.

In the specification and the drawings, terms specifying shapes, geometric conditions and their degrees, e.g., "parallel", "orthogonal", etc., and values of a length and an angle are not limited to their strict definitions, but construed to include a range capable of exerting a similar function, unless otherwise specified.

In the specification and the drawings, when a certain structure such as a member or an area is located "above", "below", "on an upper side", "on a lower side" or "upward" and "downward" another structure, a case where a certain structure is in direct contact with another structure is conceivable, unless otherwise specified. Further, a case where other structure is positioned between a certain structure and another structure, i.e., a case where a certain structure and another structure are in indirect contact with each other is also conceivable. Unless otherwise specified, "up", "upper side" and "upward/above" or "down", "lower side" and "downward/below" can be vertically reversed.

In the specification and the drawings, the same or similar numerals are given to the same parts or parts having similar functions, and the repeated description thereof may be omitted. In addition, a dimensional ratio of the drawings may differ from an actual one for convenience of explanation, and/or a part of a structure may be omitted from the drawings.

In the specification and the drawings, an embodiment of the present disclosure may be combined with another embodiment, to the extent that there is no contradiction, unless otherwise specified. In addition, other embodiments may be combined with one another, to the extent that there is no contradiction.

In the specification and the drawings, when a plurality of steps of a method, such as a manufacturing method, are disclosed, another step that is not disclosed may be performed between the disclosed steps, unless otherwise specified. In addition, the order of the disclosed steps is optional, to the extent that there is no contradiction.

In the specification and the drawings, a numerical range represented by a symbol "-" includes numerical values placed before and after the symbol "-". For example, a numeral range defined by the expression "34-38% by mass" is the same as as a numerical range defined by an expression "34% by mass or more and 38% by mass or less".

In this embodiment, an example in which a deposition mask group comprising a plurality of deposition masks is used for forming an electrode in a desired pattern on a substrate during manufacture of an organic EL display is described. However, the use of the deposition mask group is not particularly limited, and this embodiment can be applied to the deposition mask group used for various purposes. For example, the deposition mask group in this embodiment may be used to form electrodes of a device for displaying or projecting an image or a video for showing virtual reality, so-called VR, or augmented reality, so-called AR. In addition, the deposition mask group in this embodiment may be used to form electrodes of a display other than an organic EL display, such as electrodes of a liquid display. Moreover, the deposition mask group in this embodiment may be used to form electrodes of an electronic device other than a display, such as electrodes of a pressure sensor.

An embodiment of the present disclosure is described in detail below, with reference to the drawings. The embodiment shown herebelow is an example of embodiments of the present disclosure, and the present disclosure should not be construed as being confined to these embodiments only.

A first embodiment of the preset disclosure is a deposition mask group comprising:

a first deposition mask having two or more first through holes arranged along two different directions;

a second deposition mask having two or more second through holes arranged along two different directions; and a third deposition mask having two or more third through holes;

wherein the first through hole partly overlaps the second through hole or the third through hole when the first deposition mask, the second deposition mask and the third deposition mask are overlapped.

A second embodiment of the present disclosure is that, in the deposition mask group according to the aforementioned first embodiment, the two or more first through holes may have two or more mask first main areas arranged along two different directions and two or more mask first extension areas extending from the mask first main area, and the mask first extension area may partly overlap the second through hole or the third through hole when the first deposition mask, the second deposition mask and the third deposition mask are overlapped.

A third embodiment of the present disclosure is that, in the deposition mask group according to the aforementioned second embodiment, the two or more second through holes may include two or more mask second main areas arranged along two different directions and two or more mask second extension areas extending from the mask second main area, or the two or more third through holes may include two or more mask third main areas arranged along two different directions, and two or more mask third extension areas extending from the mask third main area; and at least one of the two or more mask first extension areas may entirely or partly overlap the mask second extension area or the mask third extension area when the first deposition mask, the second deposition mask and the third deposition mask are overlapped.

A fourth embodiment of the present disclosure is that, in the deposition mask group according to the aforementioned third embodiment, the mask second extension area overlapping the mask first extension area or the mask third extension area overlapping the mask first extension area may partly overlap the mask first main area.

A fifth embodiment of the present disclosure is that, in the deposition mask group according to each of the aforementioned second embodiment to the aforementioned fourth embodiment, a dimension of the mask first extension area may be 0.9 times or less a dimension of the mask first main area in a direction orthogonal to a direction in which the mask first extension area extends.

A sixth embodiment of the present disclosure is that, in the deposition mask group according to each of the aforementioned second embodiment to the aforementioned fifth embodiment, an arrangement direction of the mask first main areas and a direction in which the mask first extension area extends from the mask first main area may correspond.

A seventh embodiment of the present disclosure is that, in the deposition mask group according to each of the aforementioned second embodiment to the aforementioned fifth embodiment, an arrangement direction of the mask first main areas and a direction in which the mask first extension area extends from the mask first main area may differ.

An eighth embodiment of the present disclosure is that, in the deposition mask group according to the aforementioned first embodiment, the two or more first through holes may include two or more mask first main areas arranged along two different directions and two or more mask first auxiliary areas; and the mask first auxiliary area may extend to partly overlap the two second through holes adjacent to each other, may extend to partly overlap the two third through holes adjacent to each other or may extend to partly overlap the second through hole and the third through hole adjacent to each other when the first deposition mask, the second deposition mask and the third deposition mask are overlapped.

A ninth embodiment of the present disclosure is that, in the deposition mask group according to the aforementioned eighth embodiment, a dimension of the mask first auxiliary area may be 0.9 times or less a dimension of the mask first main area in a direction orthogonal to a direction in which the mask first auxiliary area extends.

A tenth embodiment of the present disclosure is that, in the deposition mask group according to the aforementioned ninth embodiment, the mask first auxiliary area may be connected to the mask first main area.

An eleventh embodiment of the present disclosure is that, in the deposition mask group according to the aforementioned ninth embodiment, the mask first auxiliary area may not be connected to the mask first main area.

A twelfth embodiment of the present disclosure is that, in the deposition mask group according to each of the aforementioned first embodiment to the aforementioned eleventh embodiment, at least one of the two or more first through holes may be connected to another one of the first through holes via the second through hole and the third through hole when the first deposition mask, the second deposition mask and the third deposition mask are overlapped.

A thirteenth embodiment of the present disclosure is that, in the deposition mask group according to each of the aforementioned first embodiment to the aforementioned eleventh embodiment, at least one of the two or more first through holes may be connected to another one of the first through holes via the second through hole or the third through hole when the first deposition mask, the second deposition mask and the third deposition mask are overlapped.

A fourteenth embodiment of the preset disclosure is a deposition mask group comprising:

a first deposition mask having two or more first through holes arranged along a first direction; and a second deposition mask having two or more second through holes;

wherein:

the first through hole includes two or more mask first main areas arranged along a second direction intersecting the first direction, and a mask first extension area extending to connect the two mask first main areas adjacent to each other in the second direction, the mask first extension area having a dimension smaller than the mask first main area in a direction orthogonal to the second direction; and the first through hole may partly overlap the second through hole when the first deposition mask and the second deposition mask are overlapped.

A fifteenth embodiment of the present disclosure is that, in the deposition mask according to the aforementioned fourteenth embodiment, at least one of the two or more mask first main areas may be connected to another one of the mask first main areas via the second through hole when the first deposition mask and the second deposition mask are overlapped.

A sixteenth embodiment of the present disclosure is that, in the deposition mask according to the aforementioned fourteenth embodiment or the aforementioned fifteenth embodiment, the mask first extension area may entirely or partly overlap the second through hole when the first deposition mask and the second deposition mask are overlapped.

A seventeenth embodiment of the present disclosure is that, in the deposition mask according to the aforementioned sixteenth embodiment, the second through hole may entirely or partly overlap the two mask first main areas adjacent to each other in the second direction and the mask first extension area connected to the two mask first main areas when the first deposition mask and the second deposition mask are overlapped.

An eighteenth embodiment of the present disclosure is that, in the deposition mask group according to each of the aforementioned fourteenth embodiment to the aforementioned seventeenth embodiment, a dimension of the mask first extension area may be 0.9 times or less a dimension of the mask first main area in a direction orthogonal to the second direction.

A nineteenth embodiment of the present disclosure is a deposition mask group comprising:

a first deposition mask having two or more first through holes; and a second deposition mask having two or more second through holes;

wherein:

the two or more first through holes include two or more mask first main areas arranged along a first direction and arranged along a second direction intersecting the first direction, and two or more mask first auxiliary areas located between the two mask first main areas adjacent to each other in the second direction, the mask first auxiliary area having a dimension smaller than the mask first main area in the second direction;

the two or more second through holes are arranged along the first direction and the second direction; and the mask first auxiliary area extends to partly overlap the two second through holes adjacent to each other in the first direction when the first deposition mask and the second deposition mask are overlapped.

A twentieth embodiment of the present disclosure is that, in the deposition mask according to the aforementioned nineteenth embodiment, the second through hole may extend to partly overlap the two mask first main areas adjacent to each other in the second direction when the first deposition mask and the second deposition mask are overlapped.

A twenty-first embodiment of the present disclosure is that, in the deposition mask according to the aforementioned nineteenth embodiment or the aforementioned twentieth embodiment, a dimension of the mask first auxiliary area may be 0.9 times or less a dimension of the mask first main area in the second direction.

A twenty-second embodiment of the present disclosure is a manufacturing method of an electronic device comprising:

a second-electrode forming step of forming a second electrode on an energizing layer on a first electrode on a substrate by using the deposition mask group according to any one of the aforementioned first embodiment to the aforementioned thirteenth embodiment, wherein the second-electrode forming step comprises:

a step of forming a first layer of the second electrode by a deposition method using the first deposition mask;

a step of forming a second layer of the second electrode by a deposition method using the second deposition mask; and a step of forming a third layer of the second electrode by a deposition method using the third deposition mask.

A twenty-third embodiment of the present disclosure is a manufacturing method of an electronic device comprising:

a second-electrode forming step of forming a second electrode on an energizing layer on a first electrode on a substrate by using the deposition mask group according to any one of the aforementioned fourteenth embodiment to the aforementioned twenty-first embodiment, wherein the second-electrode forming step comprises:

a step of forming a first layer of the second electrode by a deposition method using the first deposition mask; and a step of forming a second layer of the second electrode by a deposition method using the second deposition mask.

A twenty-fourth embodiment of the present disclosure is an electronic device comprising:

a first electrode located on a substrate;

two or more energizing layers located on the first electrode and arranged along two different directions; and two or more second electrodes located on the energizing layers;

wherein:

the second electrode comprises two or more first layers arranged along two different directions, two or more second layers arranged along two different directions, and two or more third layers; and the first layer partly overlaps the second layer or the third layer.

A twenty-fifth embodiment of the present disclosure is that, in the electronic device according to the aforementioned twenty-fourth embodiment, the two or more first layers may include two or more electrode first main areas arranged along two different directions and two or more electrode first extension areas extending from the electrode first main area to partly overlap the second layer or the third layer.

A twenty-sixth embodiment of the present disclosure is that, in the electronic device according to the aforementioned twenty-fifth embodiment, the two or more second layers may include two or more electrode second main areas arranged along two different directions and two or more electrode second extension areas extending from the electrode second main areas, or the two or more third layers may include two or more electrode third main areas arranged along two different directions and two or more electrode third extension areas extending from the electrode third main areas, and at least one of the two or more electrode first extension areas may entirely or partly overlap the electrode second extension area or the electrode third extension area.

A twenty-seventh embodiment of the present disclosure is that, in the electronic device according to the aforementioned twenty-sixth embodiment, the electrode second extension area overlapping the electrode first extension area or the electrode third extension area overlapping the electrode first extension area may partly overlap the electrode first main area.

A twenty-eighth embodiment of the present disclosure is that, in the electronic device according to each of the aforementioned twenty-fifth embodiment to the aforementioned twenty-seventh embodiment, a dimension of the electrode first extension area may be 0.9 times or less a dimension of the electrode first main area in a direction orthogonal to a direction in which the electrode first extension area extends.

A twenty-ninth embodiment of the present disclosure is that, in the electronic device according to each of the aforementioned twenty-fifth embodiment to the aforementioned twenty-eighth embodiment, an arrangement direction of the electrode first main areas and a direction in which the electrode first extension area extends from the electrode first main area may correspond.

A thirtieth embodiment of the present disclosure is that, in the electronic device according to each of the aforementioned twenty-fifth embodiment to the aforementioned twenty-eighth embodiment, an arrangement direction of the electrode first main areas and a direction in which the electrode first extension area extends from the electrode first main area may differ.

A thirty-first embodiment of the present disclosure is that, in the electronic device according to the aforementioned twenty-fourth embodiment, the two or more first layers may include two or more electrode first main areas and two or more electrode first auxiliary areas arranged along two different directions; and the electrode first auxiliary area may extend to partly overlap the two second layers adjacent to each other, may extend to partly overlap the two third layers adjacent to each other or may extend to partly overlap the second layer and the third layer adjacent to each other.

A thirty-second embodiment of the present disclosure is that, in the electronic device according to the aforementioned thirty-first embodiment, a dimension of the electrode first auxiliary area may be 0.9 times or less a dimension of the electrode first main area in a direction orthogonal to a direction in which the electrode first auxiliary area extends.

A thirty-third embodiment of the present disclosure is that, in the electronic device according to the aforementioned thirty-second embodiment, the electrode first auxiliary area may be connected to the electrode first main area.

A thirty-fourth embodiment of the present disclosure is that, in the electronic device according to the aforementioned thirty-second embodiment, the electrode first auxiliary area may not be connected to the electrode first main area.

A thirty-fifth embodiment of the present disclosure is that, in the electronic device according to each of the aforementioned twenty-fourth embodiment to the aforementioned thirty-fourth embodiment, at least one of the two or more first layers may be connected to another one of the first layers via the second layer and the third layer.

A thirty-sixth embodiment of the present disclosure is that, in the electronic device according to each of the aforementioned twenty-fourth embodiment to the aforementioned thirty-fourth embodiment, at least one of the two or more first layers may be connected to another one of the first layers via the second layer or the third layer.

A thirty-seventh embodiment of the present disclosure is an electronic device comprising:
a first electrode located on a substrate;
an energizing layer located on the first electrode; and
a second electrode located on the energizing layer;
wherein:
the second electrode comprises two or more first layers arranged along a first direction, and two or more second layers;
the first layer includes two or more electrode first main areas arranged along a second direction intersecting the first direction, and an electrode first extension area extending to connect the two electrode first main areas adjacent to each other in the second direction, the electrode first extension area having a dimension smaller than the electrode first main area in a direction orthogonal to the second direction; and
the first layer partly overlaps the second layer.

A thirty-eighth embodiment of the present disclosure is that, in the electronic device according to the aforementioned thirty-seventh embodiment, at least one of the two or more electrode first main areas may be connected to another one of the electrode first main areas via the second layer.

A thirty-ninth embodiment of the present disclosure is that, in the electronic device according to the aforementioned thirty-seventh embodiment or the aforementioned thirty-eighth embodiment, the electrode first extension area may entirely or partly overlap the second layer.

A fortieth embodiment of the present disclosure is that, in the electronic device according to the aforementioned thirty-ninth embodiment, the second layer may entirely or partly overlap the two electrode first main areas adjacent to each other in the second direction and the electrode first extension area connected to the two electrode first main areas.

A forty-first embodiment of the present disclosure is that, in the electronic device according to each of the aforementioned thirty-seventh embodiment to the aforementioned fortieth embodiment, a dimension of the electrode first auxiliary area may be 0.9 times or less a dimension of the electrode first main area in a direction orthogonal to the second direction.

A forty-second embodiment of the present disclosure is an electronic device comprising:
a first electrode located on a substrate;
an energizing layer located on the first electrode; and
a second electrode located on the energizing layer;
wherein:
the second electrode comprises two or more first layers and two or more second layers;
the two or more first layers include two or more electrode first main areas arranged along a first direction and arranged along a second direction intersecting the first direction and two or more electrode first auxiliary areas located between the two electrode first main areas adjacent to each other in the second direction, the electrode first auxiliary area having a dimension smaller than the electrode first main area in the second direction;
the two or more second layers are arranged along the first direction and the second direction; and the electrode first auxiliary area extends to partly overlap the two second layers adjacent to each other in the first direction.

A forty-third embodiment of the preset disclosure is that, in the electronic device according to the aforementioned forty-second embodiment, the second layer may extend to partly overlap the two electrode first main areas adjacent to each other in the second direction.

A forty-fourth embodiment of the preset disclosure is that, in the electronic device according to the aforementioned forty-second embodiment or the aforementioned forty-third embodiment, a dimension of the electrode first auxiliary area may be 0.9 times or less a dimension of the electrode first main area in the second direction.

An example of an electronic device 100 comprising an electrode formed by using the deposition mask group in this embodiment is described herebelow.

FIG. 1 is a sectional view showing an electronic device 100. The electronic device 100 may comprise a substrate 91 and a plurality of elements 110 arranged along an in-plane direction of the substrate 91. Although not shown, the elements 110 may be arranged along a depth direction of FIG. 1. Each element 100 may have a first electrode 120, an energizing layer 130 located on the first electrode 120 and a second electrode 140 located on the energizing layer 130.

The substrate 91 may be a plate member having insulating properties. The substrate 91 preferably has transparency allowing light to pass therethrough.

When the substrate 91 has predetermined transparency, the transparency of the substrate 91 preferably allows light emitted from the energizing layer 130 to pass therethrough for display. For example, a transmittance of the substrate 91 in a visible light region is preferably 80% or more, and more preferably 90% or more. A transmittance of the substrate 91 can be measured by a test method for a total light transmittance of a plastic-transparent material according to JIS K7361-1.

The substrate 91 may or may not have flexibility, which can be suitably selected depending on the application of the electronic device 100.

A material of the substrate 91 may be, for example, a rigid material without flexibility such as quartz glass, Pyrex (registered trademark) glass or a synthetic quartz plate, or a flexible material with flexibility such as a resin film, an optical resin plate or thin glass. The substrate may be a laminated body having a barrier layer(s) on one side or both sides of a resin film.

A thickness of the substrate 91 can be suitably selected depending on the material used for the substrate 91 and/or the application of the electronic device 100, and may be, for example, 0.005 mm or more. The thickness of the substrate 91 may be 5 mm or less.

The element 100 is configured to implement some function by voltage applied between the first electrode 120 and the second electrode 140, or by current flowing between the first electrode 120 and the second electrode 140.

The first electrode 120 contains a conductive material. For example, the first electrode 120 contains a metal, a conductive metal oxide, another conductive inorganic material, etc. The first electrode 120 may contain a transparent and conductive metal oxide such as indium tin oxide.

Examples of a material constituting the first electrode 120 may include metals such as Au, Cr, Mo, Ag and Mg; inorganic oxides such as indium tin oxide called ITO, indium zinc oxide called IZO, zinc oxide and indium oxide;

and conductive polymers such as metal-doped polythiophene. These conductive materials may be used alone or in combination of two or more. When two or more of these conductive materials are used, layers made of respective materials may be laminated. In addition, an alloy containing two or more materials may be used. For example, a magnesium alloy such as MgAg may be used.

The energizing layer 130 is a layer that implements some function when it is energized. To energize the energizing layer 130 means that voltage is applied to the energizing layer 130 or current flows through the energizing layer 130. The energizing layer 130 may be, for example, a layer that emits light when energized, a layer whose light transmittance and/or refractive index change when energized, and the like. The energizing layer 130 may contain a semiconductor material. The semiconductor material may be either an organic semiconductor material or an inorganic semiconductor material.

When the energizing layer 130 includes a light emitting layer that emits light when energized, the energizing layer 130 may further include a hole injection layer, a hole transport layer, an electronic transport layer, an electronic injection layer, and the like.

For example, when the first electrode 120 is an anode, the energizing layer 130 may have a hole injection transport layer between the light emitting layer and the first electrode 120. The hole injection transport layer may be a hole injection layer having a hole injection function or a hole transport layer having a hole transport function, or it may have both a hole injection function and a hole transport function. The hole injection transport layer may be a laminated body including a hole injection layer and a hole transport layer.

When the second electrode 140 is a cathode, the energizing layer 130 may have an electron injection transport layer between the light emitting layer and the second electrode 140. The electron injection transport layer may be an electron injection layer having an electron injection function or an electron transport layer having an electron transport function, or it may have both an electron injection function and an electron transport function. The electron injection transport layer may be a laminated body including an electron injection layer and an electron transport layer.

The light emitting layer contains a light emitting material. The light emitting layer may contain an additive that improves leveling properties.

A known material can be used as the light emitting material. For example, light emitting materials such as a pigment-based material, a metal complex-based material or a polymer-based material can be used.

Examples of the pigment-based material include, for example, cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perinone derivatives, perylene derivatives, oligothiophene derivatives, oxaziazole dimers, pyrazoline dimers, and the like.

Examples of the metal complex-based material include, for example, metal complexes having as central metal Al, Zn, Be, etc., or a rare earth metal such as Tb, Eu, Dy, etc., and having as a ligand oxadiazole, thiadiazole, phenylpyridine, phenyl benzimidazole, quinolone structure, etc., such as aluminum quinolinol complex, benzoquinolinol beryllium complex, benzooxazole zinc complex, benzothiazole zinc complex, azomethyl zinc complex, porphyrin zinc complex, eurobium complex, and the like.

Examples of the polymer-based material include, for example, polyparaphenylenevinylene derivatives, polythiophene derivatives, polyparaphenylene derivatives, polysilane derivatives, polyacetylene derivatives, polyvinylcarbazole derivatives, polyfluorene derivatives, polyquinoxaline derivatives, and copolymers thereof, and the like.

The light emitting layer may contain a dopant for the purpose of improving light emitting efficiency, changing a wavelength of emitted light, and the like. Examples of the dopant include, for example, perylene derivatives, coumarin derivatives, rubrene derivatives, quinacridone derivatives, squalium derivatives, porphyrin derivatives, styryl-based dye, tetracene derivatives, pyrazoline derivatives, decacyclene, phenoxazone, quinoxaline derivatives, carbazole derivatives, fluorene derivatives, and the like. In addition, an organometallic complex having a heavy metal ion such as platinum or iridium at the center to exhibit phosphorescence may be used as the dopant. The dopant materials may be used alone or in combination of two or more.

For example, materials described in the paragraphs 0094 to 0099 of JP2010-272891A, and the paragraphs 0053 to 0057 of WO2012/132126 may be used as the light emitting material and the dopant.

A thickness of the light emitting layer is not particularly limited as long as it can provide a field for recombination of electrons and holes and can exhibit a function of emitting light. For example, the thickness may be 1 nm or more and 500 nm or less.

A known material can be used as a hole injection transport material used for the hole injection transport layer. For example, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, polythiophene derivatives, polyaniline derivatives, polypyrrole derivatives, phenylamine derivatives, anthracene derivatives, carbazole derivatives, fluorene derivatives, distyrylbenzene derivatives, polyphenylenevinylene derivatives, porphyrin derivatives, styrylamine derivatives, and the like may be used. In addition, Spiro compounds, phthalocyanine compounds, metal oxides and the like can be exemplified. Moreover, for example, compounds described in JP2011-119681A, WO2012/018082, JP2012-069963A and the paragraph 0106 of WO2012/132126 may be suitably selected and used.

When the hole injection transport layer is a laminated body including a hole injection layer and a hole transport layer, the hole injection layer may contain an additive A, the hole transport layer may contain the additive A, or the hole injection layer and the hole transport layer may contain the additive A. The additive A may be either a low molecular weight compound or a high molecular weight compound. To be specific, the additive A may be a fluorine-based compound, an ester-based compound, or a hydrocarbon-based compound.

A known material can be used as electron injection transport material used for the electron injection transport layer. For example, alkaline metals, alkaline metal alloys, alkaline metal halides, alkaline earth metals, alkaline earth metal halides, alkaline earth metal oxides, alkaline metal organic complexes, magnesium halides and oxides, aluminum oxides, and the like may be used. In addition, examples of the electron injection transport material may include, for example, bathocuproine, bathophenanthroilne, phenanthroline derivatives, triazole derivatives, oxadiazole derivatives, pyridine derivatives, nitro-substituted fluorene derivatives, anthracinodimethane derivatives, diphenylquinone derivatives, thiopyrandioxide derivatives, aromatic ring tetracarboxylic acid anhydrides such as naphthalene and perylene, carbodiimides, fluorenilidene methane derivatives, anthracinodimethane derivatives, anthrone derivatives, quinoxaline derivatives, metal complexes such as quinolinol complex, phthalocyanine compounds, distyrylpyrazine derivatives, and the like.

A metal doped layer in which an electron transport organic material is doped with an alkali metal or an alkaline earth metal may be formed to be used as the electron injection transport layer. The electron transport organic material may be, for example, metal complexes such as bathocuproine, bathophenanthroline, phenanthroline derivatives, triazole derivatives, oxadiazole derivatives, pyridine derivatives, tris(8-quinolinolato) aluminum ($Alq_3$), and polymer derivatives thereof and the like. The metals for doping may be Li, Cs, Ba, Sr and the like.

The second electrode 140 contains a conductive material such as a metal. The second electrode 140 is formed on the energizing layer 130 by a deposition method using a deposition mask 20 described later. Examples of materials constituting the second electrode 140 include platinum, gold, silver, copper, iron, tin, chromium, aluminum, indium, lithium, sodium, potassium, calcium, magnesium, chromium, carbon and the like. These materials may be used alone or in combination of two or more. When two or more of these materials are used, layers made of respective materials may be laminated. In addition, an alloy containing two or more materials may be used. For example, alloys such as magnesium alloys such as MgAg, aluminum alloys such as AlLi, AlCa, AlMg, etc., alkaline metals, alkaline earth metals may be used.

When the electronic device 100 is an organic EL display, the element 110 is a pixel, and the energizing layer 130 includes a light emitting layer.

As shown in FIG. 1, a plurality of the elements 110 corresponding to a plurality of the electronic devices 100 may be provided on one substrate 91. When the electronic device 100 is a display such as an organic EL display, one electronic device 100 corresponds to one screen.

Figure 2:
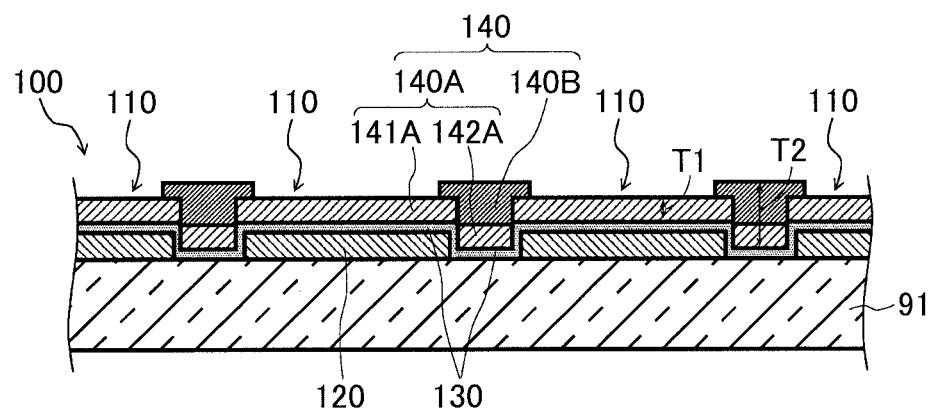
FIG. 2 is an enlarged sectional view showing an element of the electronic device shown in FIG. 1.

FIG. 2 is an enlarged sectional view showing the electronic device 100. FIG. 2 is a sectional view along a II-II line of the electronic device 100 shown in FIG. 6 described later. In FIG. 2, when seen along the normal direction of the substrate 91, a part in which the first electrode 120 and the second electrode 140 overlap, with the energizing layer 130 located between the first electrode 120 and the second electrode 140, is indicated as the element by a reference numeral 110. As shown in FIG. 2, when seen along the normal direction of the substrate 91, the second electrode 140 may be positioned not only in an area where it overlaps the first electrode 120, but also in an area where it does not overlap the first electrode 120. In the description below, a state in which the two constituent elements overlap when seen along a normal direction of a plate-shaped member such as the substrate 91 and the deposition mask 20, is sometimes simply expressed as being they "overlap".

The second electrode 140 shown in FIG. 2 is described in detail. The second electrode 140 has a first layer 140A and a second layer 140B. The first layer 140A is a layer formed by a deposition method using a first deposition mask 20A described later. The first layer 140A includes an electrode main area 141A overlapping the first electrode 120, and an electrode first extension area 142A located between the two adjacent elements 110. The electrode first extension area 142A may be connected to or not connected to the electrode first main area 141A. When the electrode first extension area 142A is not connected to the electrode first main area 141A, the electrode first extension area 142A is electrically connected to the electrode first main area 141A via the second layer 140B.

The second layer 140B is a layer formed by a deposition method using a second deposition mask 20B described later. As shown in FIG. 2, the second layer 140B overlaps the electrode first extension area 142A of the first layer 140A. The provision of the second layer 1406 increases a thickness of the second electrode 140 located between the two adjacent elements 110. Thus, an electric resistance between the electrode first main areas 141A of the two adjacent elements 110 can be reduced, as compared with a case in which the second layer 1408 is not present.

In FIG. 2, a reference numeral T1 depicts a minimum value of a thickness of a part of the second electrode 140, which constitutes the element 110, and a reference numeral T2 depicts a maximum value of a thickness of a part of the second electrode 140, which is located between the two adjacent elements 110. The thickness T2 is larger than the thickness T1 by the thickness of the second layer 140B. The thickness T2 may be 1.2 times or more the thickness T1, may be 1.5 times or more the thickness T1, may be 1.8 times or more the thickness T1, may be 2.0 times or more the thickness T1, may be 2.2 times or more the thickness T1, or may be 2.5 times or more the thickness T1. Thus, an electric resistance between the electrode first main areas 141A of the two adjacent elements 110 can be reduced. The thickness T2 may be 5.0 times or less the thickness T1, may be 4.5 times or less the thickness T1, may be 4.0 times or less the thickness T1, may be 3.5 times or less the thickness T1, or may be 3.0 times or less the thickness T1.

A range of T2/T1, which is a ratio of the thickness T2 to the thickness T1, may be defined by a first group consisting of 1.2, 1.5, 1.8, 2.0, 2.2 and 2.5, and/or a second group consisting of 3.0, 3.5, 4.0, 4.5 and 5.0. The range of T2/T1 may be defined by a combination of any one of the values included in the aforementioned first group, and any one of the values included in the aforementioned second group. The range of T2/T1 may be defined by a combination of any two of the values included in the aforementioned first group. The range of T2/T1 may be defined by a combination of any two of the values included in the aforementioned second group. For example, T2/T1 may be 1.2 or more and 5.0 or less, may be 1.2 or more and 4.5 or less, may be 1.2 or more and 4.0 or less, may be 1.2 or more and 3.5 or less, may be 1.2 or more and 3.0 or less, may be 1.2 or more and 2.5 or less, may be 1.2 or more and 2.2 or less, may be 1.2 or more and 2.0 or less, may be 1.2 or more and 1.8 or less, may be 1.2 or more and 1.5 or less, may be 1.5 or more and 5.0 or less, may be 1.5 or more and 4.5 or less, may be 1.5 or more and 4.0 or less, may be 1.5 or more and 3.5 or less, may be 1.5 or more and 3.0 or less, may be 1.5 or more and 2.5 or less, may be 1.5 or more and 2.2 or less, may be 1.5 or more and 2.0 or less, may be 1.5 or more and 1.8 or less, may be 1.8 or more and 5.0 or less, may be 1.8 or more and 4.5 or less, may be 1.8 or more and 4.0 or less, may be 1.8 or more and 3.5 or less, may be 1.8 or more and 3.0 or less, may be 1.8 or more and 2.5 or less, may be 1.8 or more and 2.2 or less, may be 1.8 or more and 2.0 or less, may be 2.0 or more and 5.0 or less, may be 2.0 or more and 4.5 or less, may be 2.0 or more and 4.0 or less, may be 2.0 or more and 3.5 or less, may be 2.0 or more and 3.0 or less, may be 2.0 or more and 2.5 or less, may be 2.0 or more and 2.2 or less, may be 2.2 or more and 5.0 or less, may be 2.2 or more and 4.5 or less, may be 2.2 or more and 4.0 or less, may be 2.2 or more and 3.5 or less, may be 2.2 or more and 3.0 or less, may be 2.2 or more and 2.5 or less, may be 2.5 or more and 5.0 or less, may be 2.5 or more and 4.5 or less, may be 2.5 or more and 4.0 or less, may be 2.5 or more and 3.5 or less, may be 2.5 or more and 3.0 or less, may be 3.0 or more and 5.0 or less, may be 3.0 or more and 4.5 or less, may be 3.0 or more and 4.0 or less, may be 3.0 or more and 3.5 or less, may be 3.5 or more and 5.0 or less, may be 3.5 or more and 4.5 or less, may be 3.5 or more and 4.0 or less, may be 4.0 or more and 5.0 or less, may be 4.0 or more and 4.5 or less, or may be 4.5 or more and 5.0 or less.

Each of the above ranges related to the ratio of the thickness T2 to the thickness T1 may be adopted in an embodiment other than the embodiment shown in FIGS. 1 to 16.

The thickness T1 may be 10 nm or more, may be 20 nm or more, may be 50 nm or more, may be 100 nm or more, or may be 200 nm or more. The thickness T1 may be 10 μm or less, may be 5 μm or less, may be 2 μm or less, may be 1 μm or less, or may be 500 nm or less.

A range of the thickness T1 may be defined by a first group consisting of 10 nm, 20 nm, 50 nm, 100 nm and 200 nm, and/or a second group consisting of 10 μm, 5 μm, 2 μm, 1 μm and 500 nm. The range of the thickness T1 may be defined by a combination of any one of the values included in the aforementioned first group, and any one of the values included in the aforementioned second group. The range of the thickness T1 may be defined by a combination of any two of the values included in the aforementioned first group. The range of the thickness T1 may be defined by a combination of any two of the values included in the aforementioned second group. For example, the thickness T1 may be 10 nm or more and 10 μm or less, may be 10 nm or more and 5 μm or less, may be 10 nm or more and 2 μm or less, may be 10 nm or more and 1 μm or less, may be 10 nm or more and 500 nm or less, may be 10 nm or more and 200 nm or less, may be 10 nm or more and 100 nm or less, may be 10 nm or more and 50 nm or less, may be 10 nm or more and 20 nm, may be 20 nm or more and 10 μm or less, may be 20 nm or more and 5 μm or less, may be 20 nm or more and 2 μm or less, may be 20 nm or more and 1 μm or less, may be 20 nm or more and 500 nm or less, may be 20 nm or more and 200 nm or less, may be 20 nm or more and 100 nm or less, may be 20 nm or more and 50 nm or less, may be 50 nm or more and 10 μm or less, may be 50 nm or more and 5 μm or less, may be 50 nm or more and 2 μm or less, may be 50 nm or more and 1 μm or less, may be 50 nm or more and 500 nm or less, may be 50 nm or more and 200 nm or less, may be 50 nm or more and 100 nm or less, may be 100 nm or more and 10 μm or less, may be 100 nm or more and 5 μm or less, may be 100 nm or more and 2 μm or less, may be 100 nm or more and 1 μm or less, may be 100 nm or more and 500 nm or less, may be 100 nm or more and 200 nm or less, may be 200 nm or more and 10 μm or less, may be 200 nm or more and 5 μm or less, may be 200 nm or more and 2 μm or less, may be 200 nm or more and 1 μm or less, may be 200 nm or more and 500 nm or less, may be 500 nm or more and 10 μm or less, may be 500 nm or more and 5 μm or less, may be 500 nm or more and 2 μm or less, may be 500 nm or more and 1 μm or less, may be 1 μm or more and 10 μm or less, may be 1 μm or more and 5 μm or less, may be 1 μm or more and 2 μm or less, may be 2 μm or more and 10 μm or less, may be 2 μm or more and 5 μm or less, or may be may be 5 μm or more and 10 μm or less.

Each of the above ranges related to the thickness T1 may be adopted in an embodiment other than the embodiment shown in FIGS. 1 to 16.

Next, an example of a structure of each layer of the element 110 of the electronic device 100 seen along the normal direction of the substrate 91 is described.

Figure 3:
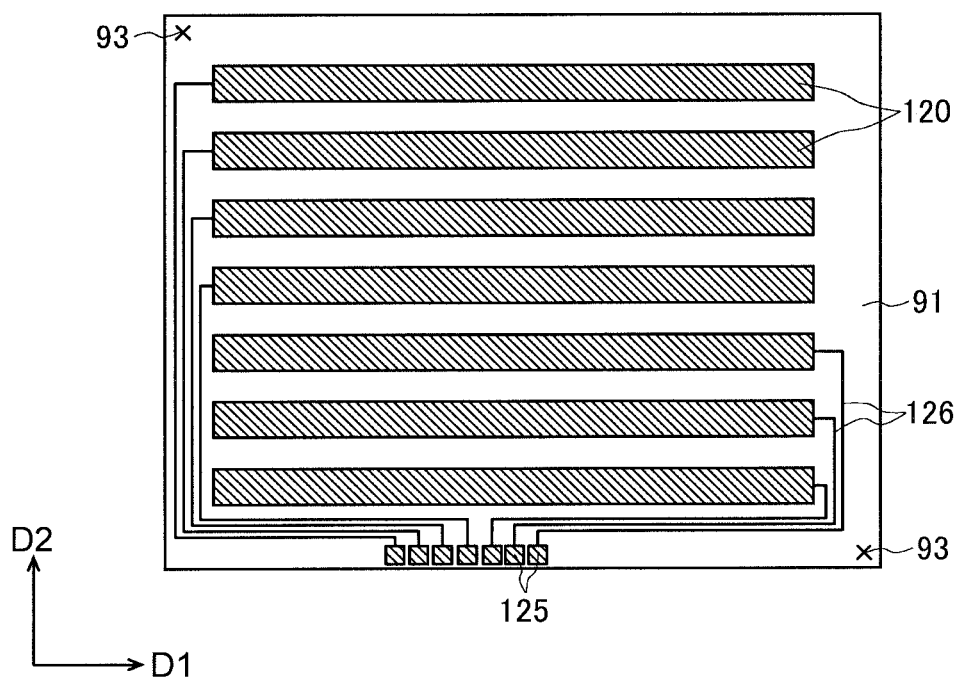
FIG. 3 is a plan view showing an example of a substrate on which a first electrode is formed.

FIG. 3 is a plan view showing an example of the substrate 91 on which the first electrode 120 is formed. As shown in FIG. 3, the first electrode 120 may have a stripe shape extending in a first direction D1. A plurality of the first electrodes 120 may be arranged in a second direction D2 intersecting the first direction D1. In the example shown in FIG. 3, the first direction D1 and the second direction D2 are directions in which an outer edge of the substrate 91 extends. The second direction D2 may be orthogonal to the first direction D1.

The substrate 91 may be provided with a plurality of terminal portions 125 arranged along the outer edge of the substrate 91, and wirings 126 electrically connecting the terminal portions 125 and the first electrodes 120. The terminal portions 125 and the wirings 126 may be formed on the substrate 91 by the same material as the first electrodes 120 in the same step.

The substrate 91 may be provided with an alignment mark 93. The alignment mark 93 is formed on, for example, a corner of the substrate 91. The alignment mark 93 may be used for positioning the substrate 91 in a step in which respective layers of the element 110 are formed on the substrate 91. For example, the alignment mark 93 may be used for adjusting the position of the below-described deposition mask 20 with respect to the substrate 91.

Figure 4:
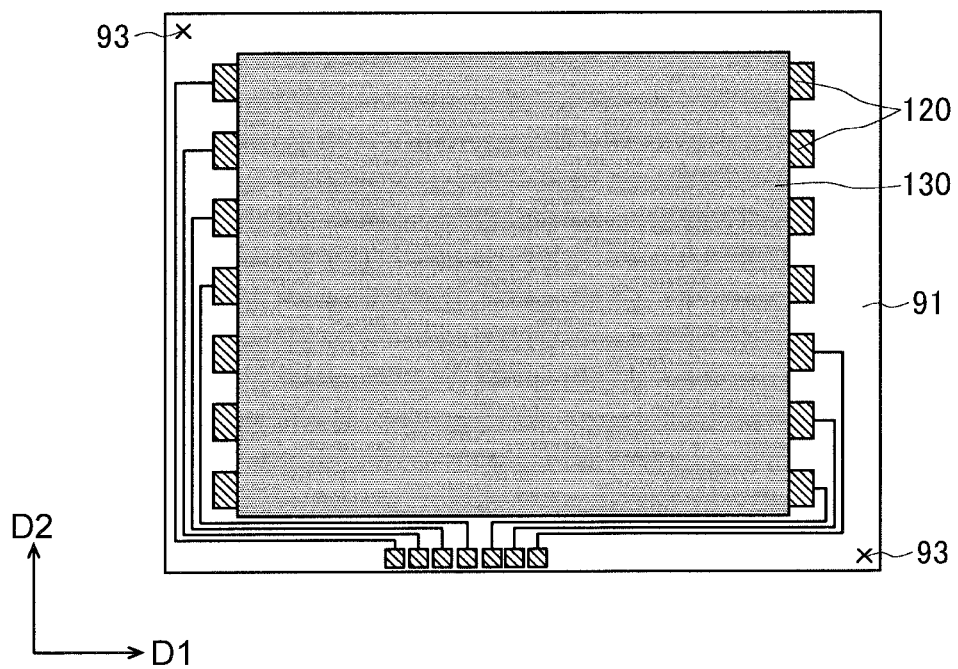
FIG. 4 is a plan view showing an example of the substrate on which the first electrode and an energizing layer are formed.

FIG. 4 is a plan view showing an example of the substrate 91 on which the first electrode 120 and the energizing layer 130 are formed. In the example shown in FIG. 4, the energizing layer 130 is formed to spread across a plurality of the first electrodes 120. The energizing layer 130 shown in FIG. 4 may be formed by depositing an organic material onto the substrate 91 and onto the first electrodes 120 by a deposition method using a deposition mask having a through hole corresponding to the shape of the energizing layer 130.

Figure 5:
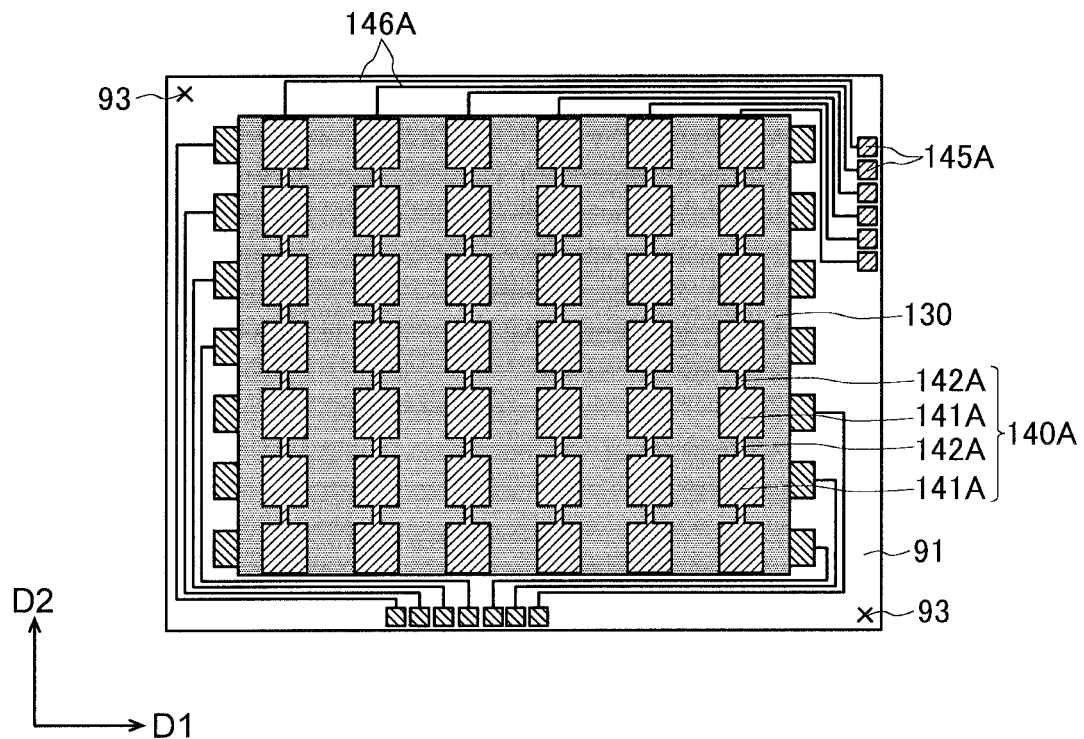
FIG. 5 is a plan view showing an example of the substrate on which the first electrode, the energizing layer, and a first layer of a second electrode are formed.

FIG. 5 is a plan view showing an example of the substrate 91 on which the first electrode 120, the energizing layer 130 and the first layer 140A of the second electrode 140 are formed. As shown in FIG. 5, the first layer 140A may extend in the second direction D2. A plurality of the first layers 140A may be arranged in the first direction D1.

As shown in FIG. 5, the first layer 140A may include a plurality of the electrode main areas 141A arranged in the second direction D2 and the electrode first extension area 142A extending to connect the two electrode first main areas 141A adjacent to each other in the second direction D2. The electrode first main area 141A is located to entirely or partly overlap the first electrode 120. In this case, when voltage is applied between the first electrode 120 and the electrode first main area 141A of the second electrode 140, the energizing layer 130 located therebetween is driven. When the energizing layer 130 is a light emitting layer, light is emitted from the energizing layer 130. The light then emerges outside from the second electrode 140 side or the first electrode 120 side.

As shown in FIG. 5, the substrate 91 may be provided with a plurality of terminal portions 145A arranged along the outer edge of the substrate 91 and wirings 146A electrically connecting the terminal portions 145A and the first layers 140A of the second electrodes 140. The terminal portions 145A and the wirings 146A may be formed on the substrate 91 by the same material as the first layers 140A of the second electrodes 140 in the same step. Namely, the terminal portions 145A and the wirings 146A may be formed simultaneously with the first layers 140A by a deposition method using the first deposition mask 20A. Thus, relative positional precision of the terminal portions 145A and the wirings 146A with respect to the first layers 140A can be improved.

As shown in FIG. 5, a dimension of the electrode first extension area 142A is smaller than a dimension of the electrode first main area 141A in a direction orthogonal to the second direction D2 in which the two adjacent electrode first main areas 141A are arranged. Namely, a width of the first extension area 142A is smaller than a width of the electrode first main area 141A. In other words, in a direction orthogonal to the second direction D2, the first layer 140A has a first dimension and a second dimension smaller than the first dimension. Areas having the first dimension and areas having the second dimension are alternately arranged in the second direction D2. Thus, light easily transmits through the electronic device 100 in an area between the two elements 110 adjacent to each other in the second direction D2. Therefore, a transmittance of the entire electronic device 100 can be improved, as compared with a case in which the electrode first extension area 142A has the same width as the electrode first main area 141A.

As described below, the electrode first main area 141A is mainly made by a deposition material having passed through a mask first main area 26A of the first deposition mask 20A. The electrode first extension area 142A is mainly made by the deposition material having passed through a mask first extension area 27A of the first deposition mask 20A. Thus, the dimension of the electrode first main area 141A corresponds to a dimension of the mask first main area 26A, while the dimension of the electrode first extension area 142A corresponds to a dimension of the mask first extension area 27A. For example, a ratio of the width of the electrode first extension area 142A with respect to the width of the electrode first main area 141A corresponds to a below-described ratio of a dimension W12 of the mask first extension area 27A with respect to a dimension W11 of the mask first main area 26A.

When the width of the electrode first extension area 142A is smaller than the width of the electrode first main area 141A, an electric resistance between the two adjacent electrode first main areas 141A increases. In this embodiment, the aforementioned second layer 140B is formed on the electrode first extension area 142A, in consideration of this point.

Figure 6:
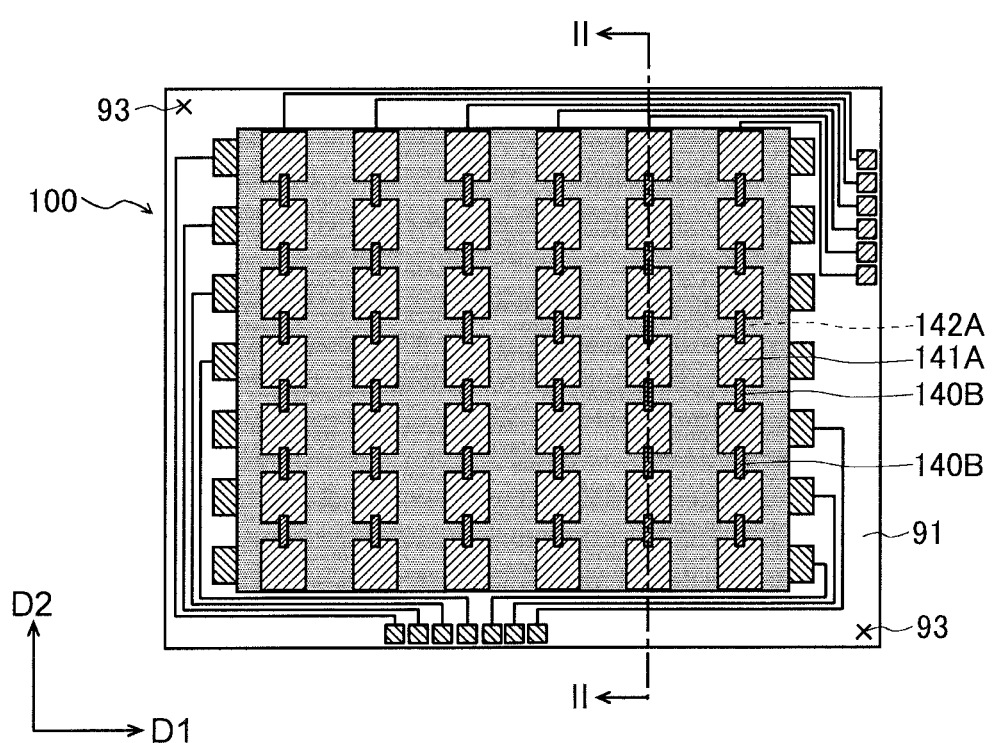
FIG. 6 is a plan view showing an example of the substrate on which the first electrode, the energizing layer, the first layer of the second electrode and a second layer of the second electrode are formed.

FIG. 6 is a plan view showing an example of the substrate 91 on which the first electrode 120, the energizing layer 130, the first layer 140A of the second electrode 140 and the second layer 140B of the second electrode 140 are formed. As shown in FIG. 6, the second layer 140B entirely or partly overlaps the electrode first extension area 142A located between the two electrode first main areas 141A adjacent to each other in the second direction D2. Thus, an electric resistance between the two adjacent electrode first main areas 141A can be reduced. The second layer 140B may partly overlap the two electrode first main areas 141A adjacent to each other in the second direction D2.

The aforementioned terminal portions 145A and the wirings 146A may be formed simultaneously with the second layers 140B by a deposition method using the second deposition mask 20B. Thus, relative positional precision of the terminal portions 145A and the wirings 146A with respect to the second layers 140B can be improved. Further, the aforementioned terminal portions 145A and the wirings 146A may include a layer formed by the deposition method using the second deposition mask 20B, in addition to a layer formed by the deposition method using the first deposition mask 20A.

Figure 7:
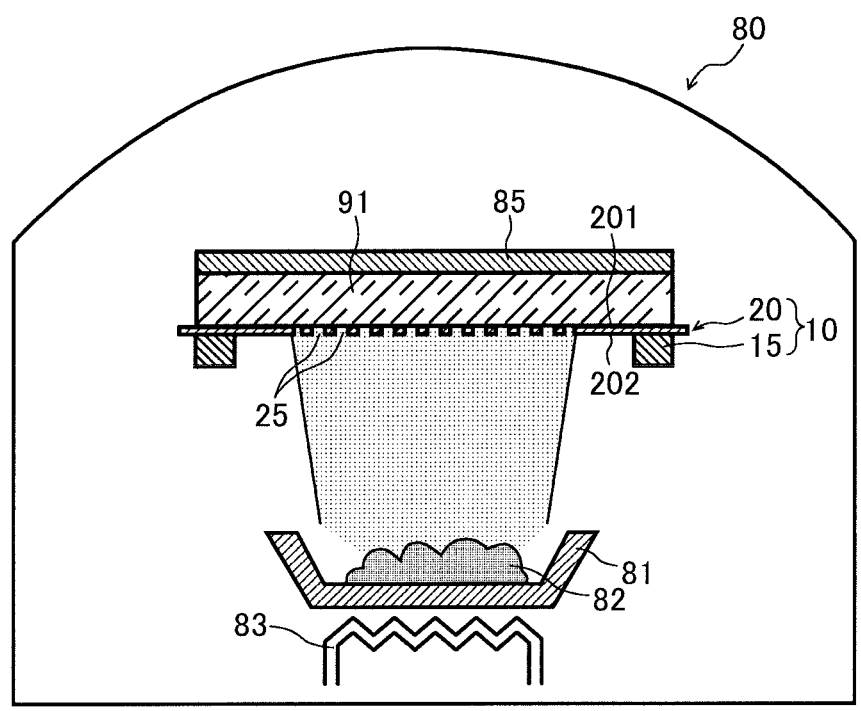
FIG. 7 is a view showing a deposition apparatus comprising a deposition mask apparatus.

Next, a method of forming the second electrode 140 of the aforementioned electronic device 100 by a deposition method is described. FIG. 7 is a view showing a deposition apparatus 80 that performs a deposition process by which a deposition material is deposited onto a target object.

As shown in FIG. 7, the deposition apparatus 80 may comprise therein a deposition source 81, a heater 83 and a deposition mask apparatus 10. The deposition apparatus 80 may further comprise an evacuation means for creating a vacuum atmosphere inside the deposition apparatus 80. The deposition source 81 is, for example, a crucible, and accommodates a deposition material 82 such as an organic luminescent material. The heater 83 heats the deposition source 81 to evaporate the deposition material 82 under a vacuum atmosphere. The deposition mask apparatus 10 is located to face the deposition source 81.

As shown in FIG. 7, the deposition mask apparatus 10 comprises at least one deposition mask 20. The deposition mask apparatus 10 may further comprise a frame 15 that supports the deposition mask 20. The frame 15 may support the deposition mask 20 such that tension is applied to the deposition mask 20 in order to suppress bending of the deposition mask 20.

The below-described first deposition mask 20A, the second deposition mask 20B and a third deposition deposition mask 20C may be used as the deposition mask 20 of the deposition mask apparatus 10. In the below description, when a structure of the deposition mask, which is common to the first deposition mask 20A, the second deposition mask 20B and the third deposition mask 20C, is described, the term "deposition mask" and the the reference numeral "20" are used. Similarly, a constituent element of the deposition mask 20, such as an effective area, which is common to the first deposition mask 20A, the second deposition mask 20B and the third deposition mask 20C, is described, a digit reference numeral without alphabet, such as "22", is used. On the other hand, when contents peculiar to each of the first deposition mask 20A, the second deposition mask 20B and the third deposition mask 20C are described, a digit reference numeral with a corresponding alphabet such as "A", "B" or "C" attached thereto is used.

As shown in FIG. 7, the deposition mask apparatus 10 is located in the deposition apparatus 80 such that the deposition mask 20 faces the substrate 91 onto which the deposition material 82 is to be deposited. The deposition mask 20 has a plurality of through holes 25 through which the deposition material 82 flying from the deposition source 81 passes. In the description below, a surface of the deposition mask 20, which is positioned on the substrate 91 side is referred to as a first surface 201, and a surface of the deposition mask 20, which is positioned oppositely to the first surface 201, is referred to as a second surface 202. The flying deposition material 82 is deposited onto the substrate 91.

As shown in FIG. 7, the deposition mask apparatus 10 may comprise a magnet 85 located on a surface of the substrate 91, which is on the opposite side of the deposition mask 20. Due to the provision of the magnet 85, the deposition mask 20 can be attracted toward the magnet 85 by a magnetic force, so that the deposition mask 20 can be brought into tight contact with the substrate 91. This can suppress generation of shadow in the deposition step, and dimensional precision and positional precision of a deposition layer formed on the substrate 91 by the deposition material 82 deposited on the substrate 91 can be improved. The deposition mask 20 may be brought into tight contact with the substrate 91 with the use of an electrostatic chuck by means of an electrostatic force.

Figure 8:
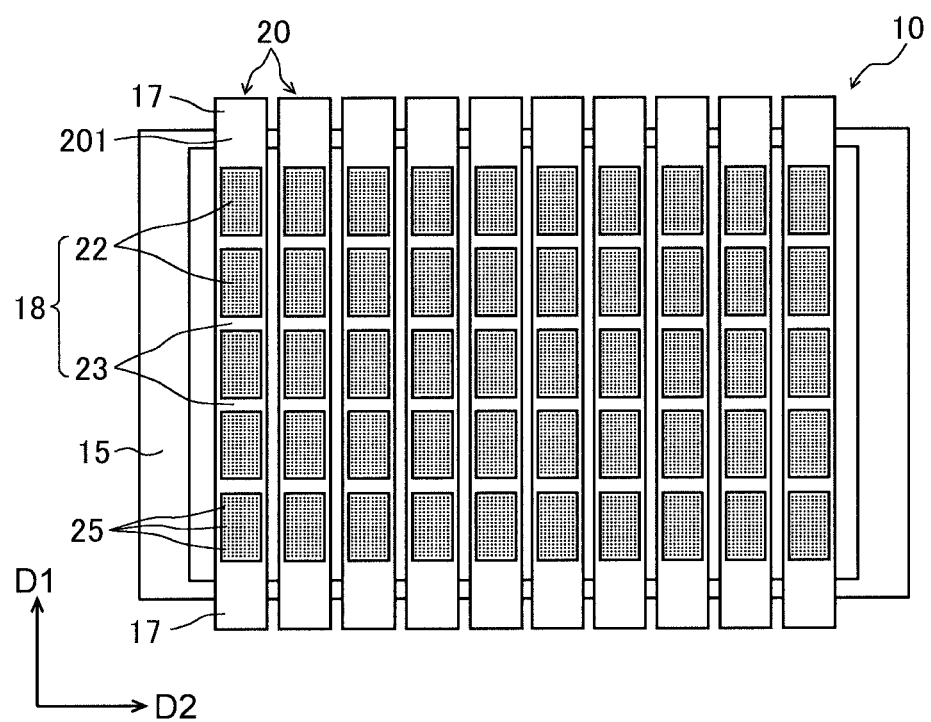
FIG. 8 is a plan view showing the deposition mask apparatus.

FIG. 8 is a plan view showing the deposition mask apparatus 10 seen from the first surface 201 side of the deposition mask 20. As shown in FIG. 8, the deposition mask apparatus 10 may comprise a plurality of the deposition masks 20. In this embodiment, each deposition mask 20 has a rectangular shape extending in one direction such as the first direction D1. In the deposition mask apparatus 10, a plurality of the deposition masks 20 are arranged in a transverse direction intersecting a longitudinal direction of the deposition mask 20. Each deposition mask 20 is fixed to the frame 15 by welding, for example, at both longitudinal ends of the deposition mask 20. Although not shown, the deposition mask apparatus 10 may comprise a member that is fixed to the frame 15 and partly overlaps the deposition mask 20 in a thickness direction of the deposition mask 20. Examples of such a member may include a member extending in a direction intersecting the longitudinal direction of the deposition mask 20 to support the deposition mask 20, a member overlapping a spacing between the two adjacent deposition masks, and the like.

The deposition mask 20 shown in FIG. 8 has a pair of end portions 17 fixed to the frame 15 by welding or the like, and an intermediate portion 18 located between the end portions 17. The intermediate portion 18 may have at least one effective area 22, and a peripheral area 23 located at a periphery of the effective area 22. In the example shown in FIG. 8, the intermediate portion 18 includes a plurality of the effective areas 22 arranged along the longitudinal direction of the deposition mask 20 at predetermined intervals therebetween. The peripheral area 23 surrounds a plurality of the effective areas 22.

When the deposition mask 20 is used to produce a display such as an organic EL display, one effective area 22 may correspond to a display area of one organic EL display, i.e., one screen. However, one effective area 22 may correspond to a plurality of display areas. Although not shown, a plurality of the effective areas 22 may be arranged in a width direction of the deposition mask 20 at predetermined intervals therebetween.

The effective area 22 may have, for example, a profile of a substantially quadrangular shape in a plan view, more precisely a substantially rectangular shape in a plan view. Although not not shown, each effective are 22 may have a profile of various shapes depending on a shape of a display area of an organic EL display. For example, each effective area 22 may have a profile of a circular shape.

Figure 9:
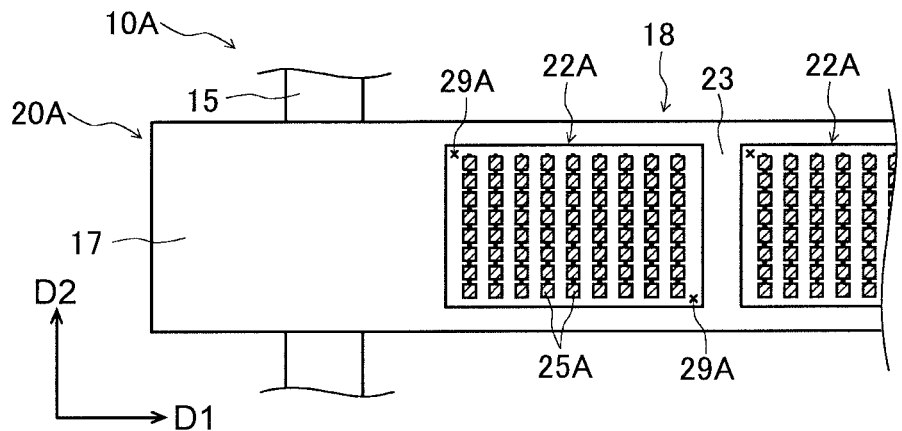
FIG. 9 is an enlarged plan view showing the deposition mask apparatus comprising a first deposition mask.

FIG. 9 is a partial enlarged plan view showing the first deposition mask apparatus 10A comprising the first deposition mask 20A which is used when the aforementioned first layer 140A of the second electrode 140 is formed. The first deposition mask 20A has a plurality of first through holes 25A including areas arranged along two different directions. In the example shown in FIG. 9, the two different directions are the first direction D1 and the second direction D2.

Figure 10:
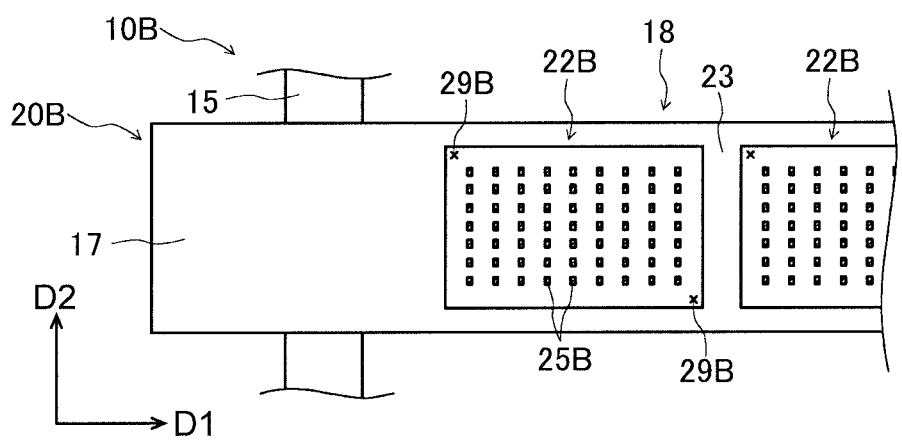
FIG. 10 is an enlarged plan view showing the deposition mask apparatus comprising a second deposition mask.

FIG. 10 is a partial enlarged plan view showing the second deposition mask apparatus 10B comprising the second deposition mask 20B which is used when the aforementioned second layer 140B of the second electrode 140 is formed. The second deposition mask 20B has a plurality of second through holes 25B arranged along two different directions. In the example shown in FIG. 10, the different directions are the first direction D1 and the second direction D2.

The second deposition mask apparatus 10B is used, for example, for forming the second layer 140B of the second electrode 140 on the substrate 91 in the deposition apparatus 80, after the first layer 140A of the second electrode 140 has been formed on the substrate 91 by using the first deposition mask apparatus 10A in the deposition apparatus 80. In this manner, in the steps of manufacturing the electronic device 100, a plurality of the deposition masks 20, such as the first deposition mask 20A, the second deposition mask 20B, etc., are used in sequence. A group of a plurality of the deposition masks 20 used for manufacturing the electronic device 100 is also referred to as "deposition mask group".

Figure 11:
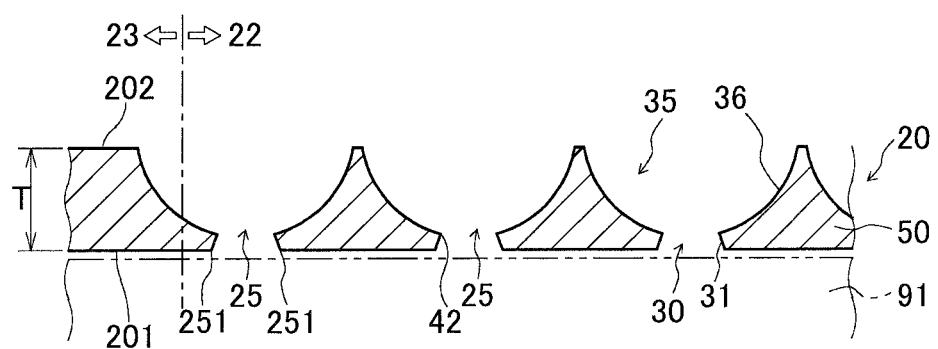
FIG. 11 is a view showing an example of a sectional structure of the deposition mask.

FIG. 11 is a view showing an example of a sectional structure of the deposition mask 20 such as the first deposition mask 20A, the second deposition mask 20B, the third deposition mask 20C, etc. The deposition mask 20 has a plurality of the through holes 25 formed in a metal plate 50. The through holes 25 pass through the metal plate 50 from the first surface 201 to the second surface 202.

The through holes 25 shown in FIG. 11 may be formed by etching the metal plate 50 from the first surface 201 side and the second surface 202 side. A wall surface of the through hole 25 includes a first wall surface 31 located on the first surface 201 side and a second wall surface 36 located on the second surface 202 side. The first wall surface 31 is a surface of a first recess 30 which is formed when the metal plate 50 is etched from the first surface 201 side. The second wall surface 36 is a surface of a second recess 35 which is formed when the metal plate 50 is etched from the second surface 202 side. The first wall surface 31 of the first recess 35 and the second wall surface 36 of the second recess 35 are connected at a connection portion 42.

In a deposition method using the deposition mask 20, the deposition material 82 passing through the through holes 25 from the second surface 202 side to the first surface 201 side is deposited onto the substrate 91, so that layers such as the aforementioned first layer 140A, the second layer 140B, etc. are formed on the substrate 91. A profile of the layer formed on the substrate in the in-plane direction of the substrate 91 is defined by a profile of an end portion 251 of the through hole 25 on the first surface 201. A profile of the through hole 25 shown in plan views such as FIGS. 12 to 16 described below is a profile of the end portion 251 of the through hole 25.

A thickness T of the deposition mask 20 is preferably 100 μm or less. The thickness T of the deposition mask 20 may be 50 μm or less, may be 40 μm or less, may be 35 μm or less, may be 30 μm or less, may be 25 μm or less, or may be 20 μm or less. On the other hand, when the thickness of the deposition mask 20 is excessively small, the strength of the deposition mask 20 lowers so that the deposition mask 20 is likely to be damaged and/or deformed. In consideration of this point, the thickness T of the deposition mask 20 is preferably 5 μm or more. The thickness T of the deposition mask 20 may be 8 μm or more, may be 10 μm or more, may be 12 μm or more, may be 13 μm or more, or 15 μm or more.

A range of the thickness T of the deposition mask 20 may be defined by a first group consisting of 5 μm, 8 μm, 10 μm, 12 μm, 13 μm and 15 μm, and/or a second group consisting of 100 μm, 50 μm, 40 μm, 35 μm, 30 μm, 25 μm and 20 μm. The range of the thickness T may be defined by a combination of any one of the values included in the aforementioned first group, and any one of the values included in the aforementioned second group. The range of the thickness T may be defined by a combination of any two of the values included in the aforementioned first group. The range of the thickness T may be defined by a combination of any two of the values included in the aforementioned second group. For example, the range of the thickness T of the deposition mask 20 may be 5 µm or more and 100 µm or less, may be 5 µm or more and 50 µm or less, may be 5 µm or more and 40 µm or less, may be 5 µm or more and 35 µm or less, may be 5 µm or more and 30 µm or less, may be 5 µm or more and 25 µm or less, may be 5 µm or more and 20 µm or less, may be 5 µm or more and 15 µm or less, may be 5 µm or more and 13 µm or less, may be 5 µm or more and 12 µm or less, may be 5 µm or more and 10 µm or less, may be 5 µm or more and 8 µm or less, may be 8 µm or more and 100 µm or less, may be 8 µm or more and 50 µm or less, may be 8 µm or more and 40 µm or less, may be 8 µm or more and 35 µm or less, may be 8 µm or more and 30 µm or less, may be 8 µm or more and 25 µm or less, may be 8 µm or more and 20 µm or less, may be 8 µm or more and 15 µm or less, may be 8 µm or more and 13 µm or less, may be 8 µm or more and 12 µm or less, may be 8 µm or more and 10 µm or less, may be 10 µm or more and 100 µm or less, may be 10 µm or more and 50 µm or less, may be 10 µm or more and 40 µm or less, may be 10 µm or more and 35 µm or less, may be 10 µm or more and 30 µm or less, may be 10 µm or more and 25 µm or less, may be 10 µm or more and 20 µm or less, may be 10 µm or more and 15 µm or less, may be 10 µm or more and 13 µm or less, may be 10 µm or more and 12 µm or less, may be 12 µm or more and 100 µm or less, may be 12 µm or more and 50 µm or less, may be 12 µm or more and 40 µm or less, may be 12 µm or more and 35 µm or less, may be 12 µm or more and 30 µm or less, may be 12 µm or more and 25 µm or less, may be 12 µm or more and 20 µm or less, may be 12 µm or more and 15 µm or less, may be 12 µm or more and 13 µm or less, may be 13 µm or more and 100 µm or less, may be 13 µm or more and 50 µm or less, may be 13 µm or more and 40 µm or less, may be 13 µm or more and 35 µm or less, may be 13 µm or more and 30 µm or less, may be 13 µm or more and 25 µm or less, may be 13 µm or more and 20 µm or less, may be 13 µm or more and 15 µm or less, may be 15 µm or more and 100 µm or less, may be 15 µm or more and 50 µm or less, may be 15 µm or more and 40 µm or less, may be 15 µm or more and 35 µm or less, may be 15 µm or more and 30 µm or less, 1 1 5 µm or more and 25 µm or less, may be 15 µm or more and 20 µm or less, may be 20 µm or more and 100 µm or less, may be 20 µm or more and 50 µm or less, may be 20 µm or more and 40 µm or less, may be 20 µm or more and 35 µm or less, may be 20 µm or more and 30 µm or less, may be 20 µm or more and 25 µm or less, may be 25 µm or more and 100 µm or less, may be 25 µm or more and 50 µm or less, may be 25 µm or more and 40 µm or less, may be 25 µm or more and 35 µm or less, may be 25 µm or more and 30 µm or less, may be 30 µm or more and 100 µm or less, may be 30 µm or more and 50 µm or less, may be 30 µm or more and 40 µm or less, may be 30 µm or more and 35 µm or less, may be 35 µm or more and 100 µm or less, may be 35 µm or more and 50 µm or less, may be 35 µm or more and 40 µm or less, may be 40 µm or more and 100 µm or less, may be 40 µm or more and 50 µm or less, or may be 50 µm or more and 100 µm or less.

The thickness T of the deposition mask 20 is a thickness of the peripheral area 23, i.e., a thickness of a part of the deposition mask 20 in which the through hole 25 is not formed.

Each of the above ranges related to the thickness T of the deposition mask 20 may be adopted in an embodiment other than the embodiment shown in FIGS. 1 to 16.

A contact-type measuring method can be adopted as a method for measuring the thickness of the deposition mask 20. As the contact-type measuring method, a length gauge HEIDENHAIM-METRO "MT1271" comprising a ball bush guide type plunger, which is manufactured by HEIDENHAIM Co., Ltd., can be used.

The sectional shape of the through hole 25 of the deposition mask 20 is not limited to the shape shown in FIG. 11. The method of forming the through holes 25 of the deposition mask 20 is not limited to etching, and various methods can be adopted. For example, the deposition mask 20 may be formed by plating such that the through holes 25 are formed.

An iron alloy containing nickel may be used as a material constituting the deposition mask 20. The iron alloy may further contain cobalt in addition to nickel. For example, an iron alloy in which a total content of nickel and cobalt is 30% by mass or more and 54% by mass or less, and a content of cobalt is 0% by mass or more and 6% by mass or less may be used as a material constituting the deposition mask 20. Specific examples of an iron alloy containing nickel, or nickel and cobalt include an invar material containing nickel of 34% by mass or more and 38% by mass or less, a super invar material further containing cobalt in addition to nickel of 30% by mass or more and 34% by mass or less, a Fe—Ni based plated alloy having a low thermal expansion and containing nickel of 38% by mass or more and 54% by mass or less, and the like. The use of such an iron alloy can decrease a thermal expansion coefficient of the deposition mask 20. For example, when a glass substrate is used as the substrate 91, the deposition mask 20 can have a thermal expansion coefficient value as low as the glass plate. Thus, during the deposition step, it can be suppressed that the dimensional precision and the positional precision of a deposition layer formed on the substrate 91 lower because of a difference in thermal expansion coefficient between the deposition mask 20 and the substrate 91.

Each of the above ranges related to the composition of the material constituting the deposition mask 20 may be adopted in an embodiment other than the embodiment shown in FIGS. 1 to 16.

Figure 12:
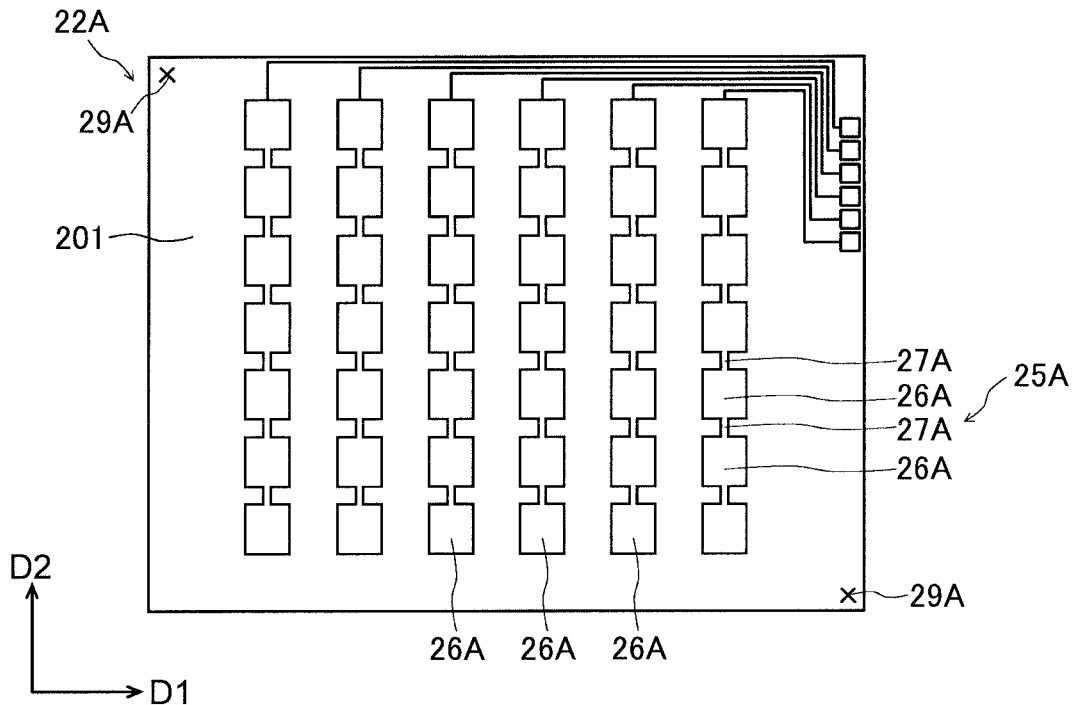
FIG. 12 is a plan view showing an example of the first deposition mask.
Figure 13:
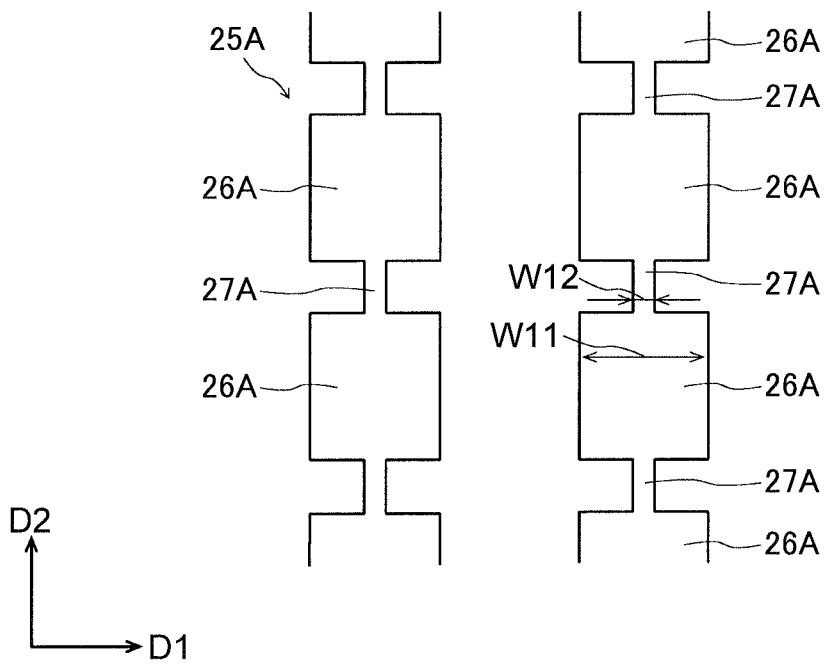
FIG. 13 is an enlarged plan view showing the first deposition mask shown in FIG. 12.

Next, the first deposition mask 20A is described in detail. FIG. 12 is a plan view showing an example of the first deposition mask 20A seen from the first surface 201 side. FIG. 13 is a partial enlarged plan view showing the first deposition mask 20A shown in FIG. 12.

As shown in FIG. 12, the first deposition mask 20A has a plurality of the first through holes 25A including areas arranged along two different directions. A plurality of the first through holes 25A include a plurality of the mask first main areas 26A arranged along two different directions and the mask first extension area 27A extending to connect the two adjacent mask first main areas 26A.

The mask first main area 26A is an area through which the deposition material constituting the aforementioned electrode first main area 141A of the first layer 140A of the second electrode 140 mainly passes. In the example shown in FIG. 12, a plurality of the mask first main areas 26A are arranged along the first direction D1 and the second direction D2. As shown in FIG. 12, an interval between the two mask first main areas 26A adjacent to each other in the second direction D2 is smaller than an interval between the two mask first main areas 26A adjacent to each other in the first direction D1.

The mask first extension area 27A is an area through which the deposition material constituting the aforementioned electrode first extension area 142A of the first layer 140A of the second electrode 140 mainly passes. In the example shown in FIG. 12, the mask first extension area 27A extends in the second direction D2 to connect the two mask first main areas 26A adjacent to each other in the second direction D2.

The mask first extension area 27A has a dimension smaller than the mask first main area 26A in a direction orthogonal to the direction in which the two adjacent mask first main areas 26A are arranged. In the example shown in FIG. 13, the mask first extension area 27A has a dimension smaller than the mask first main area 26A in the first direction D1 orthogonal to the second direction D2 in which the two adjacent mask first main areas 26A are arranged. In other words, in the first direction D1 orthogonal to the second direction D2, the first through hole 25A has a first dimension W11 and a second dimension W12 smaller than the first dimension W11. Areas having the first dimension W11 and areas having the second dimension W12 are alternately arranged in the second direction D2. In the first direction D1, the dimension W12 of the mask first extension area 27A may be 0.9 times or less the dimension W11 of the mask first main area 26A, may be 0.8 times or less the dimension W11 of the mask first main area 26A, may be 0.7 times or less the dimension W11 of the mask first main area 26A, may be 0.6 times or less the dimension W11 of the mask first main area 26A, or may be 0.5 times or less the dimension W11 of the mask first main area 26A. Thus, light easily transmits through the electronic device 100 in an area between the two electrode first main areas 141A of the second electrode 140, which are formed correspondingly to the mask first main areas 26A. In the first direction D1, the dimension W12 of the mask first extension area 27A may be 0.05 times or more the dimension W11 of the mask first main area 26A, may be 0.1 times or more the dimension W11 of the mask first main area 26A, may be 0.2 times or more the dimension W11 of the mask first main area 26A, may be 0.3 times or more the dimension W11 of the mask first main area 26A, or may be 0.4 times or more the dimension W11 of the mask first main area 26A.

A range of W12/W11, which is a ratio of the dimension W12 with respect to the W11, may be defined by a first group consisting of 0.05, 0.1, 0.2, 0.3 and 0.4, and/or a second group consisting of 0.9, 0.8, 0.7, 0.6 and 0.5. The range of W12/W11 may be defined by a combination of any one of the values included in the aforementioned first group, and any one of the values included in the aforementioned second group. For example, W12/W11 may be 0.05 or more and 0.9 or less, may be 0.05 or more and 0.8 or less, may be 0.05 or more and 0.7 or less, may be 0.05 or more and 0.6 or less, may be 0.05 or more and 0.5 or less, may be 0.05 or more and 0.4 or less, may be 0.05 or more and 0.3 or less, may be 0.05 or more and 0.2 or less, may be 0.05 or more and 0.1 or less, may be 0.1 or more and 0.9 or less, may be 0.1 or more and 0.8 or less, may be 0.1 or more and 0.7 or less, may be 0.1 or more and 0.6 or less, may be 0.1 or more and 0.5 or less, may be 0.1 or more and 0.4 or less, may be 0.1 or more and 0.3 or less, may be 0.1 or more and 0.2 or less, may be 0.2 or more and 0.9 or less, may be 0.2 or more and 0.8 or less, may be 0.2 or more and 0.7 or less, may be 0.2 or more and 0.6 or less, may be 0.2 or more and 0.5 or less, may be 0.2 or more and 0.4 or less, may be 0.2 or more and 0.3 or less, may be 0.3 or more and 0.9 or less, may be 0.3 or more and 0.8 or less, may be 0.3 or more and 0.7 or less, may be 0.3 or more and 0.6 or less, may be 0.3 or more and 0.5 or less, may be 0.3 or more and 0.4 or less, may be 0.4 or more and 0.9 or less, may be 0.4 or more and 0.8 or less, may be 0.4 or more and 0.7 or less, may be 0.4 or more and 0.6 or less, may be 0.4 or more and 0.5 or less, may be 0.5 or more and 0.9 or less, may be 0.5 or more and 0.8 or less, may be 0.5 or more and 0.7 or less, may be 0.5 or more and 0.6 or less, may be 0.6 or more and 0.9 or less, may be 0.6 or more and 0.8 or less, may be 0.6 or more and 0.7 or less, may be 0.7 or more and 0.9 or less, may be 0.7 or more and 0.8 or less, or may be 0.8 or more and 0.9 or less.

As shown in FIG. 12, the first deposition mask 20A may have an alignment mark 29A. The alignment mark 29A may be formed on a corner of the effective area 22A of the first deposition mask 20A, for example. The alignment mark 29A may be used for positioning the first deposition mask 20A with respect to the substrate 91 in a step in which the first layer 140A of the second electrode 140 is formed on the substrate 91 by a deposition method using the first deposition mask 20A.

Figure 14:
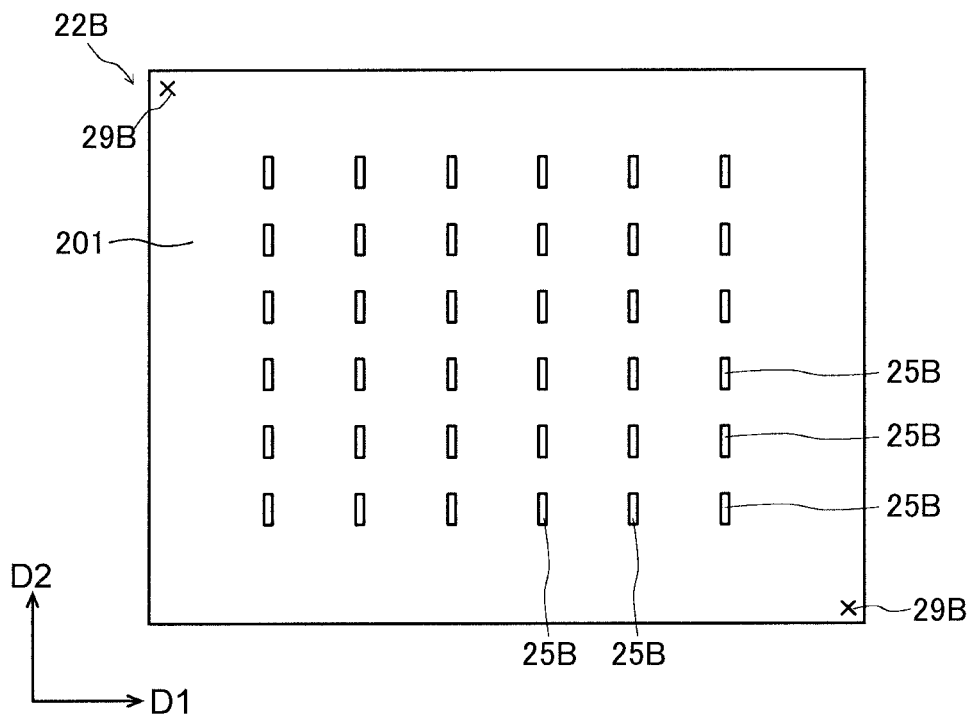
FIG. 14 is a plan view showing an example of the second deposition mask.
Figure 15:
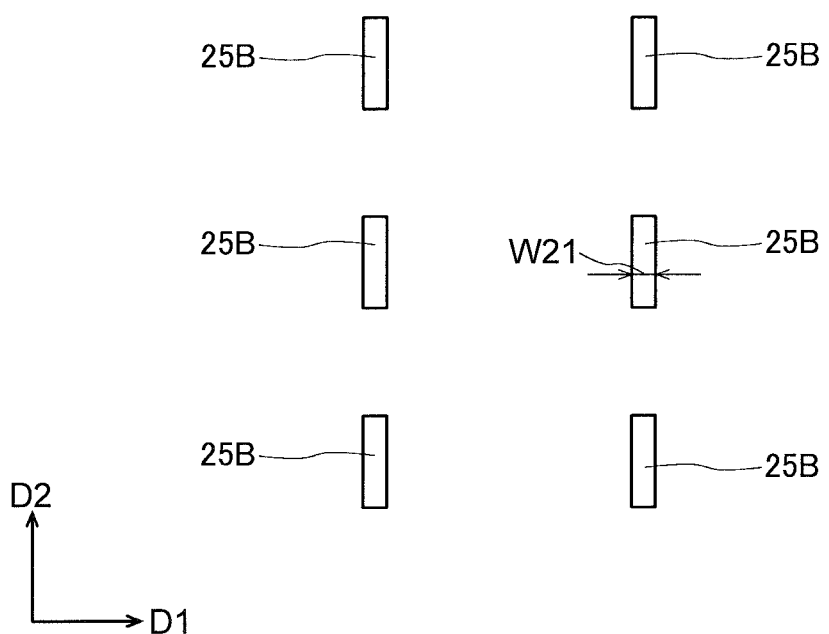
FIG. 15 is an enlarged plan view showing the second deposition mask shown in FIG. 14.

Next, the second deposition mask 20B is described in detail. FIG. 14 is a plan view showing an example of the second deposition mask 20B seen from the first surface 201 side. FIG. 15 is a partial enlarged plan view showing the second deposition mask 20B shown in FIG. 14.

As shown in FIGS. 14 and 15, the second deposition mask 20B has a plurality of the through holes 25B arranged along two different directions. The second through hole 25B is an area through which the deposition material constituting the aforementioned second layer 140B of the second electrode 140 mainly passes. In the example shown in FIG. 12, the through hole 25B extends in the second direction D2.

In FIG. 15, a reference numeral W21 depicts a dimension of the through hole 25B in the first direction D1 orthogonal to the second direction D2 in which the second through hole 25B extends. The dimension W21 of the second through hole 25B is smaller than the aforementioned dimension W11 of the mask first main area 26A of the first through hole 25A of the first deposition mask 20A in the first direction D1. Since a range of a ratio of the dimension W21 of the second through hole 25B with respect to the dimension W11 of the mask first main area 26A is similar to the aforementioned range of the ratio of the dimension W12 of the mask first extension area 27A with respect to the dimension W11 of the mask first main area 26A, detailed description is omitted.

In the first direction D1, the dimension W21 of the second through hole 25B may be smaller than the aforementioned dimension W12 of the mask first extension area 27A of the first deposition mask 20A, or may be larger than it, or may be the same as it.

As shown in FIG. 14, the second deposition mask 20B may have an alignment mark 29B. Similarly to the case of the first deposition mask 20A, the alignment mark 29B is formed on a corner of the effective area 22B of the second deposition mask 20B, for example. The alignment mark 29B may be used for positioning the second deposition mask 20B with respect to the substrate 91 in a step in which the second layer 140B of the second electrode 140 is formed on the substrate 91 by a deposition method using the second deposition mask 20B.

Next, an example of a method of manufacturing the electronic device 100 is described.

First, as shown in FIG. 3, the substrate 91 on which the first electrodes 120 are formed is prepared. The first electrode 120 is formed by, for example, forming a conductive layer constituting the first electrode 120 on the substrate 91 by a sputtering method or the like, and then by patterning the conductive layer by a photolithography method or the like.

Following thereto, as shown in FIG. 4, the energizing layer 130 is formed on the first electrode 120. The energizing layer 130 is formed by, for example, depositing an organic material or the like onto the substrate 91 and onto the first electrode 120 by a deposition method using a deposition mask having a through hole corresponding to the energizing layer 130.

Following thereto, a second-electrode forming step of forming the second electrode 140 on the energizing layer 130 is performed. As shown in FIG. 5, for example, the first layer 140A of the second electrode 140 is formed on the energizing layer 130. To be specific, the first layer 140A is formed by depositing a conductive material such as a metal onto the energizing layer 130 by a deposition method using the first deposition mask apparatus 10A comprising the first deposition mask 20A.

Following thereto, as shown in FIG. 6, the second layer 140B of the second electrode 140 is formed on the energizing layer 130 and the first layer 140A of the second electrode 140. To be specific, the second layer 140B is formed by depositing a conductive material such as a metal onto the energizing layer 130 and on the first layer 140A by a deposition method using the second deposition mask apparatus 10B comprising the second deposition mask 20B. In this manner, the electronic device 100 comprising the first electrode 120, the energizing layer 130 and the first layer 140A and the second layer 140B of the second electrode 140, which are formed on the substrate 91, can be obtained.

Figure 16:
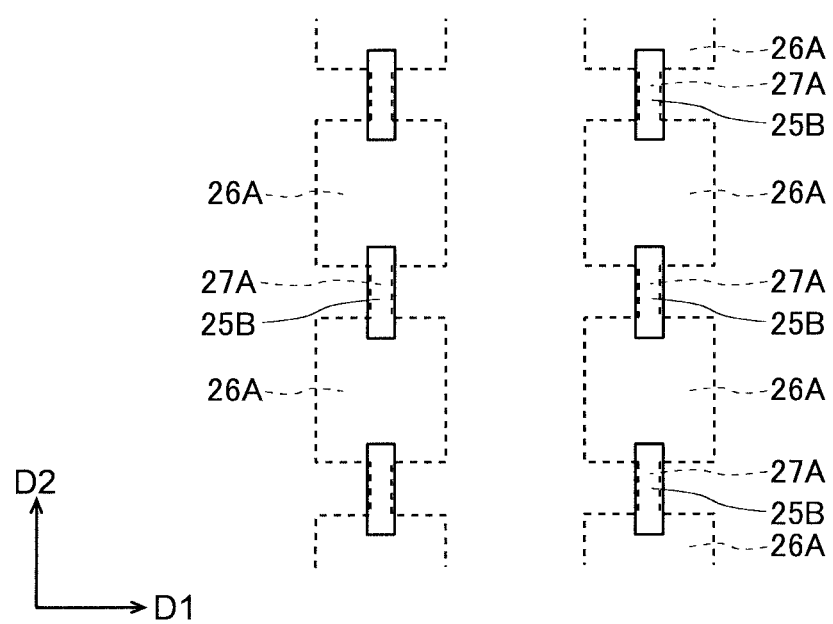
FIG. 16 is a view showing a state in which the first deposition mask and the second deposition mask are overlapped.

An effect to be achieved by using a deposition mask group comprising the first deposition mask 20A and the second deposition mask 20B to form the second electrode 140 is described with reference to FIG. 16. FIG. 16 is a view showing a laminate 21 obtained by overlapping the first deposition mask 20A and the second deposition mask 20B. In the laminate 21, the first deposition mask 20A and the second deposition mask 20B may be overlapped such that the first alignment mark 29A of the first deposition mask 20A and the second alignment mark 29B of the second deposition mask 20B overlap. At this time, tension may be or may not be applied to the first deposition mask 20A and the second deposition mask 20B.

A figure like FIG. 16 showing a state in which a plurality of the deposition masks 20 such as the first deposition mask 20A and the second deposition mask 20B are overlapped may be obtained by overlapping image data of the respective deposition masks 20. For example, image data related to a profile of the first through hole 25A of the first deposition mask 20A and a profile of the second through hole 25B of the second deposition mask 20B are respectively obtained by using an imaging device. Then, an image processing device is used to overlap the image data of the first deposition mask 20A and the image date of the second deposition mask 20B, so that a figure like FIG. 16 can be created. This similarly applies to a below-described case in which the first deposition mask 20A, the second deposition mask 20B and a third deposition mask 20C are overlapped.

In FIG. 16, the first through holes 25A of the first deposition mask 20A are shown by dotted lines, and the second through holes 25B of the second deposition mask 20B are shown by solid lines. As shown in FIG. 16, when the first deposition mask 20A and the second deposition mask 20B are overlapped, the first through hole 25A of the first deposition mask 20A and the second through hole 25B of the second deposition mask 20B partly overlap. This means that the first layer 140A of the second electrode 140, which is formed on the substrate 91 by the deposition material having passed through the first through hole 25A, and the second layer 140B of the second electrode 140, which is formed on the substrate 91 by the deposition material having passed through the second through hole 25B, partly overlap. Thus, an electric resistance of the second electrode 140 can be reduced, as compared with a case in which the second electrode 140 is made only by the first layer 140A.

The overlap of the first through hole 25A of the first deposition mask 20A and the second through hole 25B of the second deposition mask 20B is described in detail. As shown in FIG. 16, when the first deposition mask 20A and the second deposition mask 20B are overlapped, the mask first extension area 27A of the first deposition mask 20A and the second through hole 25B of the second deposition mask 20B entirely or partly overlap. As described above, the deposition material deposited onto the substrate 91 via the mask first extension area 27A of the first deposition mask 20A forms the electrode first extension area 142A that connects the electrode first main areas 141A of the second electrodes 140 of the two adjacent elements 110. Since the mask first extension area 27A of the first deposition mask 20A and the second through hole 25B of the second deposition mask 20B overlap, the second layer 140B can be formed on the electrode first extension area 142A of the second electrode 140. Namely, the second layer 140B can overlap the electrode first extension area 142A. Thus, even when a dimension of the electrode first extension area 142A and a dimension of the second layer 140B are smaller than a dimension of the electrode first main area 141A, an electric resistance between the electrode first main areas 141A of the two adjacent elements 110 can be reduced. In addition, by making smaller the dimension of the electrode first extension area 142A and the dimension of the second layer 140B than the dimension of the electrode first main area 141A, light easily transmits through the electronic device 100 in an area between the two elements 110 adjacent to each other in the second direction D2. Thus, a transmittance of the entire electronic device 100 can be improved.

As shown in FIG. 16, when the first deposition mask 20A and the second deposition mask 20B are overlapped, the second through hole 25B of the second deposition mask 20B may entirely or partly overlap the two adjacent mask first main areas 26A of the first deposition mask 20A, and the mask first extension area 27A connected to the two mask first main areas 26A. Namely, the second through hole 25B of the second deposition mask 20B may extend from one of the two adjacent mask first main areas 26A of the first deposition mask 20A to the other thereof. In other words, when the first deposition mask 20A and the second deposition mask 20B are overlapped, the two adjacent mask first main areas 26A of the first deposition mask 20A may be connected via the second through hole 25B of the second deposition mask 20B. In this case, the second layer 140B formed correspondingly to the second through hole 25B can overlap the electrode first main areas 141A formed correspondingly to the mask first main areas 26A.

Next, another example of using the deposition mask group to form the second electrode 140 of the electronic device 100 is described with reference to FIGS. 17 to 25. Herein, an example in which the deposition mask group includes the first deposition mask 20A, the second deposition mask 20B and a third deposition mask 20C, and the energizing layer 130 includes a first energizing layer 130A, a second energizing layer 130B and a third energizing layer 130C is described. The first energizing layer 130A, the second energizing layer 130B and the third energizing layer 130C are, for example, a red-light emitting layer, a blue-light emitting layer and a green-light emitting layer.

Figure 17:
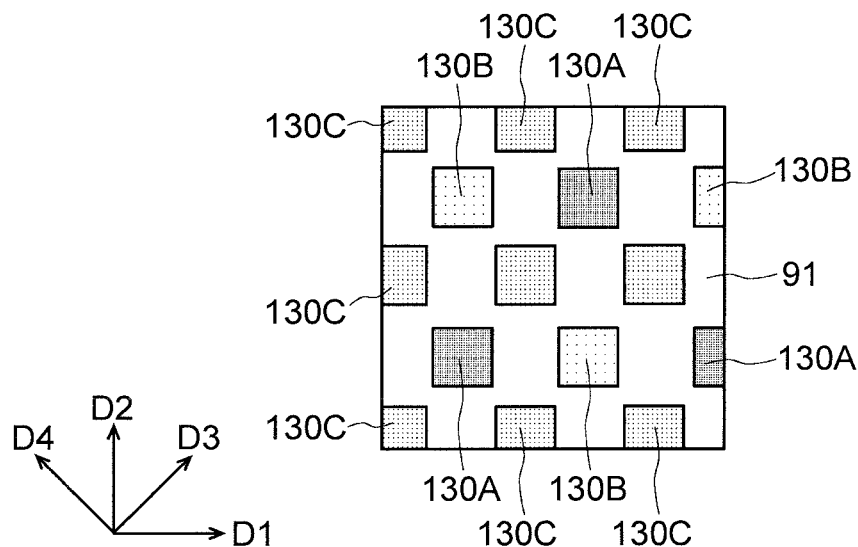
FIG. 17 is a plan view showing an example of the substrate on which a first energizing layer, a second energizing layer and a third energizing layer are formed.

The two or more energizing layers 130 may be arranged along two different directions in the in-plane direction of the substrate 91. FIG. 17 is a partial enlarged view showing the substrate 91 on which the first energizing layers 130A, the second energizing layers 130B and the third energizing layers 130C are formed. The two or more first energizing layers 130A may be arranged along two different directions in the in-plane direction of the substrate 91. The same applies to the second energizing layers 130B and the third energizing layers 130C. Although not shown, the first electrode 120 is formed between the substrate 91, and the first energizing layer 130A, the second energizing layer 130B and the third energizing layer 130C. In the example shown in FIG. 17, a plurality of the first energizing layers 130A are arranged along a third direction D3 and a fourth direction D4 intersecting the third direction D3. The third direction D3 may be a direction forming 45° with respect to the first direction D1. The fourth direction D4 may be a direction forming 45° with respect to the second direction D2. Similarly to the first energizing layers 130A, a plurality of the second energizing layers 130B are arranged along the third direction D3 and the fourth direction D4 intersecting the third direction D3. A plurality of the third energizing layers 130C are arranged along the first direction D1 and the second direction D2.

Figure 18:
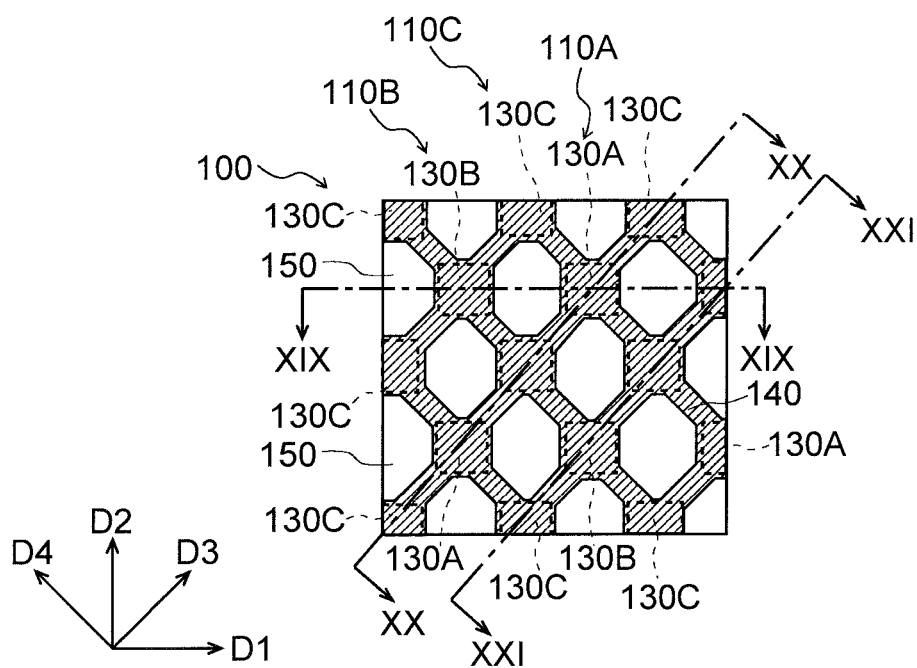
FIG. 18 is a plan view showing an example of the substrate with the second electrode being formed on the first energizing layer, the second energizing layer and the third energizing layer.
Figure 19:
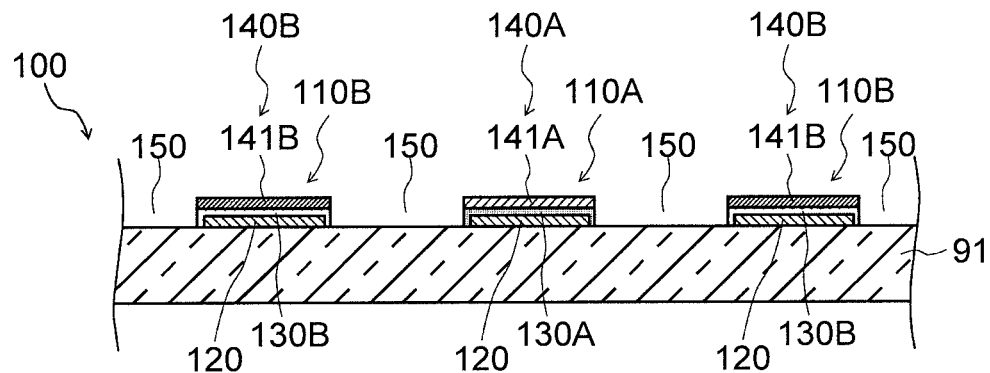
FIG. 19 is a sectional view along a XIX-XIX line of the electronic device shown in FIG. 18.
Figure 20:
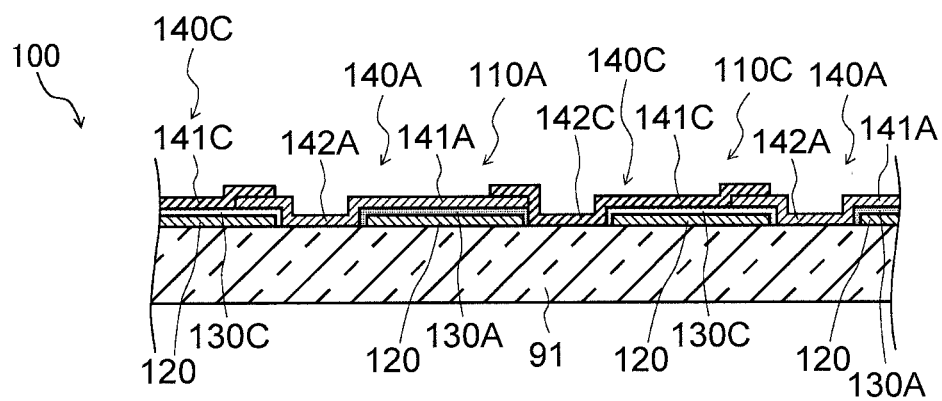
FIG. 20 is a sectional view along a XX-XX line of the electronic device shown in FIG. 18.
Figure 21:
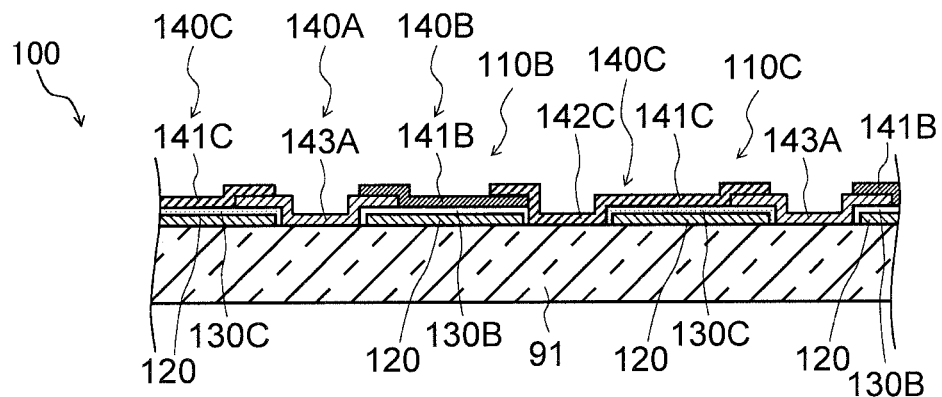
FIG. 21 is a sectional view along a XXI-XXI line of the electronic device shown in FIG. 18.

FIG. 18 is a plan view showing the substrate 91 with the second electrode 140 being formed on the energizing layer 130A, the second energizing layer 130B and the third energizing layer 130C shown in FIG. 17. FIG. 19 is a sectional view along a XIX-XIX line of the electronic device 100 shown in FIG. 18. FIG. 20 is a sectional view along a XX-XX line of the electronic device 100 shown in FIG. 18. FIG. 21 is a sectional view along a XXI-XXI line of the electronic device 100 shown in FIG. 18. As shown in FIG. 18, the electronic device 100 includes an electrode-free area 150 free of the second electrode 140.

As shown in FIGS. 19 and 21, the second electrode 140 includes a first layer 140A, the second layer 140B and a third layer 140C. The first layer 140A is a layer formed by a deposition method using the first deposition mask 20A. The first layers 140A may be arranged along two different directions in the in-plane direction of the substrate 91. The second layer 140B is a layer formed by a deposition method using the second deposition mask 20B. The second layers 140B may be arranged along two different directions in the in-plane direction of the substrate 91. The third layer 140C is a layer formed by a deposition method using the third deposition mask 20C. The third layers 140C may be arranged along two different directions in the in-plane direction of the substrate 91.

The first layer 140A at least has an electrode first main area 141A overlapping the first electrode 120 and the first energizing layer 130A. The first electrode 120, the first energizing layer 130A and the electrode first main area 141A constitute a first element 110A of the electronic device 100. The second layer 140B at least has an electrode second main area 141B overlapping the first electrode 120 and the second energizing layer 130B. The first electrode 120, the second energizing layer 130B and the electrode second main area 141B constitute a second element 110B of the electronic device 100. The third layer 140C at least has an electrode third main area 141C overlapping the first electrode 120 and the third energizing layer 130C. The first electrode 120, the third energizing layer 130C and the electrode third main area 141C constitute a third element 110C of the electronic device 100.

As shown in FIG. 20, the first layer 140A may include an electrode first extension area 142A extending from the electrode first main area 141A to electrically connect the electrode first main area 141A of the first layer 140A and the electrode third main area 141C of the third layer 140C. The electrode first extension area 142A may partly overlap the electrode third main area 141C. The electrode first extension area 142A has a dimension smaller than the electrode first main area 141A and the electrode third main area 141C in a direction orthogonal to the direction in which the electrode first extension area 142A extends from the electrode first main area 141A.

Although not shown, similarly to the first layer 140A, the second layer 140B may also include an electrode second extension area extending from the electrode second main area 141B to electrically connect the electrode second main area 141B of the second layer 140B and the electrode third main area 141C of the third layer 140C. The electrode second extension area may partly overlap the electrode third main area 141C. The electrode second extension area has a dimension smaller than the electrode second main area 141B and the electrode third main area 141C in a direction orthogonal to the direction in which the electrode second extension area extends from the electrode second main area 141B.

As shown in FIGS. 20 and 21, the third layer 140C may include an electrode third extension area 142C extending from the electrode third main area 141C to electrically connect the electrode third main area 141C of the third layer 140C and the electrode first main area 141A of the first layer 140A. The electrode third extension area 142C may partly overlap the electrode first main area 141A. The electrode third extension area 142C has a dimension smaller than the electrode first main area 141A and the electrode third main area 141C in a direction orthogonal to the direction in which the electrode third extension area 142C extends from the electrode third main area 141C.

Although not shown, the third layer 140C may include an electrode third extension area extending from the electrode third main area 141C to electrically connect the electrode third main area 141C of the third layer 140C and the electrode second main area 141B of the second layer 140B. The electrode third extension area may partly overlap the electrode second main area 141B. Similarly to the aforementioned electrode third extension area 142C, the electrode third extension area has a dimension smaller than the electrode second main area 141B and the electrode third main area 141C in a direction orthogonal to the direction in which the electrode third extension area extends from the electrode third main area 141C.

As shown in FIG. 21, the first layer 140A may include an electrode first auxiliary area 143A extending to electrically connect the electrode second main area 141B of the second layer 140B and the electrode third main area 141C of the third layer 140C. The electrode first auxiliary area 143A may partly overlap the electrode second main area 141B and the electrode third main area 141C. The electrode first auxiliary area 143A may not be connected to the electrode first main area 141A and the electrode first extension area 142A. The electrode first auxiliary area 143A has a dimension smaller than the electrode second main area 141B and the electrode third main area 141C in a direction orthogonal to the direction in which the electrode first auxiliary area 143A extends.

Although not shown, similarly to the first layer 140A, the second layer 140B may also include an electrode second auxiliary area extending to electrically connect the electrode first main area 141A of the first layer 140A and the electrode third main area 141C of the third layer 140C. The electrode second auxiliary area may partly overlap the electrode first main area 141A and the electrode third main area 141C. The electrode second auxiliary area may not be connected to the electrode second main area 141B and the electrode second extension area 142B. The electrode second auxiliary area has a dimension smaller than the electrode first main area 141A and the electrode third main area 141C in a direction orthogonal to the direction in which the electrode second auxiliary area extends.

Next, the first deposition mask 20A, the second deposition mask 20B and the third deposition mask 20C used for forming the aforementioned first layer 140A, the second layer 140B and the third layer 140C of the second electrode 140 are described.

Figure 22:
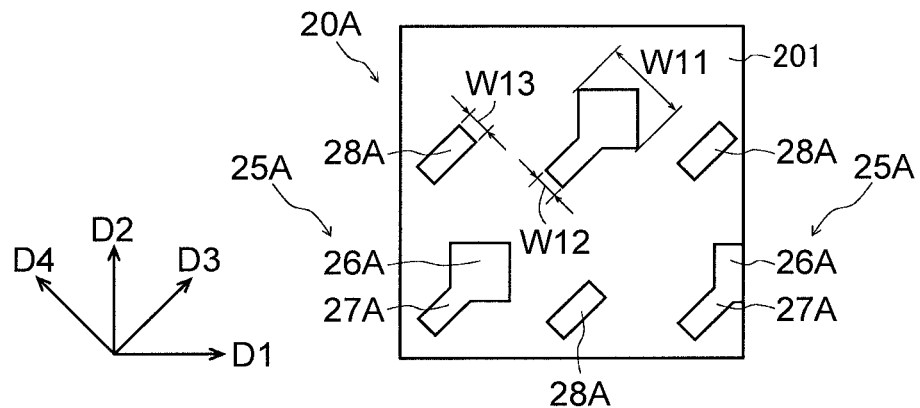
FIG. 22 is a plan view showing an example of the first deposition mask.

FIG. 22 is a plan view showing the first deposition mask 20A seen from the first surface 201 side. As shown in FIG. 22, the first deposition mask 20A has a plurality of the first through holes 25A including areas arranged along two different directions. A plurality of the first through holes 25A at least include a plurality of the mask first main areas 26A arranged along two different directions. A plurality of the first through holes 25A may include a plurality of the mask first extension areas 27A arranged along two different directions. A plurality of the first through holes 25A may include a plurality of mask first auxiliary areas 28A arranged along two different directions.

The mask first main area 26A is an area through which the deposition material constituting the aforementioned electrode first main area 141A of the first layer 140A of the second electrode 140 mainly passes. In the example shown in FIG. 22, a plurality of the mask first main areas 26A are arranged along the third direction D3 and the fourth direction D4.

The mask first extension area 27A is an area through which the deposition material constituting the aforementioned electrode first extension area 142A of the first layer 140A of the second electrode 140 mainly passes. In the example shown in FIG. 22, the mask first extension area 27A extends from the mask first main area 26A in the third direction D3 in which the two adjacent mask first main areas 26A are arranged.

The mask first extension area 27A has a dimension smaller than the mask first main area 26A in a direction orthogonal to the direction in which the mask first extension area 27A extends from the mask first main area 26A. In the example shown in FIG. 22, the mask first extension area 27A has a dimension smaller than the mask first main area 26A in the fourth direction D4 orthogonal to the third direction D3 in which the mask first extension area 27A extends from the mask first main area 26A. In the fourth direction D4, a dimension W12 of the mask first extension area 27A may be 0.9 times or less a dimension W11 of the mask first main area 26A, may be 0.8 times or less the dimension W11 of the mask first main area 26A, may be 0.7 times or less the dimension W11 of the mask first main area 26A, may be 0.6 times or less the dimension W11 of the mask first main area 26A, or may be 0.5 times or less the dimension W11 of the mask first main area 26A. In the fourth direction D4, the dimension W12 of the mask first extension area 27A may be 0.05 times or more the dimension W11 of the mask first main area 26A, may be 0.1 times or more the dimension W11 of the mask first main area 26A, may be 0.2 times or more the dimension W11 of the mask first main area 26A, may be 0.3 times or more the dimension W11 of the mask first main area 26A, or may be 0.4 times or more the dimension W11 of the mask first main area 26A.

A range of W12/W11, which is a ratio of the dimension W12 with respect to the dimension W11, may be defined by a first group consisting of 0.05, 0.1, 0.2, 0.3 and 0.4, and/or a second group consisting of 0.9, 0.8, 0.7, 0.6 and 0.5. The range of W12/W11 may be defined by a combination of any one of the values included in the aforementioned first group, and any one of the values included in the aforementioned second group. For example, W12/W11 may be 0.05 or more and 0.9 or less, may be 0.05 or more and 0.8 or less, may be 0.05 or more and 0.7 or less, may be 0.05 or more and 0.6 or less, may be 0.05 or more and 0.5 or less, may be 0.05 or more and 0.4 or less, may be 0.05 or more and 0.3 or less, may be 0.05 or more and 0.2 or less, may be 0.05 or more and and 0.1, may be 0.1 or more and 0.9 or less, may be 0.1 or more and 0.8 or less, may be 0.1 or more and 0.7 or less, may be 0.1 or more and 0.6 or less, may be 0.1 or more and 0.5 or less, may be 0.1 or more and 0.4 or less, may be 0.1 or more and 0.3 or less, may be 0.1 or more and 0.2 or less, may be 0.2 or more and 0.9 or less, may be 0.2 or more and 0.8 or less, may be 0.2 or more and 0.7 or less, may be 0.2 or more and 0.6 or less, may be 0.2 or more and 0.5 or less, may be 0.2 or more and 0.4 or less, may be 0.2 or more and 0.3 or less, may be 0.3 or more and 0.9 or less, may be 0.3 or more and 0.8 or less, may be 0.3 or more and 0.7 or less, may be 0.3 or more and 0.6 or less, may be 0.3 or more and 0.5 or less, may be 0.3 or more and 0.4 or less, may be 0.4 or more and 0.9 or less, may be 0.4 or more and 0.8 or less, may be 0.4 or more and 0.7 or less, may be 0.4 or more and 0.6 or less, may be 0.4 or more and 0.5 or less, may be 0.5 or more and 0.9 or less, may be 0.5 or more and 0.8 or less, may be 0.5 or more and 0.7 or less, may be 0.5 or more and 0.6 or less, may be 0.6 or more and 0.9 or less, may be 0.6 or more and 0.8 or less, may be 0.6 or more and 0.7 or less, may be 0.7 or more and 0.9 or less, may be 0.7 or more and 0.8 or less, or may be 0.8 or more and 0.9 or less.

The mask first auxiliary area 28A is an area through which the deposition material constituting the aforementioned electrode first auxiliary area 143A of the first layer 140A of the second electrode 140 mainly passes. In the example shown in FIG. 22, the mask first auxiliary areas 28A are arranged along the third direction D3 and the fourth direction D4 at positions apart from the mask first main areas 26A and the mask first extension areas 27A. In the example shown in FIG. 22, the mask first auxiliary area 28A extends in the third direction D3.

The mask first auxiliary area 28A has a dimension smaller than the mask first main area 26A in a direction orthogonal to the direction in which the mask first auxiliary area 28A extends. In the example shown in FIG. 22, the mask first auxiliary area 28A has a dimension smaller than the mask first main area 26A in the fourth direction D4 orthogonal to the third direction D3 in which the mask first auxiliary area 28A extends. In the fourth direction D4, a dimension W13 of the mask first auxiliary area 28A may be 0.9 times or less the dimension W11 of the mask first main area 26A, may be 0.8 times or less the dimension W11 of the mask first main area 26A, may be 0.7 times or less the dimension W11 of the mask first main area 26A, may be 0.6 times or less the dimension W11 of the mask first main area 26A, or may be 0.5 times or less the dimension W11 of the mask first main area 26A. In the fourth direction D4, the dimension W13 of the mask first auxiliary area 28A may be 0.05 times or more the dimension W11 of the mask first main area 26A, may be 0.1 times or more the dimension W11 of the mask first main area 26A, may be 0.2 times or more the dimension W11 of the mask first main area 26A, may be 0.3 times or more the dimension W11 of the mask first main area 26A, or may be 0.4 times or more the dimension W11 of the mask first main area 26A.

A range of W13/W11, which is a ratio of the dimension W13 with respect to the dimension W11, may be defined by a first group consisting of 0.05, 0.1, 0.2, 0.3 and 0.4, and/or a second group consisting of 0.9, 0.8, 0.7, 0.6 and 0.5. The range of W13/W11 may be defined by a combination of any one of the values included in the aforementioned first group, and any one of the values included in the aforementioned second group. For example, W13/W11 may be 0.05 or more and 0.9 or less, may be 0.05 or more and 0.8 or less, may be 0.05 or more and 0.7 or less, may be 0.05 or more and 0.6 or less, may be 0.05 or more and 0.5 or less, may be 0.05 or more and 0.4 or less, may be 0.05 or more and 0.3 or less, may be 0.05 or more and 0.2 or less, may be 0.05 or more and and 0.1, may be 0.1 or more and 0.9 or less, may be 0.1 or more and 0.8 or less, may be 0.1 or more and 0.7 or less, may be 0.1 or more and 0.6 or less, may be 0.1 or more and 0.5 or less, may be 0.1 or more and 0.4 or less, may be 0.1 or more and 0.3 or less, may be 0.1 or more and 0.2 or less, may be 0.2 or more and 0.9 or less, may be 0.2 or more and 0.8 or less, may be 0.2 or more and 0.7 or less, may be 0.2 or more and 0.6 or less, may be 0.2 or more and 0.5 or less, may be 0.2 or more and 0.4 or less, may be 0.2 or more and 0.3 or less, may be 0.3 or more and 0.9 or less, may be 0.3 or more and 0.8 or less, may be 0.3 or more and 0.7 or less, may be 0.3 or more and 0.6 or less, may be 0.3 or more and 0.5 or less, may be 0.3 or more and 0.4 or less, may be 0.4 or more and 0.9 or less, may be 0.4 or more and 0.8 or less, may be 0.4 or more and 0.7 or less, may be 0.4 or more and 0.6 or less, may be 0.4 or more and 0.5 or less, may be 0.5 or more and 0.9 or less, may be 0.5 or more and 0.8 or less, may be 0.5 or more and 0.7 or less, may be 0.5 or more and 0.6 or less, may be 0.6 or more and 0.9 or less, may be 0.6 or more and 0.8 or less, may be 0.6 or more and 0.7 or less, may be 0.7 or more and 0.9 or less, may be 0.7 or more and 0.8 or less, or may be 0.8 or more and 0.9 or less.

Figure 23:
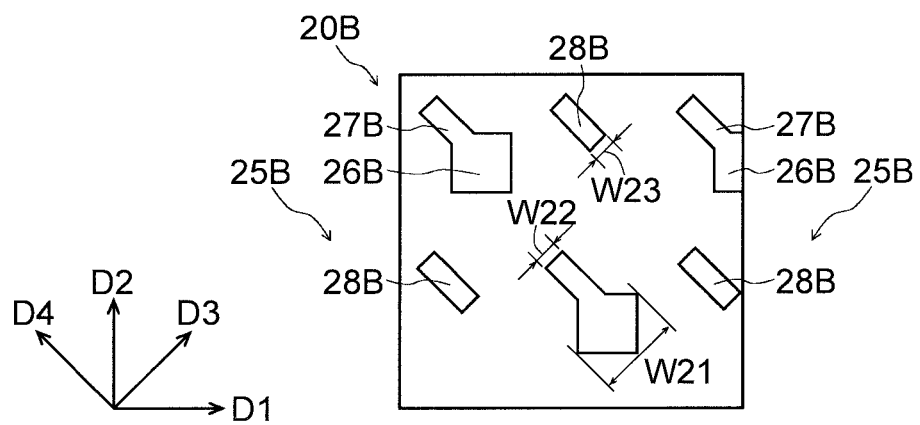
FIG. 23 is a plan view showing an example of the second deposition mask.

FIG. 23 is a plan view showing the second deposition mask 20B seen from the first surface 201 side. As shown in FIG. 23, the second deposition mask 20B has a plurality of the second through holes 25B including areas arranged along two different directions. A plurality of the second through holes 25B at least include a plurality of mask second main areas 26B arranged along two different directions. A plurality of the second through holes 25B may include a plurality of mask second extension areas 27B arranged along two different directions. A plurality of the second through holes 25B may include a plurality of mask second auxiliary areas 28B arranged along two different directions.

The mask second main area 26B is an area through which the deposition material constituting the aforementioned electrode second main area 141B of the second layer 140B of the second electrode 140 mainly passes. In the example shown in FIG. 23, a plurality of the mask second main areas 26B are arranged along the third direction D3 and the fourth direction D4.

The mask second extension area 27B is an area through which the deposition material constituting the aforementioned electrode second extension area 142B of the second layer 140B of the second electrode 140 mainly passes. In the example shown in FIG. 23, the mask second extension area 27B extends from the mask second main area 26B in the fourth direction D4 in which the two adjacent mask second main areas 26B are arranged.

Similarly to the aforementioned mask first extension area 27A, the mask second extension area 27B has a dimension smaller than the mask second main area 26B in a direction orthogonal to the direction in which the mask second extension area 27B extends from the mask second main area 26B. In the example shown in FIG. 23, the mask second extension area 27B has a dimension smaller than the mask second main area 26B in the third direction D3 orthogonal to the fourth direction D4 in which the two adjacent mask second main areas 26B are arranged. Since a relationship between a dimension W22 of the mask second extension area 27B and the dimension W21 of the mask second main area 26B in the third direction D3 is similar to the aforementioned relationship between the dimension W12 of the mask first extension area 27A and the dimension W11 of the mask first main area 26A, detailed description is omitted.

The mask second auxiliary area 28B is an area through which the deposition material constituting the aforementioned electrode second auxiliary area 143B of the second layer 140B of the second electrode 140 mainly passes. In the example shown in FIG. 23, a plurality of the mask second auxiliary areas 28B are arranged along the third direction D3 and the fourth direction D4 at positions apart from the mask second main areas 26B and the mask second extension areas 27B. In the example shown in FIG. 23, the mask second auxiliary area 28B extends in the fourth direction D4.

The mask second auxiliary area 28B has a dimension smaller than the mask second main area 26B in a direction orthogonal to the direction in which the mask second auxiliary area 28B extends. In the example shown in FIG. 23, the mask second auxiliary area 28B has a dimension smaller than the mask second main area 26B in the third direction D3 orthogonal to the fourth direction D4 in which the mask second auxiliary area 28B extends. Since a relationship between a dimension W23 of the mask second auxiliary area 28B and the dimension W21 of the mask second main area 26B in the third direction D3 is similar to the aforementioned relationship between the dimension W13 of the mask first auxiliary area 28A and the dimension W11 of the mask first main area 26A, detailed description is omitted.

Figure 24:
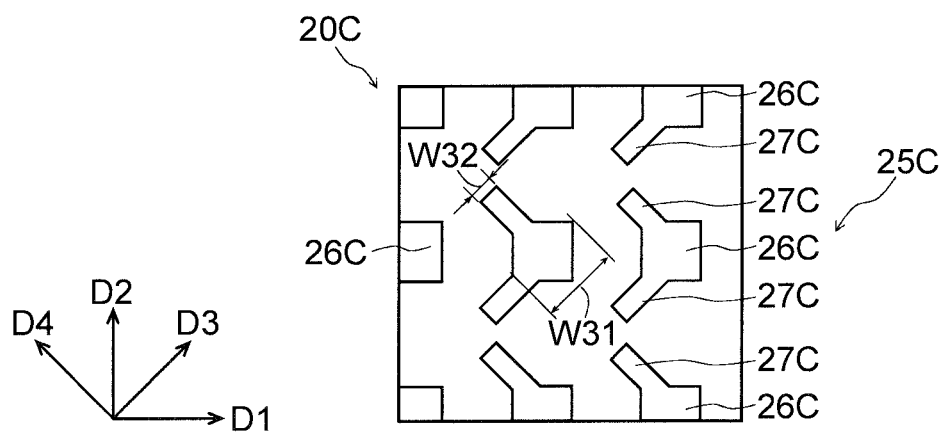
FIG. 24 is a plan view showing an example of a third deposition mask.

FIG. 24 is a plan view showing the third deposition mask 20C seen from the first surface 201 side. As shown in FIG. 24, the third deposition mask 20C has a plurality of third through holes 25C including areas arranged along two different directions. A plurality of the third through holes 25C at least include a plurality of mask third main areas 26C arranged along two different directions. A plurality of the third through holes 25C may include a plurality of mask third extension areas 27C arranged along two different directions.

The mask third main area 26C is an area through which the deposition material constituting the aforementioned electrode third main area 141C of the third layer 140C of the second electrode 140 mainly passes. In the example shown in FIG. 24, a plurality of the mask third main areas 26C are arranged along the first direction D1 and the second direction D2.

The mask third extension area 27C is an area through which the deposition material constituting the aforementioned electrode third extension area 142C of the third layer 140C of the second electrode 140 mainly passes. The mask third extension area 27C may extend from the mask third main area 26C in the third direction D3 in which the mask first main areas 26A of the first deposition mask 20A are arranged. The mask third extension area 27C may extend from the mask third main area 26C in the fourth direction D4 in which the mask second main areas 26B of the second deposition mask 20B are arranged.

A dimension W32 of the mask third extension area 27C is smaller than a dimension W31 of the mask third main area 26C in a direction orthogonal to the direction in which the mask third extension area 27C extends from the mask third main area 26C. Since a relationship between the dimension W32 of the mask third extension area 27C and the dimension W31 of the mask third main area 26C is similar to the aforementioned relationship between the dimension W12 of the mask first extension area 27A and the dimension W11 of the mask first main area 26A, detailed description is omitted.

Next, an example of a method of manufacturing the electronic device 100 is described.

First, the substrate 91 on which a plurality of the first electrodes 120 are arranged in the third direction D3 and the fourth direction D4 is prepared. Following thereto, as shown in FIG. 17, the first energizing layers 130A, the second energizing layers 130B and the third energizing layers 130C are formed on the first electrodes 120. The first energizing layers 130A are formed by, for example, depositing an organic material or the like onto the first electrodes 120 corresponding to the first energizing layers 130A by a deposition method using a deposition mask having through holes corresponding to the first energizing layers 130A. The second energizing layers 130B may also be formed by, for example, depositing an organic material or the like onto the first electrodes 120 corresponding to the second energizing layers 130B by a deposition method using a deposition mask having through holes corresponding to the second energizing layers 130B. The third energizing layers 130C may also be formed by, for example, depositing an organic material or the like onto the first electrodes 120 corresponding to the third energizing layers 130C by a deposition method using a deposition mask having through holes corresponding to the third energizing layers 130C.

Following thereto, a conductive material such as metal is deposited onto the substrate 91 by a deposition method using the first deposition mask apparatus 10A comprising the first deposition mask 20A, so as to form the first layer 140A of the second electrode 140. Following thereto, a conductive material such as metal is deposited onto the substrate 91 by a deposition method using the second deposition mask apparatus 10B comprising the second deposition mask 20B, so as to form the second layer 140B of the second electrode 140. Following thereto, a conductive material such as metal is deposited onto the substrate 91 by a deposition method using the third deposition mask apparatus 10C comprising the third deposition mask 20C, so as to form the third layer 140C of the second electrode 140. In this manner, as shown in FIGS. 18 to 21, the second electrode 140 including the first layer 140A, the second layer 140B and the third layer 140C can be formed. The order of forming the first layer 140A, the second layer 140B and the third layer 140C is not particularly limited. For example, they may be formed in the order of third layer 140C, the second layer 140B and the first layer 140A.

Figure 25:
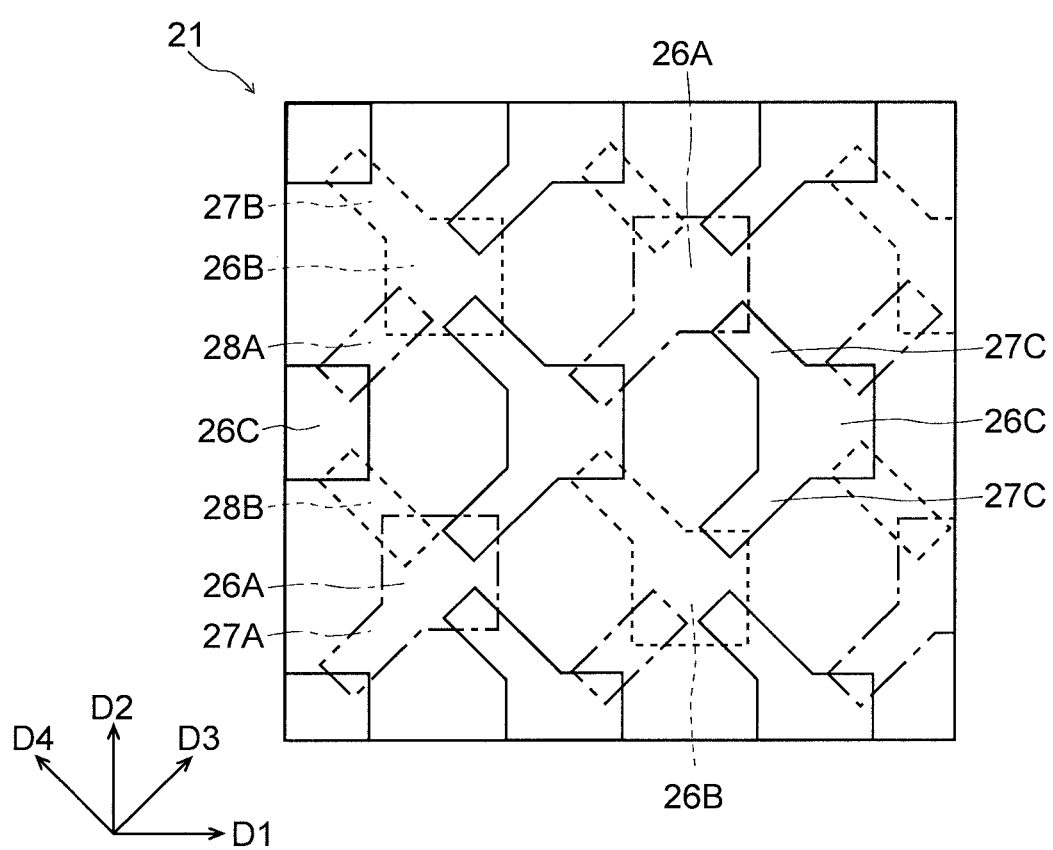
FIG. 25 is a view showing a state in which the first deposition mask, the second deposition mask and the third deposition mask are overlapped.

An effect to be achieved by using the deposition mask group comprising the first deposition mask 20A, the second deposition mask 20B and the third deposition mask 20C to form the second electrode 140 is described with reference to FIG. 25. FIG. 25 is a view showing a laminate 21 obtained by overlapping the first deposition mask 20A, the second deposition mask 20B and the third deposition mask 20C.

In FIG. 25, the first through holes 25A of the first deposition mask 20A are shown by one-dot chain lines, the second through holes 25B of the second deposition mask 20B are shown by dotted lines, and the third through holes 25C of the third deposition mask 20C are shown by solid lines. As shown in FIG. 25, when the first deposition mask 20A, the second deposition mask 20B and the third deposition mask 20C are overlapped, the first through hole 25 of the first deposition mask 20A partly overlaps the second through hole 25B of the second deposition mask 20B or the third through hole 25C of the third deposition mask 20C. This means that the first layer 140A of the second electrode 140, which is formed on the substrate 91 by the deposition material having passed through the first through hole 25A, partly overlaps the second layer 140B of the second electrode 140, which is formed on the substrate 91 by the deposition material having passed through the second through hole 25B, or the third layer 140C of the second electrode 140, which is formed on the substrate 91 by the deposition material having passed through the third through hole 25C. Thus, the first layer 140A and the second layer 140B or the third layer 140C can be electrically connected, whereby it is easy to stably control an electric potential of the second electrode 140.

The overlap of the first through hole 25A of the first deposition mask 20A, the second through hole 25B of the second deposition mask 20B and the third through hole 25C of the third deposition mask 20C is described in detail. As shown in FIG. 25, when the first deposition mask 20A, the second deposition mask 20B and the third deposition mask 20C are overlapped, the mask first extension area 27A of the first deposition mask 20A may extend from the mask first main area 26A to partly overlap the mask third main area 26C of the third deposition mask 20C. Thus, the electrode first extension area 142A of the first layer 140A, which is formed correspondingly to the mask first extension area 27A, can partly overlap the electrode third main area 141C of the third layer 140C, which is formed correspondingly to the mask third main area 26C. The mask second extension area 27B of the second deposition mask 20B may extend from the mask second main area 26B to partly overlap the mask third main area 26C of the third deposition mask 20C. Thus, the electrode second extension area 1426 of the second layer 140 can partly overlap the electrode third main area 141C of the third layer 140C. The mask third extension area 27C of the third deposition mask 20C may extend from the mask third main area 26C to partly overlap the mask first main area 26A of the first deposition mask 20A. Thus, the electrode third extension area 142C of the third layer 140C can partly overlap the electrode first main area 141A of the first layer 140A. The mask third extension area 27C of the third deposition mask 20C may extend from the mask third main area 26C to partly overlap the mask second main area 26B of the second deposition mask 20B. Thus, the electrode third extension area 142C of the third layer 140C can partly overlap the electrode second main area 141B of the second layer 140B.

Further, as shown in FIG. 25, when the first deposition mask 20A, the second deposition mask 20B and the third deposition mask 20C are overlapped, the mask first auxiliary area 28A of the first deposition mask 20A may extend between the mask second main area 26B of the second deposition mask 20B and the mask third main area 26C of the third deposition mask 20C to partly overlap the mask second main area 26B and the mask third main area 26C. Thus, the electrode first auxiliary area 143A of the first layer 140A, which is formed correspondingly to the mask first auxiliary area 28A, can partly overlap the electrode second main area 141B of the second layer 140B and the electrode third main area 141C of the third layer 140C. The mask second auxiliary area 28B of the second deposition mask 20B may extend between the mask first main area 26A of the first deposition mask 20A and the mask third main area 26C of the third deposition mask 20C. Thus, the electrode second auxiliary area 143B of the second layer 140B, which is formed correspondingly to the mask second auxiliary area 28B, can partly overlap the electrode first main area 141A of the first layer 140A and the electrode third main area 141C of the third layer 140C.

Preferably, when the first deposition mask 20A, the second deposition mask 20B and the third deposition mask 20C are overlapped, the first through hole 25A of the first deposition mask 20A is connected to another one of the first through holes 25A via the second through hole 25B of the second deposition mask 20B, or via the third through hole 25C of the third deposition mask 20C. Thus, the first layer 140A can be electrically connected to another one of the first layers 140A via the second layer 140B or the third layer 140C. When the first deposition mask 20A, the second deposition mask 20B and the third deposition mask 20C are overlapped, the first through hole 25A of the first deposition mask 20A may be connected to another one of the first through holes 25A via the second through hole 25B of the second deposition mask 20B and the third through hole 25C of the third deposition mask 20C. Thus, the first layer 140A can be electrically connected to another one of the first layers 140A via the second layer 140B and the third layer 140C.

According to the embodiment shown in FIGS. 17 to 25, as shown in FIG. 18, the electrode-free area 150 free of the second electrode 140 can be formed between the first element 110A including the first energizing layer 130A and the second element 110B including the second energizing layer 130B. In addition, the electrode-free area 150 free of the second electrode 140 can be formed between the two third elements 110C including the third energizing layers 130C. Thus, a light transmittance of the entire electronic device 100 can be improved, as compared with a case in which the second electrode 140 is formed entirely over the substrate 91.

According to the embodiment shown in FIGS. 17 to 25, the electrode first main area 141A of the first layer 140A of the first element 110A, the electrode second main area 141B of the second layer 140B of the second element 110B, and the electrode third main area 141C of the third layer 140C of the third element 110C are electrically connected to one another via the aforementioned electrode extension areas 142A, 142B and 142C, the electrode auxiliary areas 143A and 143B, and so on. Thus, it is easy to stably control an electric potential of the second electrode 140.

According to the embodiment shown in FIGS. 17 to 25, since the first layer 140A, the second layer 140B and the third layer 140C of the second electrode 140 are formed by deposition methods using the different deposition masks 20, the structures of the first layer 140A, the second layer 140B and the third layer 140C can be independently set. For example, a material different from a material of the second layer 140B or a material of the third layer 140C can be used for the first layer 140A. In addition, a thickness of the first layer 140A may differ from a thickness of the second layer 140B or a thickness of the third layer 140C. Thus, it is easy to control properties of the respective elements 110A, 110B and 110C independently.

According to the embodiment shown in FIGS. 17 to 25, the first layer 140A can partly overlap the second layer 140B or the third layer 140C. An electric resistance of an area of the second electrode 140, in which the two layers overlap, is lower than an electric resistance of an area of the second electrode 140, which is formed of two layers. The area of the second electrode 140, in which the two layers overlap, is periodically present along the arrangement direction of the energizing layers 130. Thus, an electric resistance of the second electrode 140 in the in-plane direction of the substrate 91 can be reduced, as compared with a case in which the second electrode 140 is made of one conductive layer.

Figure 26:
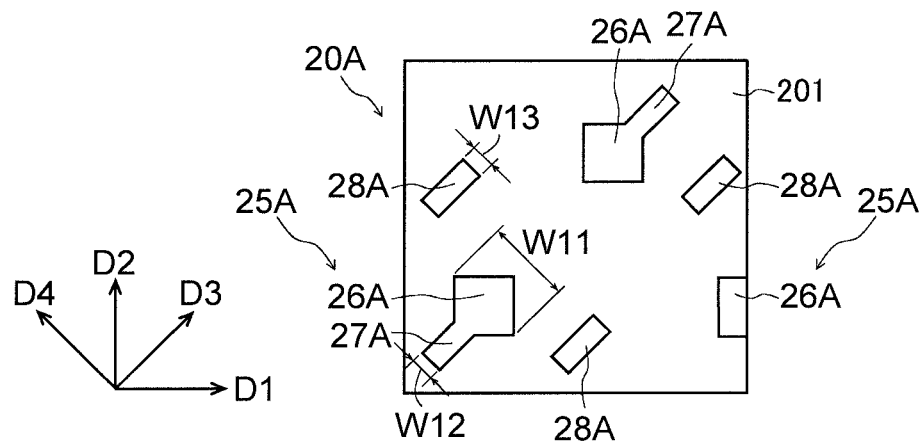
FIG. 26 is a plan view showing an example of the first deposition mask.
Figure 27:
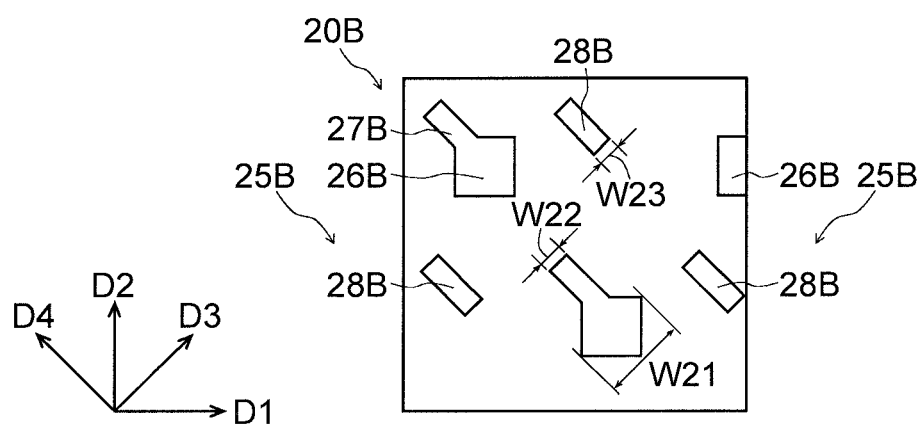
FIG. 27 is a plan view showing an example of the second deposition mask.
Figure 28:
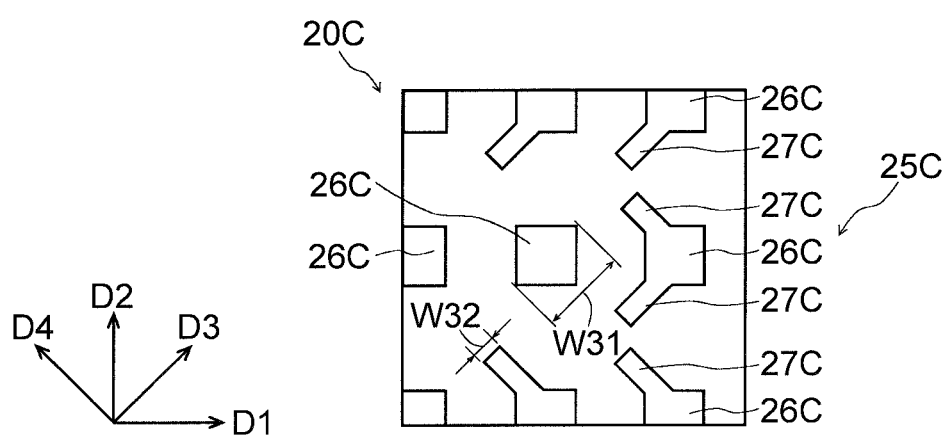
FIG. 28 is a plan view showing an example of the third deposition mask.

In the embodiment shown in FIGS. 17 to 25, the example in which the mask first extension area 27A extends from the mask first main area 26A of the first through hole 25A of the first deposition mask 20A is described. However, the present disclosure is not limited thereto. For example, as shown in FIG. 26, the first through hole 25A of the first deposition mask 20A may include the mask first main area 26A to which the mask first extension area 27A is not connected. Similarly, as shown in FIG. 27, for example, the second through hole 25B of the second deposition mask 20B may include the mask second main area 26B to which the mask second extension area 27B is not connected. Similarly, as shown in FIG. 28 for example, the third through hole 25C of the third deposition mask 20C may include the mask third main area 26C to which the mask third extension area 27C is not connected.

As shown in FIG. 26, the dimension W12 of the mask first extension area 27A may be smaller than the dimension W11 of the mask first main area 26A in a direction orthogonal to the third direction D3 in which the mask first extension area 27A extends from the mask first main area 26A. Since a relationship between the dimension W12 and the dimension W11 is similar to that of the example shown in FIG. 22, description is omitted.

As shown in FIG. 26, the dimension W13 of the mask first auxiliary area 28A may be smaller than the dimension W11 of the mask first main area 26A in a direction orthogonal to the third direction D3 in which the mask first auxiliary area 28A extends. Since a relationship between the dimension W13 and the dimension W11 is similar to that of the example shown in FIG. 22, description is omitted.

As shown in FIG. 27, the dimension W22 of the mask second extension area 27B may be smaller than the dimension W21 of the mask second main area 26B in a direction orthogonal to the fourth direction D4 in which the mask second extension area 27B extends from the mask second main area 26B. Since a relationship between the dimension W22 and the dimension W21 is similar to that of the example shown in FIG. 23, description is omitted.

As shown in FIG. 27, the dimension W23 of the mask second auxiliary area 28B may be smaller than the dimension W21 of the mask second main area 26B in a direction orthogonal to the fourth direction D4 in which the mask second auxiliary area 28B extends. Since a relationship between the dimension W23 and the dimension W21 is similar to that of the example shown in FIG. 23, description is omitted.

As shown in FIG. 28, the dimension W32 of the mask third extension area 27C may be smaller than the dimension W31 of the mask third main area 26C in a direction orthogonal to the third direction D3 or the fourth direction D4 in which the mask third extension area 27C extends from the mask third main area 26C. Since a relationship between the dimension W32 and the dimension W31 is similar to that of the example shown in FIG. 24, description is omitted.

Figure 29:
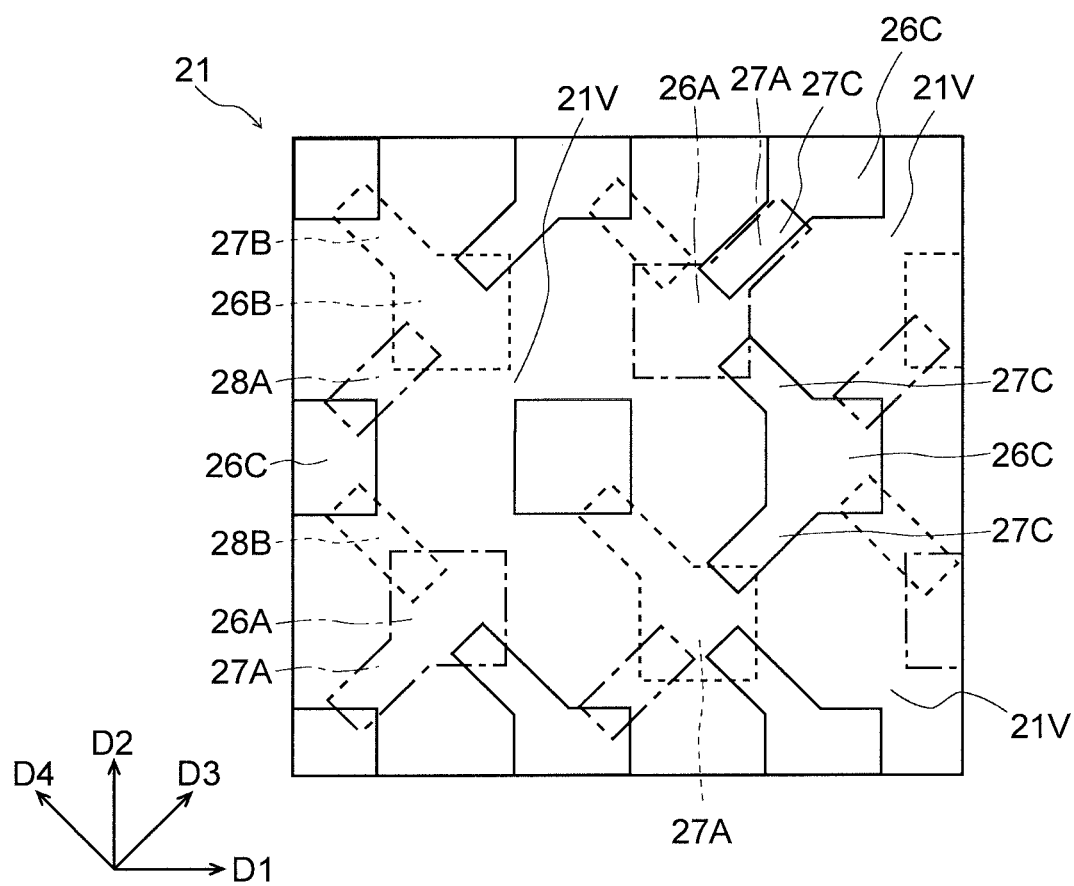
FIG. 29 is a view showing a state in which the first deposition mask, the second deposition mask and the third deposition mask are overlapped.

FIG. 29 is a view showing the laminate 21 obtained by overlapping the first deposition mask 20A shown in FIG. 26, the second deposition mask 20B shown in FIG. 27 and the third deposition mask 20C shown in FIG. 28. According to the embodiment shown in FIGS. 26 to 29, when the first deposition mask 20A, the second deposition mask 20B and the third deposition mask 20C are overlapped, as shown in FIG. 29, an area 21V in which the through hole 25 of the deposition mask 20 is not present can be provided between the mask first main area 26A and the mask third main area 26C adjacent to each other in the third direction D3 or the fourth direction D4, or between the mask second main area 26B and the mask third main area 26C adjacent to each other in the third direction D3 or the fourth direction D4. Thus, the electrode-free area 150 free of the second electrode 140 can be formed between the first element 110A and the third element 110C adjacent to each other in the third direction D3 or the fourth direction D4 or between the second element 110B and the third element 110C adjacent to each other in the third direction D3 or the fourth direction D4. Thus, a ratio of the electrode-free area 150 in the electronic device 100 can be increased, so that a light transmittance of the electronic device 100 can be improved.

The respective deposition masks 20A, 20B and 20C may be configured such that, when the first deposition mask 20A, the second deposition mask 20B and the third deposition mask 20C are overlapped, the mask first extension area 27A of the first deposition mask 20A or the mask second extension area 27B of the second deposition mask 20B overlaps the mask third extension area 27C of the third deposition mask 20C. For example, as shown in FIG. 29, when the first deposition mask 20A, the second deposition mask 20B and the third deposition mask 20C are overlapped, one of a plurality of the mask first extension areas 27A and one of a plurality of the mask third extension areas 27C may overlap. As shown in FIG. 26, for example, this state may be realized by the fact that the first through hole 25A of the first deposition mask 20A includes the mask first extension area 27A extending from the mask first main area 26A on one side of the third direction D3, and the mask first extension area 27A extending from the mask first main area 26A on the other side of the third direction D3. According to the example shown in FIG. 29, in a portion where the mask first extension area 27A and the mask third extension area 27C overlap, the second electrode 140 is formed such that the electrode first extension area 142A and the electrode third extension area 142C of the second electrode 140 overlap. This can reduce an electric resistance between the electrode first main area 141A and the electrode third main area 141C. Thus, as shown in FIG. 29, even when the area 21V in which the through hole 25 of the deposition mask 20 is not present is provided between the mask first main area 26A and the mask third main area 26C adjacent to each other in the third direction D3 or the fourth direction D4 or between the mask second main area 26B and the mask third main area 26C adjacent to each other in the third direction D3 or the fourth direction D4, an electric resistance of the entire second electrode 140 can be maintained low.

As shown in FIG. 29, the mask first extension area 27A overlapping the mask third extension area 27C may extend also to partly overlap the mask third main area 26C. The mask third extension area 27C overlapping the mask first extension area 27A may extend also to partly overlap the mask first main area 26A. When two or more through holes of the deposition mask 20 overlap, two or more layers of the second electrode 140, which are formed correspondingly thereto, can overlap.

Next, another example of using the deposition mask group to form the second electrode 140 of the electronic device 100 is described with reference to FIGS. 30 to 35. In the embodiment shown in FIGS. 30 to 35, a part that can be similarly constituted to the embodiment shown in FIGS. 17 to 25 has the same reference numeral as that of corresponding part the embodiment shown in FIGS. 17 to 25, and overlapped description is omitted.

Figure 30:
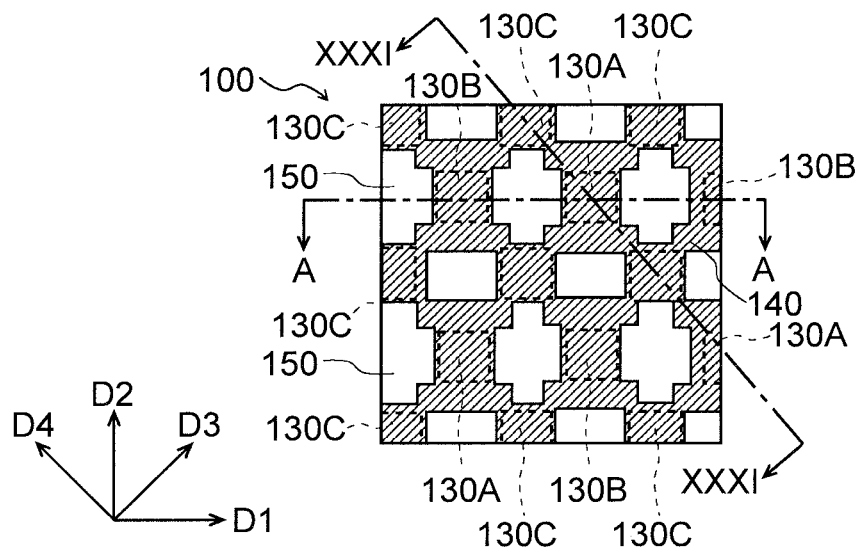
FIG. 30 is a plan view showing an example of an electronic device comprising the first energizing layer, the second energizing layer and the third energizing layer.
Figure 31:
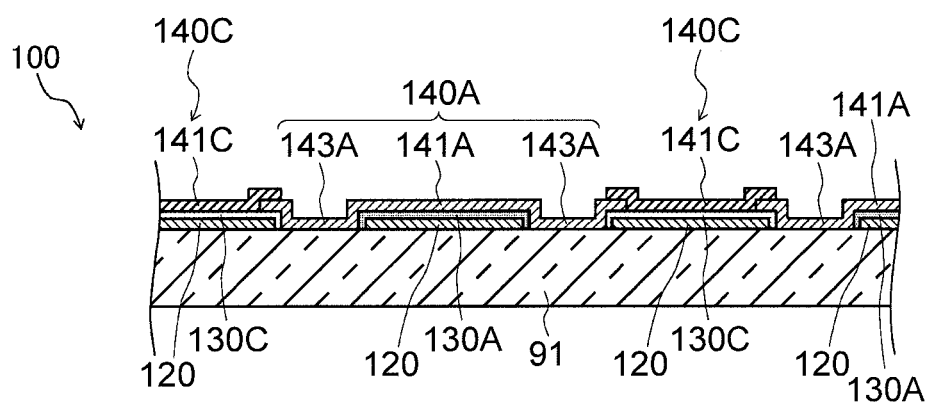
FIG. 31 is a sectional view along a XXXI-XXXI line of the electronic device shown in FIG. 30.

FIG. 30 is a plan view showing the substrate 91 with the second electrode 140 being formed on the first energizing layers 130A, the second energizing layers 130B and the third energizing layers 130C shown in FIG. 17. FIG. 31 is a sectional view along a XXXI-XXXI line of the electronic device 100 shown in FIG. 30. As shown in FIG. 30, the electronic device 100 includes the electrode-free area 150 free of the second electrode 140. As shown in FIG. 31, the first layer 140A may include the electrode first auxiliary area 143A extending in the first direction D1 to electrically connect the electrode third main area 141C of the third layer 140C and the electrode first main area 141A of the first layer 140A. Similarly, although not shown, the second layer 140B may include an electrode second auxiliary area extending in the first direction D1 to electrically connect the electrode third main area 141C of the third layer 140C and the electrode second main area 141B of the second layer 140B.

Figure 32:
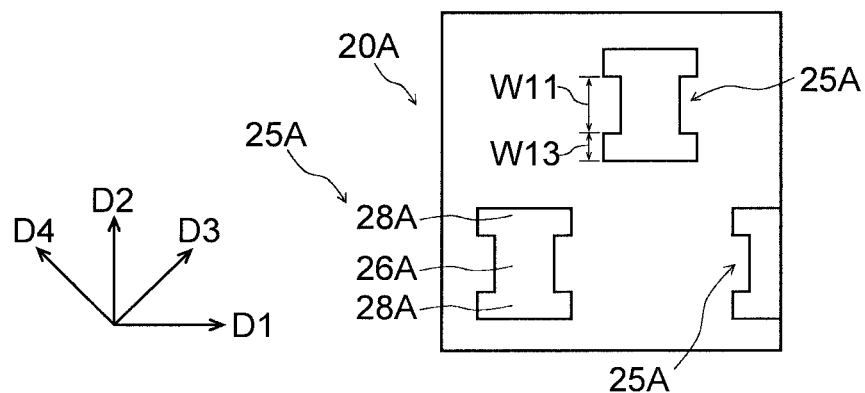
FIG. 32 is a plan view showing an example of the first deposition mask.

FIG. 32 is a plan view showing the first deposition mask 20A seen from the first surface 201 side. As shown in FIG. 32, the mask first auxiliary area 28A of the first deposition mask 20A extends in the first direction D1. As shown in FIG. 32, the mask first auxiliary area 28A may be connected to the mask first main area 26A. The mask first auxiliary area 28A has a dimension larger than the mask first main area 26A in the first direction D1 in which the mask first auxiliary area 28A extends.

As shown in FIG. 32, the dimension W13 of the mask first auxiliary area 28A in the second direction D2 orthogonal to the first direction D1 in which the mask first auxiliary area 28A extends is smaller than the dimension W11 of the mask first main area 26A in the second direction D2. Since a relationship between the dimension W13 of the mask first auxiliary area 28A and the dimension W11 of the mask first main area 26A is similar to the aforementioned relationship between the dimension W13 of the mask first auxiliary area 28A and the dimension W11 of the mask first main area 26A in the example shown in FIG. 22, detailed description is omitted.

Figure 33:
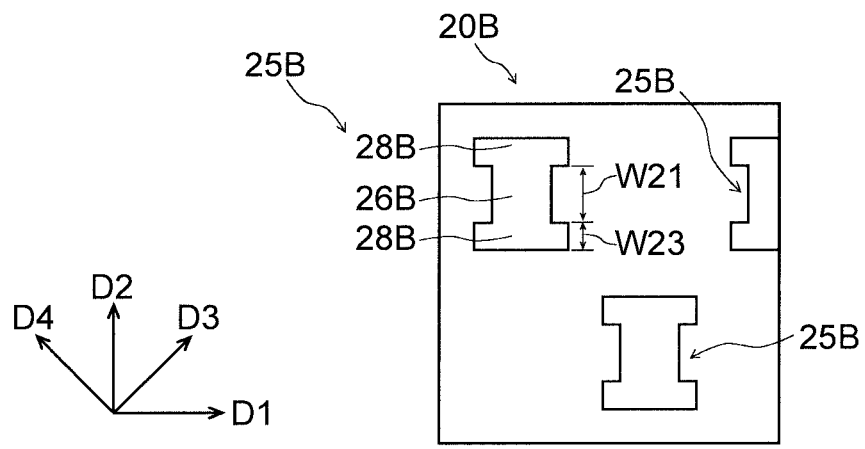
FIG. 33 is a plan view showing an example of the second deposition mask.

FIG. 33 is a plan view showing the second deposition mask 20B seen from the first surface 201 side. As shown in FIG. 33, the mask second auxiliary area 28B of the second deposition mask 20B extends in the first direction D1. As shown in FIG. 33, the mask second auxiliary area 28B may be connected to the mask second main area 26B. The mask second auxiliary area 28B has a dimension larger than the mask second main area 26B in the first direction D1 in which the mask second auxiliary area 28B extends.

As shown in FIG. 33, the dimension W23 of the mask second auxiliary area 28B in the second direction D2 orthogonal to the first direction D1 in which the mask second auxiliary area 28B extends is smaller than the dimension W21 of the mask second main area 26B in the second direction D2. Since a relationship between the dimension W23 of the mask second auxiliary area 28B and the dimension W21 of the mask second main area 26B is similar to the aforementioned relationship between the dimension W23 of the mask second auxiliary area 28B and the dimension W21 of the mask second main area 26B in the example shown in FIG. 23, detailed description is omitted.

Figure 34:
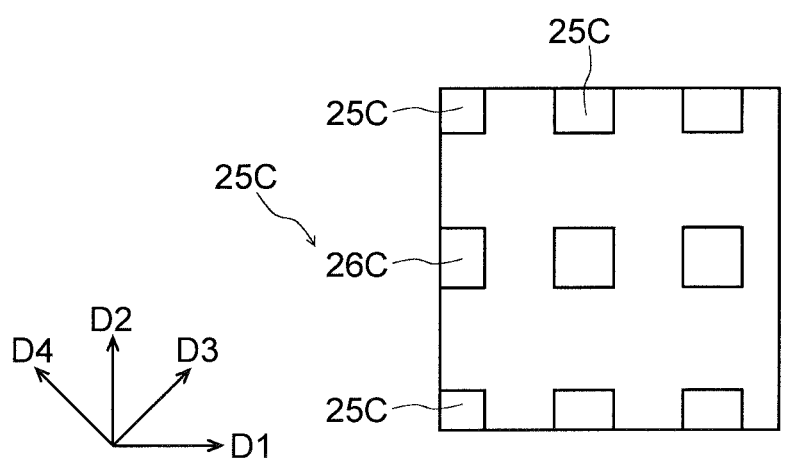
FIG. 34 is a plan view showing an example of the third deposition mask.

As shown in FIG. 34, the third through hole 25C at least includes the mask third main area 26C. As shown in FIG. 34, the third through hole 25C may not include the aforementioned mask third extension area 27C. Although not shown, the third through hole 25C may include the aforementioned mask third extension area 27C.

Figure 35:
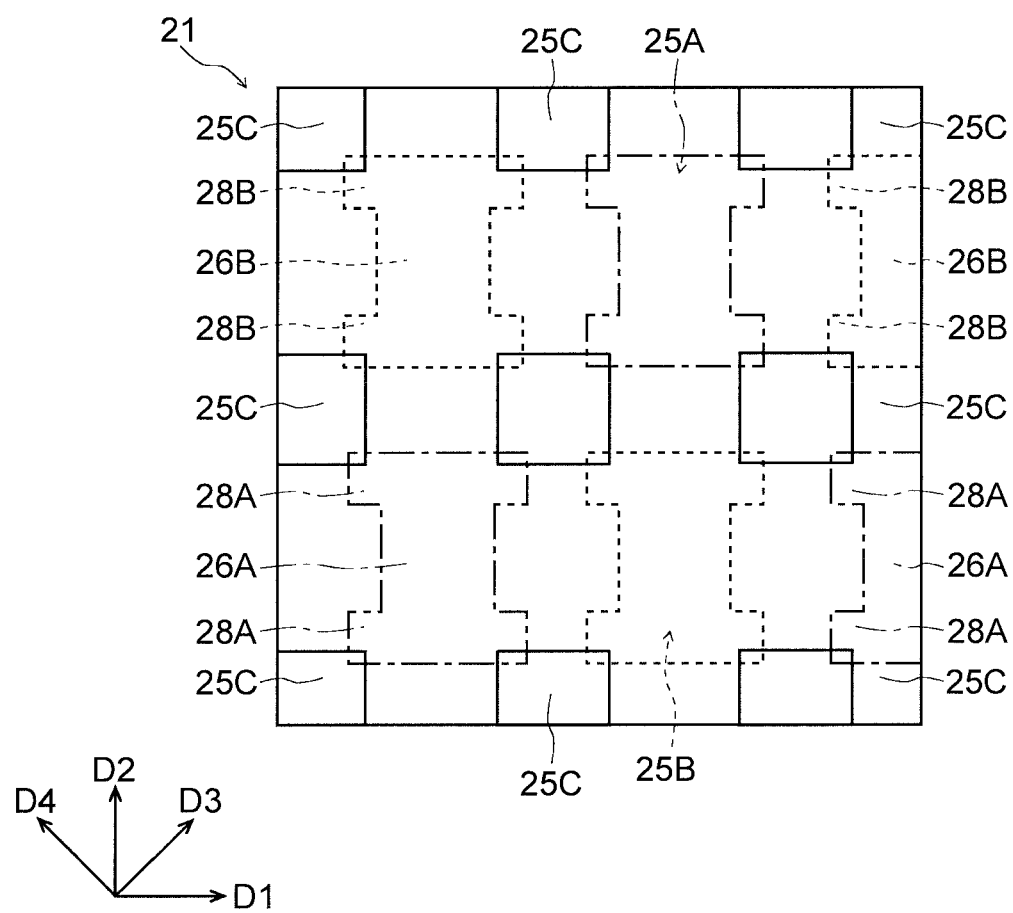
FIG. 35 is a view showing a state in which the first deposition mask, the second deposition mask and the third deposition mask are overlapped.

FIG. 35 is a view showing the laminate 21 obtained by overlapping the first deposition mask 20A shown in FIG. 32, the second deposition mask 20B shown in FIG. 33 and the third deposition mask 20C shown in FIG. 34. Also in the embodiment shown in FIGS. 30 to 35, when the first deposition mask 20A, the second deposition mask 20B and the third deposition mask 20C are overlapped, the first through hole 25A of the first deposition mask 20A partly overlaps the second through hole 25B of the second deposition mask 20B or the third through hole 25C of the third deposition mask 20C. Thus, the first layer 140A can be electrically connected to the second layer 140B or the third layer 140C, whereby it is easy to stably control an electric potential of the second electrode 140. The first layer 140A can partly overlap the second layer 140B or the third layer 140C. Thus, an electric resistance of the second electrode 140 in the in-plane direction of the substrate 91 can be reduced.

The overlap of the first through hole 25A of the first deposition mask 20A, the second through hole 25B of the second deposition mask 20B and the third through hole 25C of the third deposition mask 20C is described in detail. As shown in FIG. 35, when the first deposition mask 20A, the second deposition mask 20B and the third deposition mask 20C are overlapped, the mask first auxiliary area 28A of the first deposition mask 20A may extend in the first direction D1 to partly overlap the two mask third main areas 26C adjacent to each other in the first direction D1. Thus, the electrode first auxiliary area 143A of the first layer 140A, which is formed correspondingly to the mask first auxiliary area 28A, can partly overlap the electrode third main area 141C of the third layer 140C, which is formed correspondingly to the mask third main area 26C. The mask second auxiliary area 28B of the second deposition mask 20B may extend in the first direction D1 to partly overlap the two mask third main areas 26C adjacent to each other in the first direction D1. Thus, the electrode second auxiliary area 143B of the second layer 140B, which is formed correspondingly to the mask second auxiliary area 28B, can partly overlap the electrode third main area 141C of the third layer 140C.

Also in the embodiment shown in FIGS. 30 to 35, as shown in FIG. 30, the electrode-free area 150 free of the second electrode 140 can be formed between the first element 110A including the first energizing layer 130A and the second element 110B including the second energizing layer 130B. The electrode-free area 150 free of the second electrode 140 can be formed between the two third elements 110C including the third energizing layers 130C. Thus, a light transmittance of the electronic device 100 can be improved, as compared with a case in which the second electrode 140 is formed entirely over the substrate 91.

Next, another example of using the deposition mask group to form the second electrode 140 of the electronic device 100 is described with reference to FIGS. 36 to 42B. In the embodiment shown in FIGS. 36 to 42B, a part that can be similarly constituted to the embodiment shown in FIGS. 17 to 25 has the same reference numeral as that of corresponding part the embodiment shown in FIGS. 17 to 25, and overlapped description is omitted.

Figure 36:
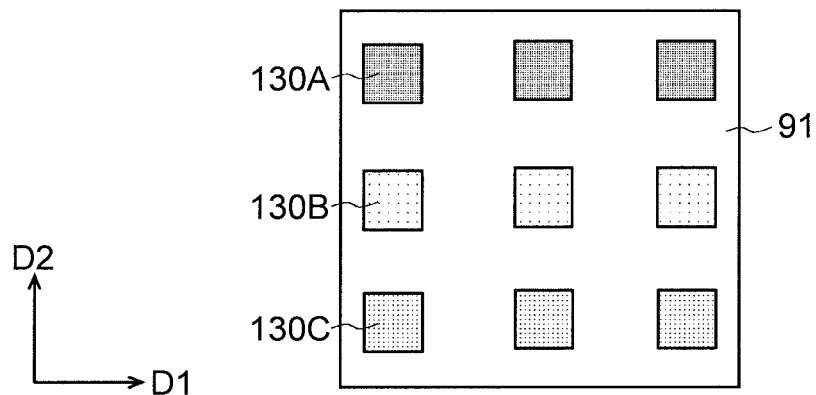
FIG. 36 is a plan view showing an example of the substrate on which the first energizing layer, the second energizing layer and the third energizing layer are formed.

FIG. 36 is a partial enlarged view showing the substrate 91 on which the first energizing layers 130A, the second energizing layers 130B and the third energizing layers 130C are formed. In the example shown in FIG. 36, two or more first energizing layers 130A are arranged along the first direction D1. Two or more energizing second layers 130B are arranged along the first direction D1. Two or more third energizing layers 130C are arranged along the first directions D1. As shown in FIG. 36, a line of the first energizing layers 130A arranged in the first direction D1, a line of the second energizing layers 130B arranged in the first direction D1, and a line of the third energizing layers 130C arranged in the first direction D1 are arranged in sequence in the second direction D2 intersecting the first direction D1. Thus, the two or more first energizing layers 130A are arranged along the first direction D1 and the second direction D2. The same applies to the second energizing layers 130B and the third energizing layers 130C. The second direction D2 may be a direction orthogonal to the first direction D1.

Figure 37:
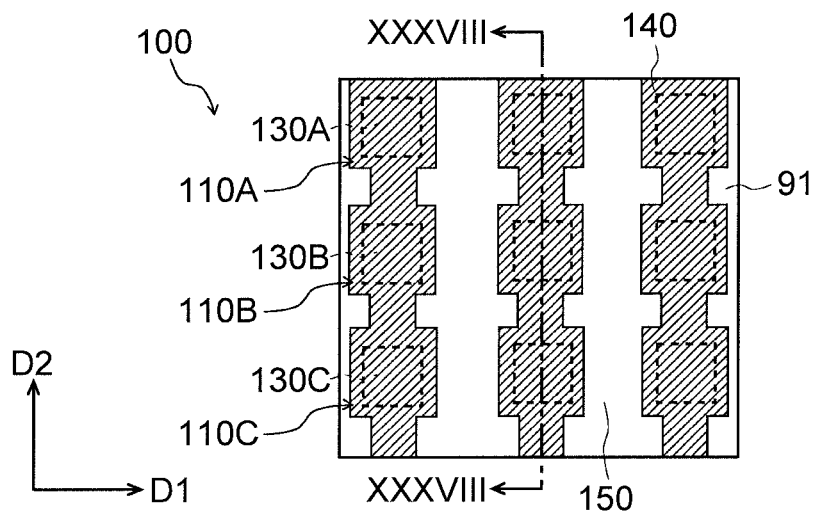
FIG. 37 is a plan view showing an example of the substrate with the second electrode being formed on the first energizing layer, the second energizing layer and the third energizing layer.
Figure 38:
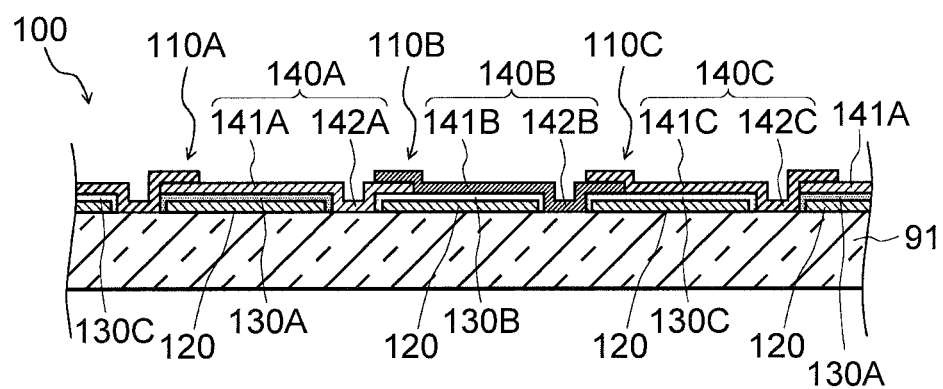
FIG. 38 is a sectional view along a XXXVIII-XXXVIII line of the electronic device shown in FIG. 36.

FIG. 37 is a plan view showing the substrate 91 with the second electrode 140 being formed on the first energizing layers 130A, the second energizing layers 130B and the third energizing layers 130C shown in FIG. 36. FIG. 38 is a sectional view along a XXXVIII-XXXVIII line of the electronic device 100 shown in FIG. 37. As shown in FIG. 37, the electronic device 100 includes the electrode-free area 150 free of the second electrode 140.

As shown in FIG. 38, the first layer 140A includes the electrode first main area 141A overlapping the first electrode 120 and the first energizing layer 130A. The second layer 140B includes the electrode second main area 141B overlapping the first electrode 120 and the second energizing layer 130B. The third layer 140C includes the electrode third main area 141C overlapping the first electrode 120 and the third energizing layer 130C.

As shown in FIG. 38, the first layer 140A further includes the electrode first extension area 142A extending from the electrode first main area 141A to electrically connect the electrode first main area 141A and the electrode second main area 141B. The second layer 140B further includes the electrode second extension area 142B extending from the electrode second main area 141B to electrically connect the electrode second main area 141B and the electrode third main area 141C. The third layer 140C further includes the electrode third extension area 142C extending from the electrode third main area 141C to electrically connect the electrode third main area 141C and the electrode first main area 141A.

Next, the first deposition mask 20A, the second deposition mask 20B and the third deposition mask 20C used for forming the first layer 140A, the second layer 140B and the third layer 140C of the second electrode 140 shown in FIGS. 37 and 38 are described.

Figure 39:
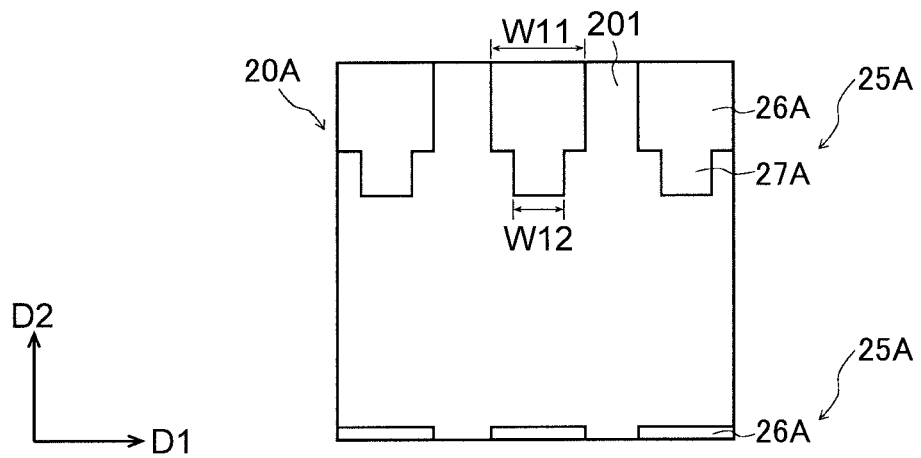
FIG. 39 is a plan view showing an example of the first deposition mask.

FIG. 39 is a plan view showing the first deposition mask 20A seen from the first surface 201 side. As shown in FIG. 39, the first deposition mask 20A has a plurality of the first through holes 25A arranged along the first direction D1 and the second direction D2. A plurality of the first through holes 25A include a plurality of the mask first main areas 26A arranged along the first direction D1 and the second direction D2. A plurality of the first through holes 25A may include a plurality of the mask first extension areas 27A arranged along the first direction D1 and the second direction D2. The mask first extension area 27A extends from the mask first main area 26A in the second direction D2 in which the two adjacent mask first main areas 26A are arranged.

The dimension W12 of the mask first extension area 27A may be smaller than the dimension W11 of the mask first main area 26A in a direction orthogonal to the second direction D2 in which the mask first extension area 27A extends from the mask first main area 26A. Since a relationship between the dimension W12 and the dimension W11 is similar to that of the example shown in FIG. 22, description is omitted.

Figure 40:
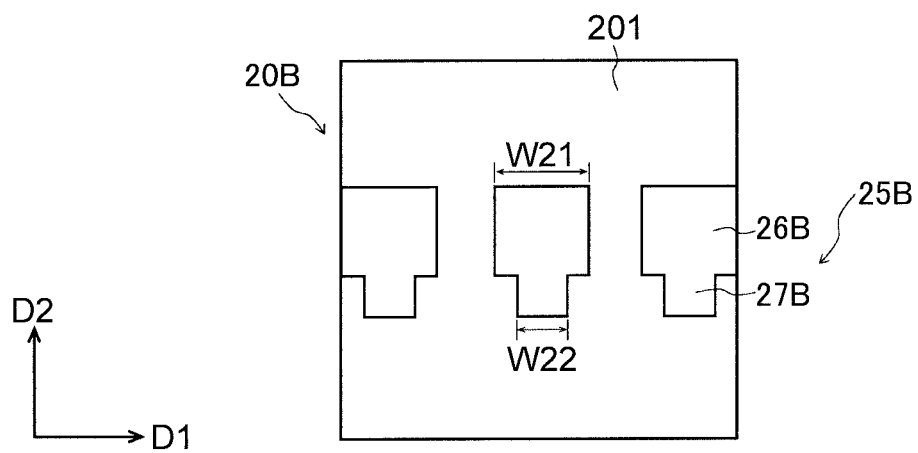
FIG. 40 is a plan view showing an example of the second deposition mask.

FIG. 40 is a plan view showing the second deposition mask 20B seen from the first surface 201 side. As shown in FIG. 40, the second deposition mask 20B includes a plurality of the second through holes 25B arranged along the first direction D1 and the second direction D2. A plurality of the second through holes 25B include a plurality of the mask second main areas 26B arranged along the first direction D1 and the second direction D2. A plurality of the second through holes 25B may include a plurality of the mask second extension areas 27B arranged along the first direction D1 and the second direction D2. The mask second extension area 27B extends from the mask second main area 26B in the second direction D2 in which the two adjacent mask second main areas 26B are arranged.

The dimension W22 of the mask second extension area 27B may be smaller than the dimension W21 of the mask second main area 26B in a direction orthogonal to the second direction D2 in which the mask second extension area 27B extends from the mask second main area 26B. Since a relationship between the dimension W22 and the dimension W21 is similar to that of the example shown in FIG. 23, description is omitted.

Figure 41:
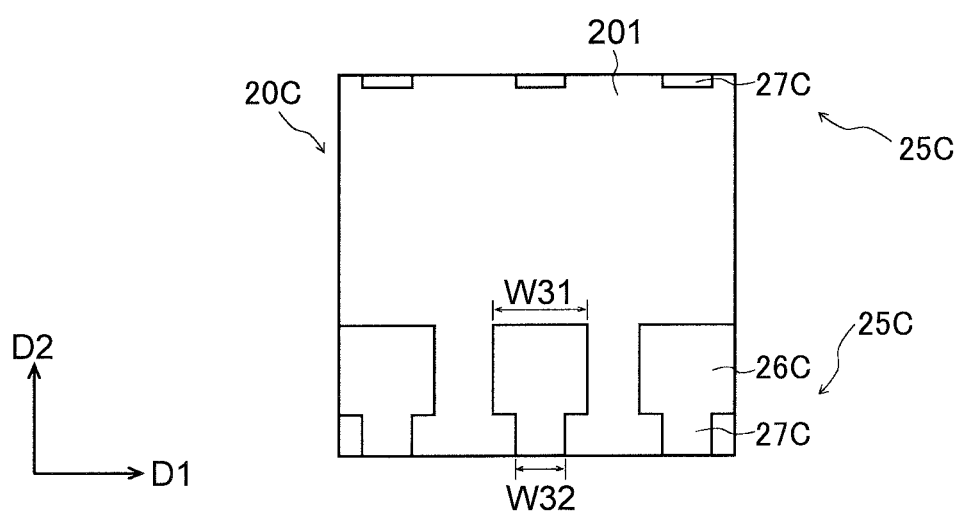
FIG. 41 is a plan view showing an example of the third deposition mask.

FIG. 41 is a plan view showing the third deposition mask 20C seen from the first surface 201 side. As shown in FIG. 41, the third deposition mask 20C includes a plurality of the third through holes 25C arranged along the first direction D1 and the second direction D2. A plurality of the third through holes 25C include a plurality of the mask third main areas 26C arranged along the first direction D1 and the second direction D2. A plurality of the third through holes 25C may include a plurality of the mask third extension areas 27C arranged along the first direction D1 and the second direction D2. The mask third extension area 27C extends from the mask third main area 26C in the second direction D2 in which the two adjacent mask third main areas 26C are arranged.

The dimension W32 of the mask third extension area 27C may be smaller than the dimension W31 of the mask third main area 26C in a direction orthogonal to the second direction D2 in which the mask third extension area 27C extends from the mask third main area 26C. Since a relationship between the dimension W32 and the dimension W31 is similar to that of the example shown in FIG. 24, description is omitted.

Figure 42A:
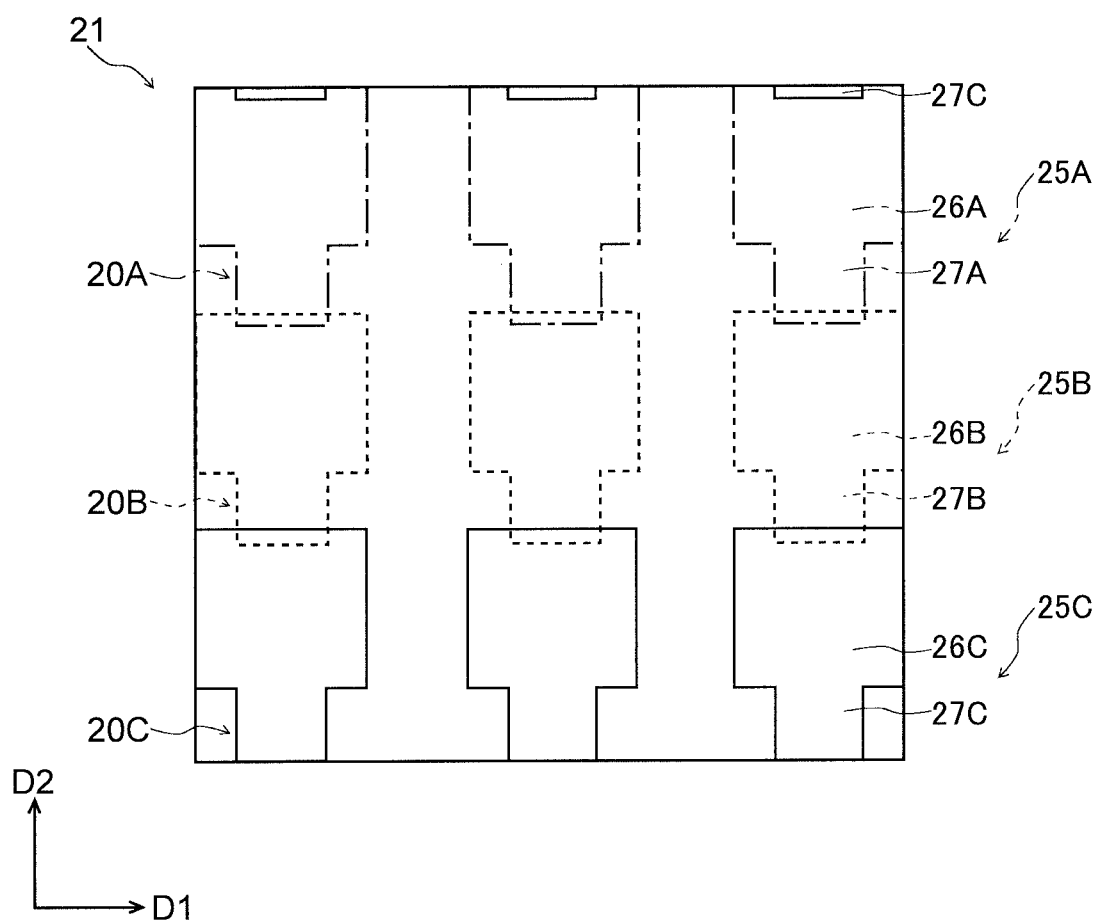
FIG. 42A is a view showing a state in which the first deposition mask, the second deposition mask and the third deposition mask are overlapped.
Figure 42B:
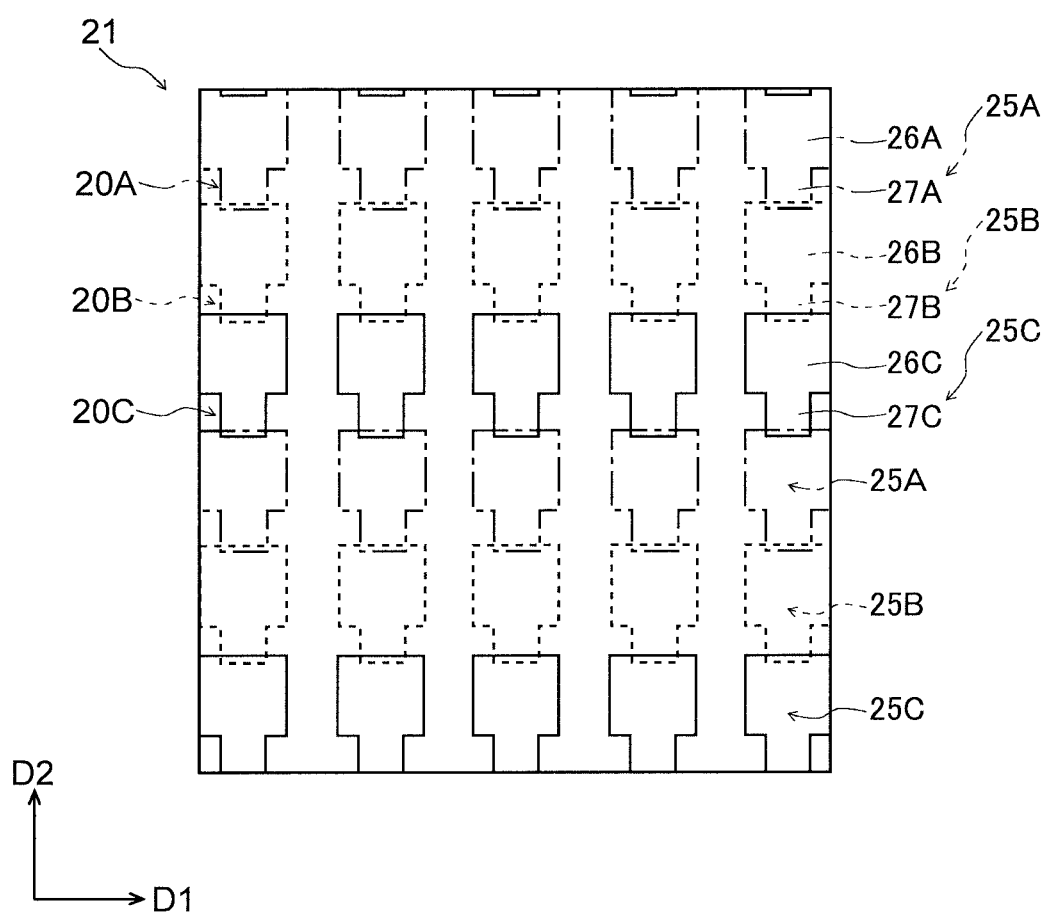
FIG. 42B is a view showing a state in which the first deposition mask, the second deposition mask and the third deposition mask are overlapped.

FIG. 42A is a view showing the laminate 21 obtained by overlapping the first deposition mask 20A shown in FIG. 39, the second deposition mask 20B shown in FIG. 40 and the third deposition mask 20C shown in FIG. 41. FIG. 42B is a view showing the laminate 21 shown in FIG. 42A in a wider range. Also in the embodiment shown in FIGS. 36 to 42B, when the first deposition mask 20A, the second deposition mask 20B and the third deposition mask 20C are overlapped, the first through hole 25A of the first deposition mask 20A partly overlaps the second through hole 25B of the second deposition mask 20B or the third through hole 25C of the third deposition mask 25C. Thus, the first layer 140A can be electrically connected to the second layer 140B or the third layer 140C, whereby it is easy to stably control an electric potential of the second electrode 140. The first layer 140A can partly overlap the second layer 140B or the third layer 140C. Thus, an electric resistance of the second electrode 140 in the in-plane direction of the substrate 91 can be reduced.

The overlap of the first through hole 25A of the first deposition mask 20A, the second through hole 25B of the second deposition mask 20B and the third through hole 25C of the third deposition mask 20C is described in detail. As shown in FIG. 42A, when the first deposition mask 20A, the second deposition mask 20B and the third deposition mask 20C are overlapped, the mask first extension area 27A of the first deposition mask 20A may extend from the mask first main area 26A to partly overlap the mask second main area 26B of the second deposition mask 20B. Thus, the electrode first extension area 142A of the first layer 140A, which is formed correspondingly to the mask first extension area 27A, can partly overlap the electrode second main area 141B of the second layer 140B, which is formed correspondingly to the mask second main area 26B. The mask second extension area 27B of the second deposition mask 20B may extend from the mask second main area 26B to partly overlap the mask third main area 26C of the third deposition mask 20C. Thus, the electrode second extension area 142B of the second layer 140B can partly overlap the electrode third main area 141C of the third layer 140C. The mask third extension area 27C of the third deposition mask 20C may extend from the mask third main area 26C to partly overlap the mask first main area 26A of the first deposition mask 20A. Thus, the electrode third extension area 142C of the third layer 140C can partly overlap the electrode first main area 141A of the first layer 140A.

Next, another example of using the deposition mask group to form the second electrode 140 of the electronic device 100 is described with reference to FIGS. 43 to 48B. In the embodiment shown in FIGS. 43 to 48B, a part that can be similarly constituted to the embodiment shown in FIGS. 36 to 42B has the same reference numeral as that of corresponding part the embodiment shown in FIGS. 36 to 42B, and overlapped description is omitted.

Figure 43:
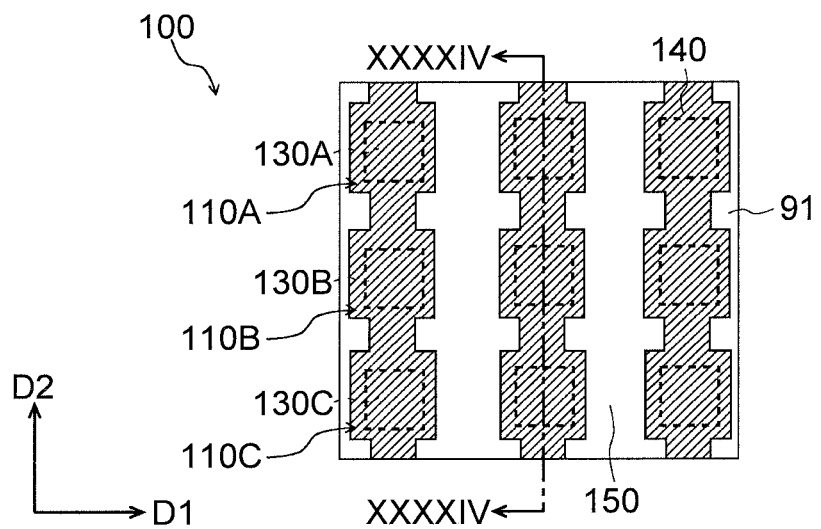
FIG. 43 is a plan view showing an example of the substrate with the second electrode being formed on the first energizing layer, the second energizing layer and the third energizing layer.
Figure 44:
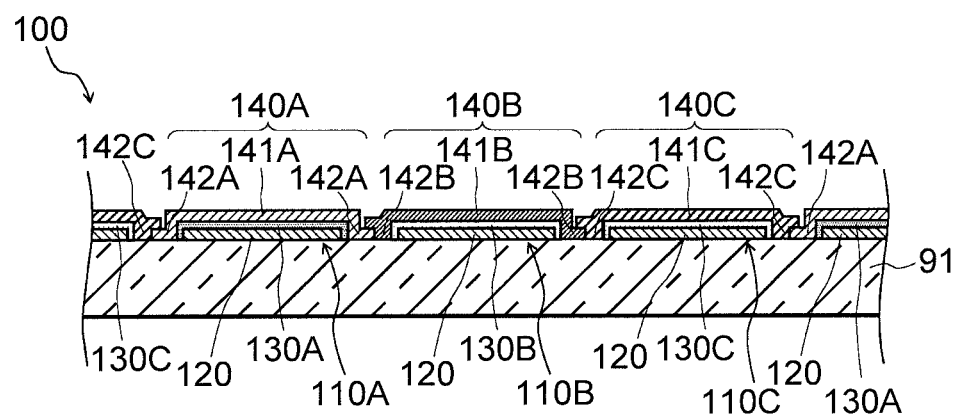
FIG. 44 is a sectional view along a line XXXXIV-XXXXIV line of the electronic device shown in FIG. 43.

FIG. 43 is a plan view showing the substrate 91 with the second electrode 140 being formed on the first energizing layers 130A, the second energizing layers 130B and the third energizing layers 130C shown in FIG. 36. FIG. 44 is a sectional view along a XXXXIV-XXXXIV line of the electronic device 100 shown in FIG. 43. As shown in FIG. 43, the electronic device 100 includes the electrode-free area 150 free of the second electrode 140.

As shown in FIG. 44, the first layer 140A may include an electrode first extension area 142A extending in the second direction D2 toward the second layer 140B from the electrode first main area 141A, and an electrode first extension area 142A extending in the second direction D2 toward the third layer 140C from the electrode first main area 141A. The second layer 140B may include an electrode second extension area 142B extending in the second direction D2 toward the first layer 140A from the electrode second main area 141B, and an electrode second extension area 142B extending in the second direction D2 toward the third layer 140C from the electrode second main area 141B. The third layer 140C may include an electrode third extension area 142C extending in the second direction D2 toward the first layer 140A from the electrode third main area 141C, and an electrode third extension area 142C extending in the second direction D2 toward the second layer 140B from the electrode third main area 141C.

Next, the first deposition mask 20A, the second deposition mask 20B and the third deposition mask 20C used for forming the first layer 140A, the second layer 140B and the third layer 140C of the second electrode 140 shown in FIGS. 43 and 44 are described.

Figure 45:
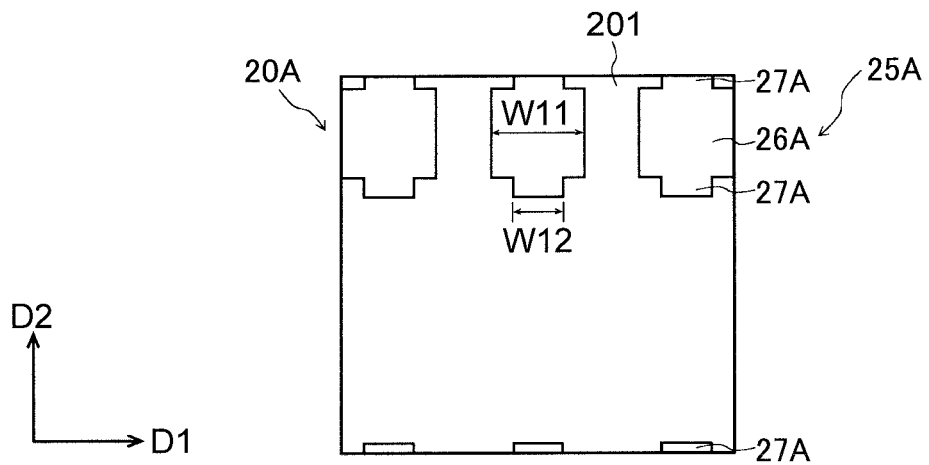
FIG. 45 is a plan view showing an example of the first deposition mask.

FIG. 45 is a plan view showing the first deposition mask 20A seen from the first surface 201 side. As shown in FIG. 45, the first through hole 25A may include the mask first extension area 27A extending to one side of the second direction D2 from the mask first main area 26A, and the mask first extension area 27A extending to the other side of the second direction D2 from the mask first main area 26A.

The dimension W12 of the mask first extension area 27A may be smaller than the dimension W11 of the mask first main area 26A in a direction orthogonal to the second direction D2 in which the mask first extension area 27A extends from the mask first main area 26A. Since a relationship between the dimension W12 and the dimension W11 is similar to that of the example shown in FIG. 22, description is omitted.

Figure 46:
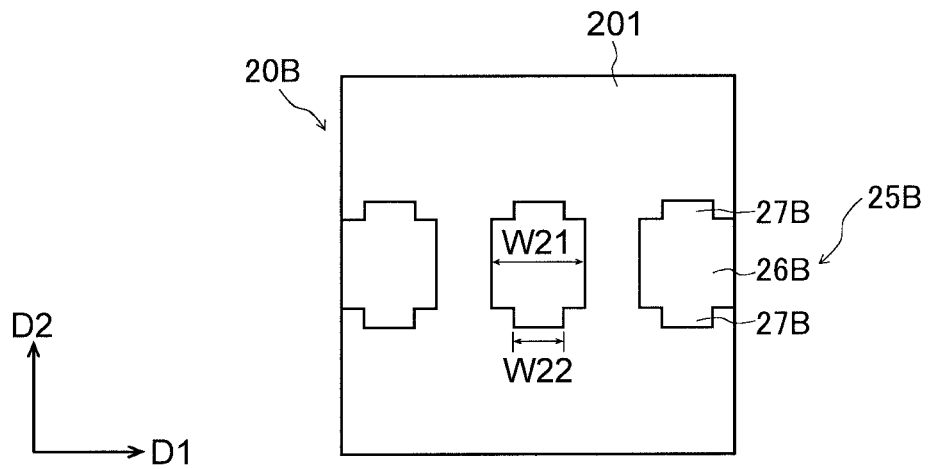
FIG. 46 is a plan view showing an example of the second deposition mask.

FIG. 46 is a plan view showing the second deposition mask 20B seen from the first surface 201 side. As shown in FIG. 46, the second through hole 25B may include the mask second extension area 27B extending to one side of the second direction D2 from the mask second main area 26B, and the mask second extension area 27B extending to the other side of the second direction D2 from the mask second main area 26B.

The dimension W22 of the mask second extension area 27B may be smaller than the dimension W21 of the mask second main area 26B in a direction orthogonal to the second direction D2 in which the mask second extension area 27B extends from the mask second main area 26B. Since a relationship between the dimension W22 and the dimension W21 is similar to that of the example shown in FIG. 23, description is omitted.

Figure 47:
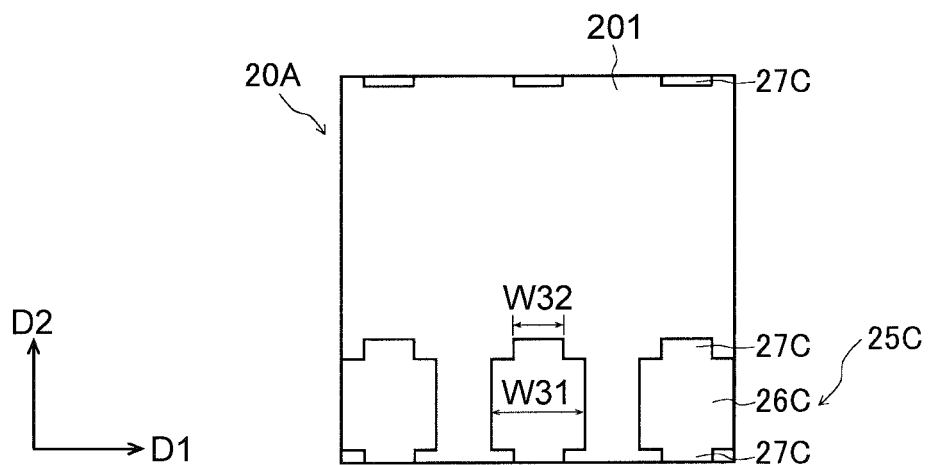
FIG. 47 is a plan view showing an example of the third deposition mask.

FIG. 47 is a plan view showing the third deposition mask 20C seen from the first surface 201 side. As shown in FIG. 47, the third through hole 25C may include the mask third extension area 27C extending to one side of the second direction D2 from the mask third main area 26C, and the mask third extension area 27C extending to the other side of the second direction D2 from the mask third main area 26C.

The dimension W32 of the mask third extension area 27C may be smaller than the dimension W31 of the mask third main area 26C in a direction orthogonal to the second direction D2 in which the mask third extension area 27C extends from the mask third main area 26C. Since a relationship between the dimension W32 and the dimension W31 is similar to that of the example shown in FIG. 24, description is omitted.

Figure 48A:
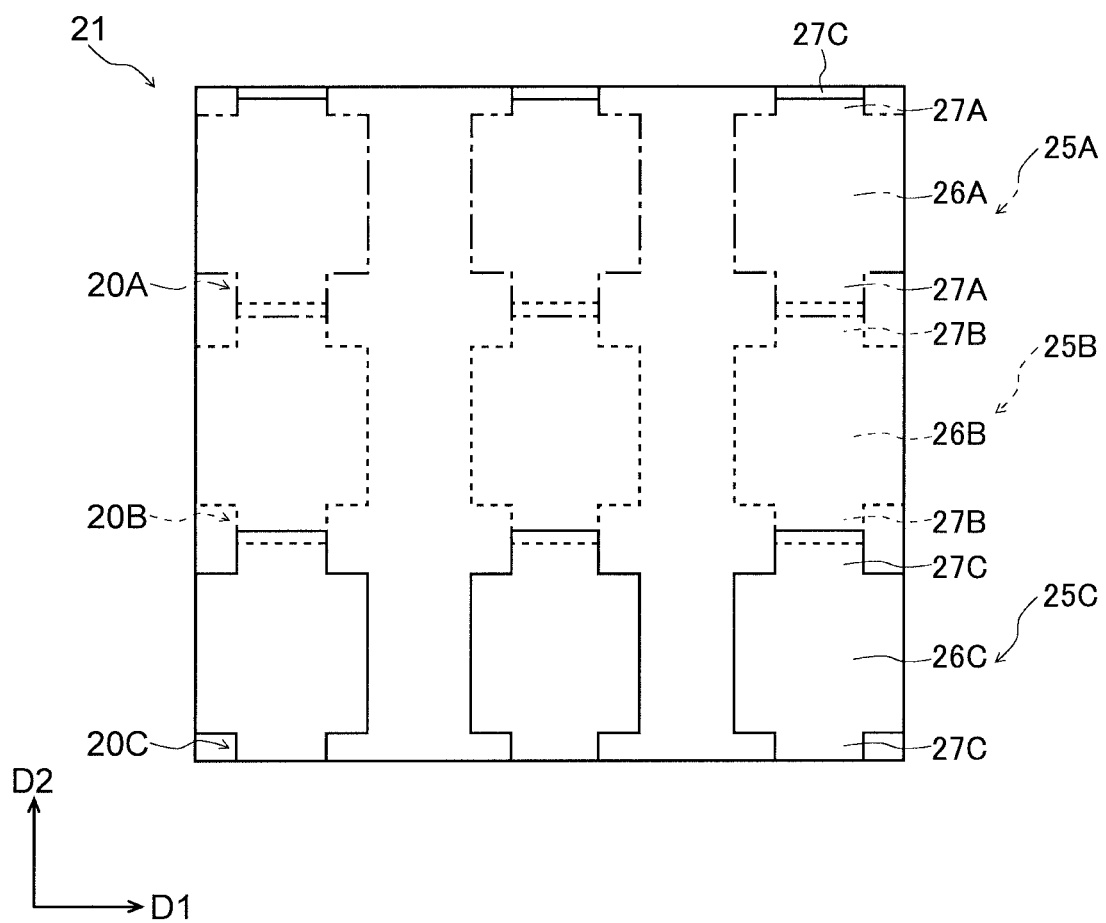
FIG. 48A is a view showing a state in which the first deposition mask, the second deposition mask and the third deposition mask are overlapped.
Figure 48B:
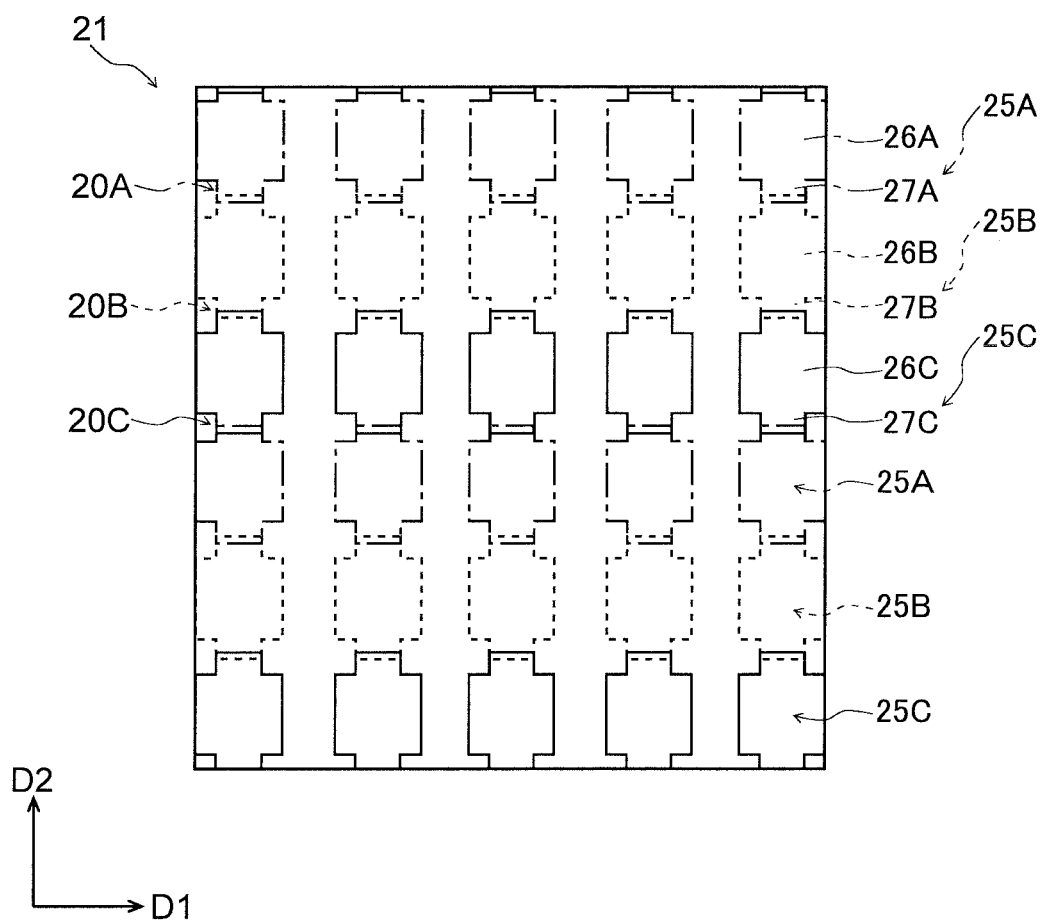
FIG. 48B is a view showing a state in which the first deposition mask, the second deposition mask and the third deposition mask are overlapped.

FIG. 48A is a view showing the laminate 21 obtained by overlapping the first deposition mask 20A shown in FIG. 45, the second deposition mask 20B shown in FIG. 46 and the third deposition mask 20C shown in FIG. 47. FIG. 48B is a view showing the laminate 21 shown in FIG. 48A in a wider range. Also in the embodiment shown in FIGS. 43 to 48B, when the first deposition mask 20A, the second deposition mask 20B and the third deposition mask 20C are overlapped, the first through hole 25A of the first deposition mask 20A partly overlaps the second through hole 25B of the second deposition mask 20B or the third through hole 25C of the third deposition mask 25C. Thus, the first layer 140A can be electrically connected to the second layer 140B or the third layer 140C, whereby it is easy to stably control an electric potential of the second electrode 140. The first layer 140A can partly overlap the second layer 140B or the third layer 140C. Thus, an electric resistance of the second electrode 140 in the in-plane direction of the substrate 91 can be reduced.

The overlap of the first through hole 25A of the first deposition mask 20A, the second through hole 25B of the second deposition mask 20B and the third through hole 25C of the third deposition mask 20C is described in detail. As shown in FIG. 48A, when the first deposition mask 20A, the second deposition mask 20B and the third deposition mask 20C are overlapped, the mask first extension area 27A extending from one side of the mask first main area 26A in the second direction D2 may overlap the mask second extension area 27B extending from the other side of the mask second main area 26B in the second direction D2. Thus, the electrode first extension area 142A extending from one side of the electrode first main area 141A in the second direction D2 can overlap the electrode second extension area 142B extending from the other side of the electrode second main area 141B in the second direction D2. The mask first extension area 27A extending from the other side of the mask first main area 26A in the second direction D2 may overlap the mask third extension area 27C extending from one side of the mask third main area 26C in the second direction D2. Thus, the electrode first extension area 142A extending from the other side of the electrode first main area 141A in the second direction D2 can overlap the electrode third extension area 142C extending from one side of the electrode third main area 141C in the second direction D2. The mask second extension area 27B extending from one side of the mask second main area 26B in the second direction D2 may overlap the mask third extension area 27C extending from the other side of the mask third main area 26C in the second direction D2. Thus, the electrode second extension area 142B extending from one side of the electrode second main area 141B in the second direction D2 can overlap the electrode third extension area 142C extending from the other side of the electrode third main area 141C in the second direction D2.

Next, another example of using the deposition mask group to form the second electrode 140 of the electronic device 100 is described with reference to FIGS. 49 to 54B. In the embodiment shown in FIGS. 49 to 54B, a part that can be similarly constituted to the embodiment shown in FIGS. 36 to 42B has the same reference numeral as that of corresponding part the embodiment shown in FIGS. 36 to 42B, and overlapped description is omitted.

Figure 49:
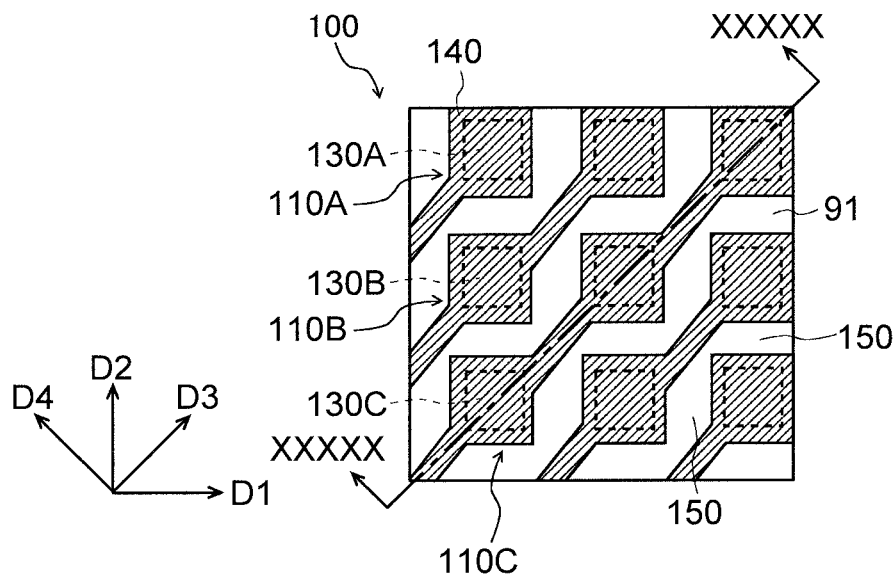
FIG. 49 is a plan view showing an example of the substrate with the second electrode being formed on the first energizing layer, the second energizing layer and the third energizing layer.
Figure 50:
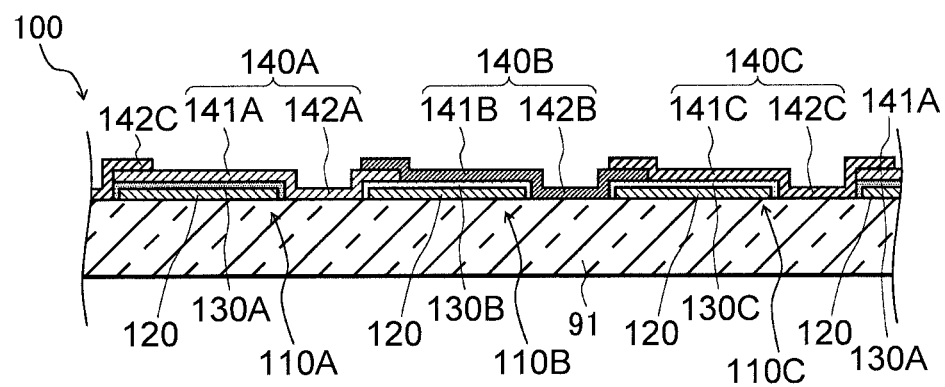
FIG. 50 is a sectional view along a line XXXXX-XXXXX line of the electronic device shown in FIG. 49.

FIG. 49 is a plan view showing the substrate 91 with the second electrode 140 being formed on the first energizing layers 130A, the second energizing layers 130B and the third energizing layers 130C shown in FIG. 36. FIG. 50 is a sectional view along a XXXXX-XXXXX line of the electronic device 100 shown in FIG. 49, the XXXXX-XXXXX line extending in the third direction D3. As shown in FIG. 49, the electronic device 100 includes the electrode-free area 150 free of the second electrode 140.

As shown in FIG. 50, the first layer 140A may include the electrode first extension area 142A extending in the third direction D3 intersecting the first direction D1 and the second direction D2 toward the electrode second main area 141B of the second layer 140B from the electrode first main area 141A. The second layer 140B may include the electrode second extension area 142B extending in the third direction D3 toward the electrode third main area 141C of the third layer 140C from the electrode second main area 141B. The third layer 140C may include the electrode third extension area 142C extending in the third direction D3 toward the electrode first main area 141A of the first layer 140A from the electrode third main area 141C. The third direction D3 may be a direction forming 45° with respect to the first direction D1 and the second direction D2.

Next, the first deposition mask 20A, the second deposition mask 20B and the third deposition mask 20C used for forming the first layer 140A, the second layer 140B and the third layer 140C of the second electrode 140 shown in FIGS. 49 and 50 are described.

Figure 51:
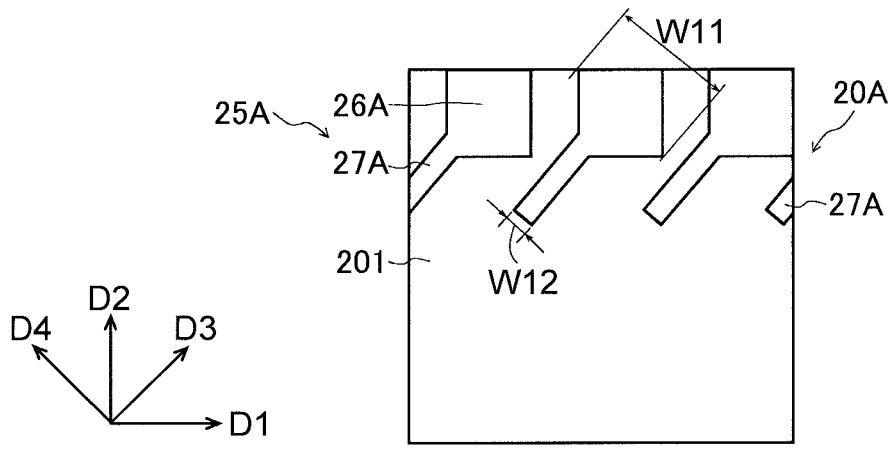
FIG. 51 is a plan view showing an example of the first deposition mask.

FIG. 51 is a plan view showing the first deposition mask 20A seen from the first surface 201 side. As shown in FIG. 51, the first through hole 25A may include the mask first extension area 27A extending in the third direction D3 from the mask first main area 26A. The dimension W12 of the mask first extension area 27A may be smaller than the dimension W11 of the mask first main area 26A in a direction orthogonal to the third direction D3 in which the mask first extension area 27A extends from the mask first main area 26A. Since a relationship between the dimension W12 and the dimension W11 is similar to that of the example shown in FIG. 22, description is omitted.

Figure 52:
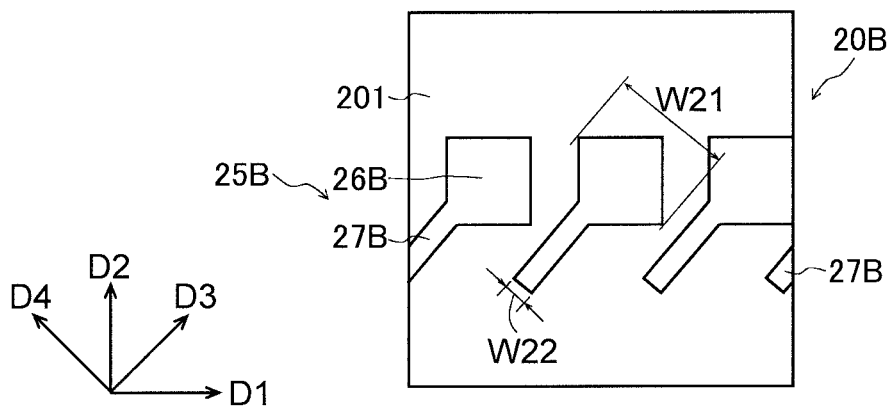
FIG. 52 is a plan view showing an example of the second deposition mask.

FIG. 52 is a plan view showing the second deposition mask 20B seen from the first surface 201 side. As shown in FIG. 52, the second through hole 25B may include the mask second extension area 27B extending in the third direction D3 from the mask second main area 26B. The dimension W22 of the mask second extension area 27B may be smaller than the dimension W21 of the mask second main area 26B in a direction orthogonal to the third direction D3 in which the mask second extension area 27B extends from the mask second main area 26B. Since a relationship between the dimension W22 and the dimension W21 is similar to that of the example shown in FIG. 23, description is omitted.

Figure 53:
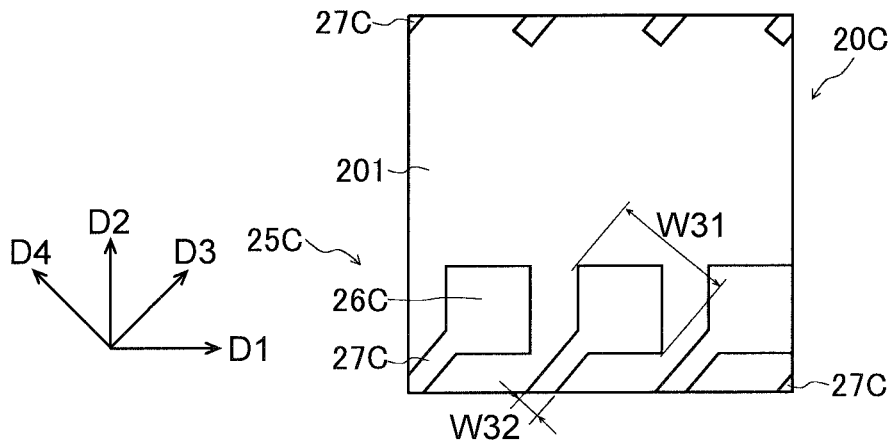
FIG. 53 is a plan view showing an example of the third deposition mask.

FIG. 53 is a plan view showing the third deposition mask 20C seen from the first surface 201 side. As shown in FIG. 53, the third through hole 25C may include the mask third extension area 27C extending in the third direction D3 from the mask third main area 26C. The dimension W32 of the mask third extension area 27C may be smaller than the dimension W31 of the mask third main area 26C in a direction orthogonal to the third direction D3 in which the mask third extension area 27C extends from the mask third main area 26C. Since a relationship between the dimension W32 and the dimension W31 is similar to that of the example shown in FIG. 24, description is omitted.

Figure 54A:
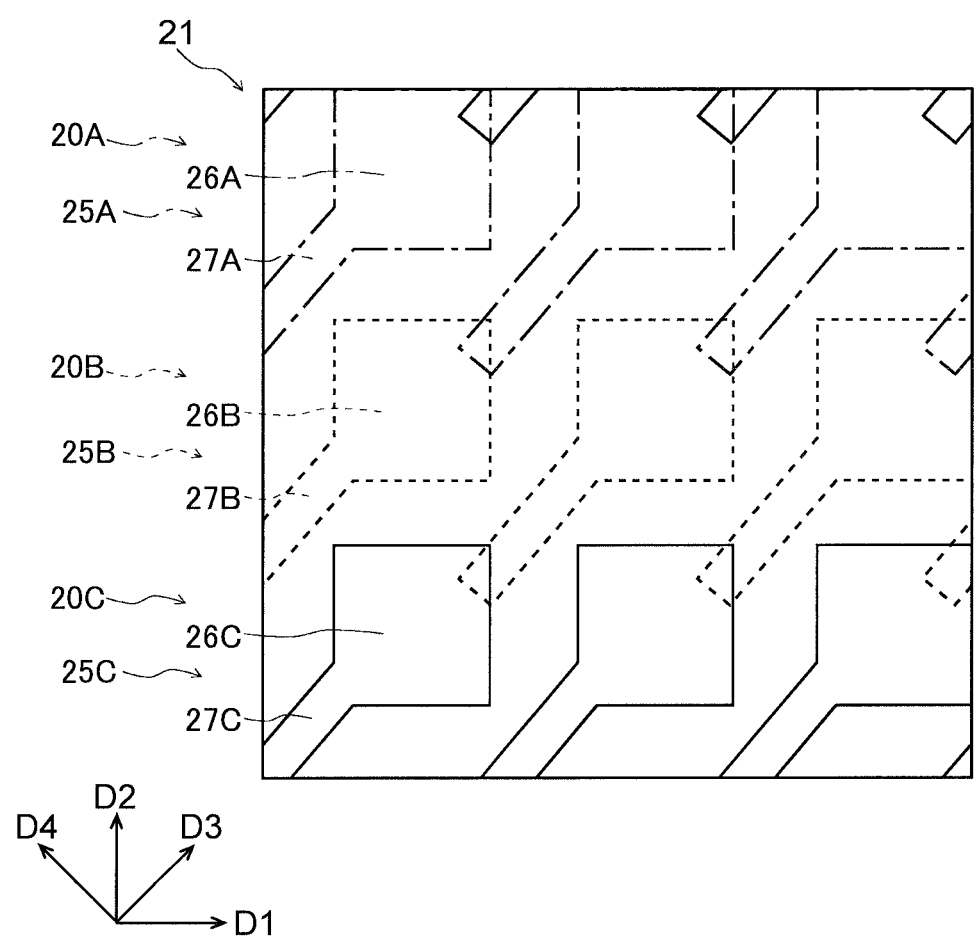
FIG. 54A is a view showing a state in which the first deposition mask, the second deposition mask and the third deposition mask are overlapped.
Figure 54B:
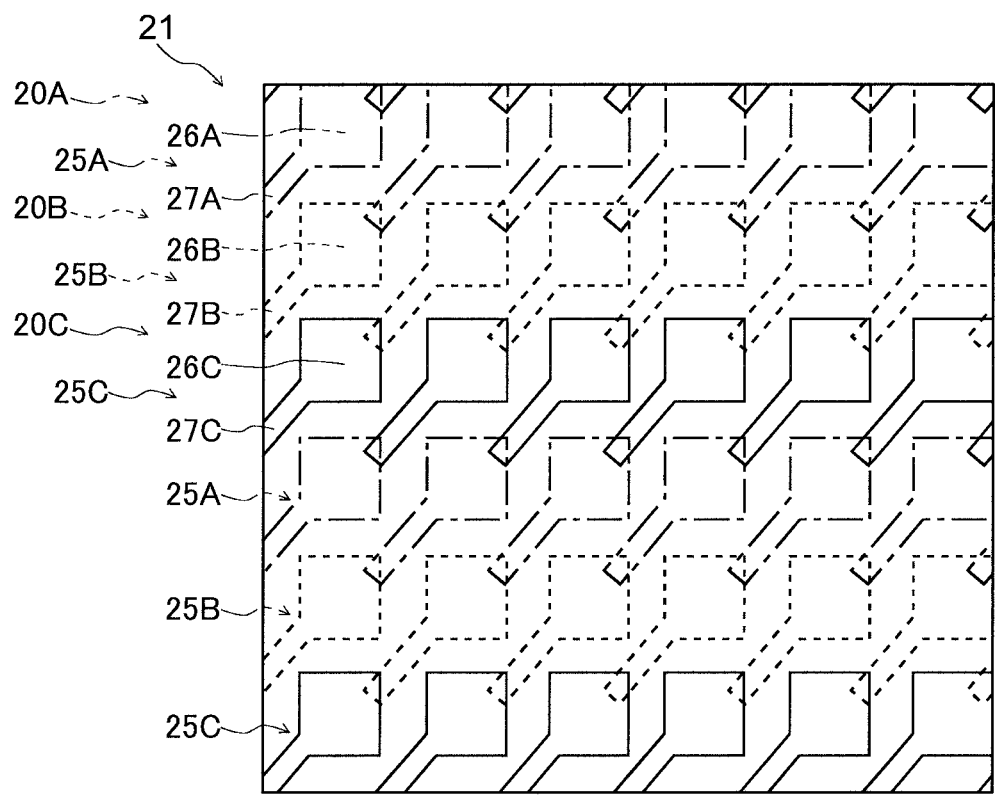
FIG. 54B is a view showing a state in which the first deposition mask, the second deposition mask and the third deposition mask are overlapped.
Figure 54B:
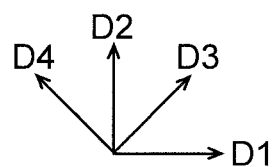

FIG. 54A is a view showing the laminate 21 obtained by overlapping the first deposition mask 20A shown in FIG. 51, the second deposition mask 20B shown in FIG. 52 and the third deposition mask 20C shown in FIG. 53. FIG. 54B is a view showing the laminate 21 shown in FIG. 54A in a wider range. Also in the embodiment shown in FIGS. 49 to 54B, when the first deposition mask 20A, the second deposition mask 20B and the third deposition mask 20C are overlapped, the first through hole 25A of the first deposition mask 20A partly overlaps the second through hole 25B of the second deposition mask 20B or the third through hole 25C of the third deposition mask 25C. Thus, the first layer 140A can be electrically connected to the second layer 140B or the third layer 140C, whereby it is easy to stably control an electric potential of the second electrode 140. The first layer 140A can partly overlap the second layer 140B or the third layer 140C. Thus, an electric resistance of the second electrode 140 in the in-plane direction of the substrate 91 can be reduced.

The overlap of the first through hole 25A of the first deposition mask 20A, the second through hole 25B of the second deposition mask 20B and the third through hole 25C of the third deposition mask 20C is described in detail. As shown in FIG. 54A, when the first deposition mask 20A, the second deposition mask 20B and the third deposition mask 20C are overlapped, the mask first extension area 27A of the first deposition mask 20A may extend from the mask first main area 26A in the third direction D3 to partly overlap the mask second main area 26B of the second deposition mask 20B. Thus, the electrode first extension area 142A of the first layer 140A can partly overlap the electrode second main area 141B of the second layer 140B. The mask second extension area 27B of the second deposition mask 20B may extend from the mask second main area 26B in the third direction D3 to partly overlap the mask third main area 26C of the third deposition mask 20C. Thus, the electrode second extension area 142B of the second layer 140B can partly overlap the electrode third main area 141C of the third layer 140C. The mask third extension area 27C of the third deposition mask 20C may extend from the mask third main area 26C in the third direction D3 to partly overlap the mask first main area 26A of the first deposition mask 20A. Thus, the electrode third extension area 142C of the third layer 140C can partly overlap the electrode first main area 141A of the first layer 140A.

Next, another example of using the deposition mask group to form the second electrode 140 of the electronic device 100 is described with reference to FIGS. 55 to 60. In the embodiment shown in FIGS. 55 to 60, a part that can be similarly constituted to the embodiment shown in FIGS. 17 to 25 has the same reference numeral as that of corresponding part the embodiment shown in FIGS. 17 to 25, and overlapped description is omitted.

Figure 55:
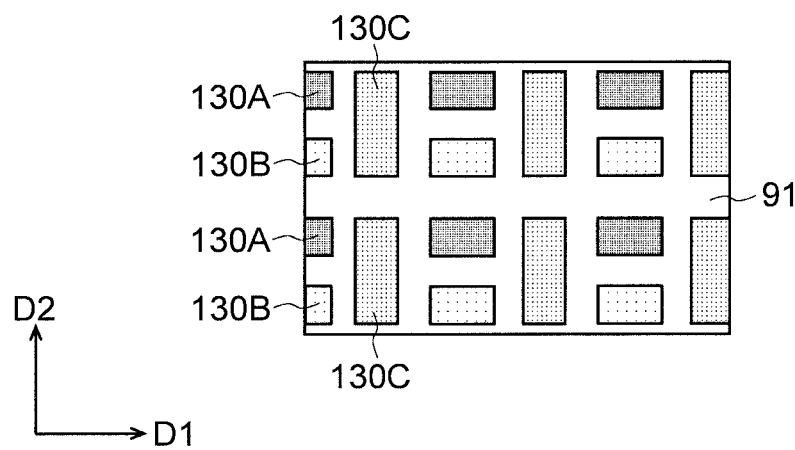
FIG. 55 is a plan view showing an example of the substrate on which the first energizing layer, the second energizing layer and the third energizing are formed.

FIG. 55 is a partial enlarged view showing the substrate 91 on which the first energizing layers 130A, the second energizing layers 130B and the third energizing layers 130C are formed. In the example shown in FIG. 55, the first energizing layers 130A, the second energizing layers 130B and the third energizing layers 130C are respectively arranged along the first direction D1 and the second direction D2. The first energizing layers 130A and the second energizing layers 130B are alternately arranged in the second direction D2. Lines in which the first energizing layers 130A and the second energizing layers 130B are alternately arranged in the second direction D2 are arranged in the first direction D1. The third energizing layers 130C are arranged in the second direction D2 between the two first energizing layers 130A adjacent to each other in the first direction D1, and between the two second energizing layers 130B adjacent to each other in the first direction D1. The third energizing layer 130C may extend in the second direction D2 such that one third energizing layer 130C overlaps the first energizing layer 130A and the second energizing layer 130B when seen along the first direction D1.

Figure 56:
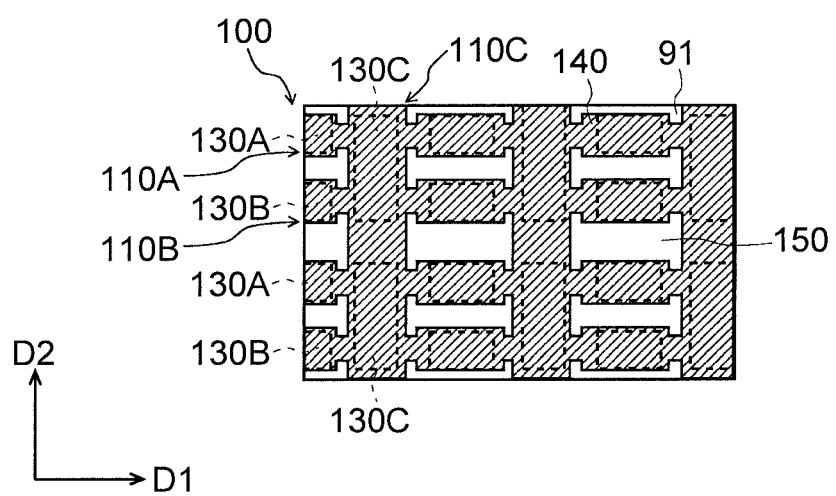
FIG. 56 is a plan view showing an example of the substrate with the second electrode being formed on the first energizing layer, the second energizing layer and the third energizing layer.

FIG. 56 is a plan view showing the substrate 91 with the second electrode 140 being formed on the first energizing layers 130A, the second energizing layers 130B and the third energizing layers 130C shown in FIG. 55. The electronic device 100 includes the electrode-free area 150 free of the second electrode 140.

Next, the first deposition mask 20A, the second deposition mask 20B and the third deposition mask 20C used for forming the first layer 140A, the second layer 140B and the third layer 140C of the second electrode 140 shown in FIG. 56 are described.

Figure 57:
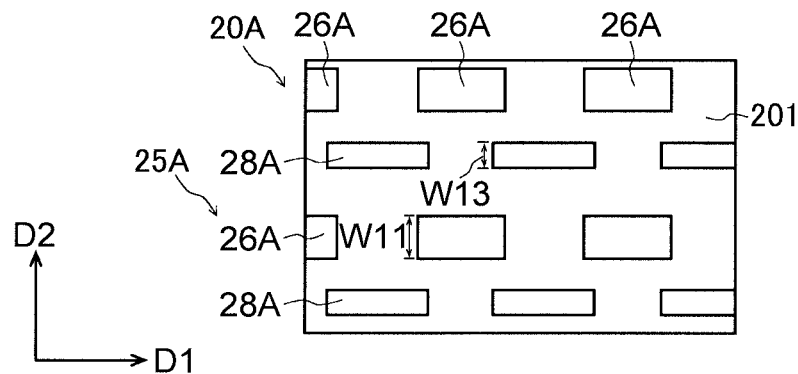
FIG. 57 is a plan view showing an example of the first deposition mask.

FIG. 57 is a plan view showing the first deposition mask 20A seen from the first surface 201 side. As shown in FIG. 57, the first deposition mask 20A may include a plurality of the mask first main areas 26A arranged along the first direction D1 and the second direction D2 and a plurality of the mask first auxiliary areas 28A arranged along the first direction D1 and the second direction D2. The mask first auxiliary area 28A has the dimension W13 smaller than the dimension W11 of the mask first main area 26A in the second direction D2 orthogonal to the first direction D1 in which the mask first auxiliary area 28A extends. Since a relationship between the dimension W13 and the dimension W11 is similar to that of the example shown in FIG. 22, description is omitted. The mask first auxiliary area 28A may not be connected to the mask first main area 26A.

Figure 58:
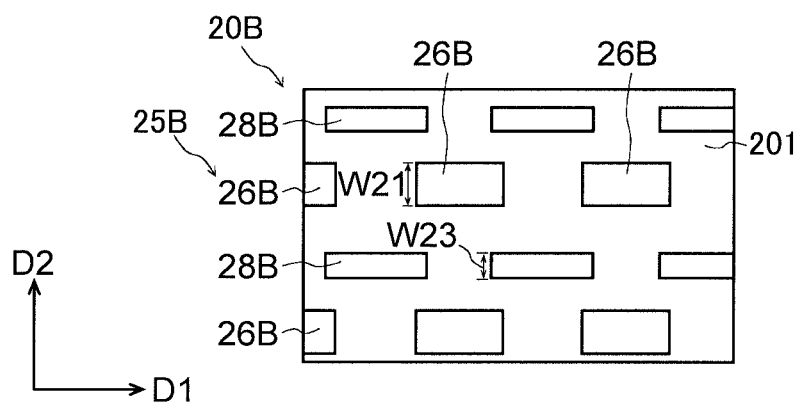
FIG. 58 is a plan view showing an example of the second deposition mask.

FIG. 58 is a plan view showing the second deposition mask 20B seen from the first surface 201 side. As shown in FIG. 58, the second deposition mask 20B may include a plurality of the mask second main areas 26B arranged along the first direction D1 and the second direction D2 and a plurality of the mask second auxiliary areas 28B arranged along the first direction D1 and the second direction D2. The mask second auxiliary area 28B has the dimension W23 smaller than the dimension W21 of the mask second main area 26B in the second direction D2 orthogonal to the first direction D1 in which the mask second auxiliary area 28B extends. Since a relationship between the dimension W23 and the dimension W21 is similar to that of the example shown in FIG. 23, description is omitted. The mask second auxiliary area 28B may not be connected to the mask second main area 26B.

Figure 59:
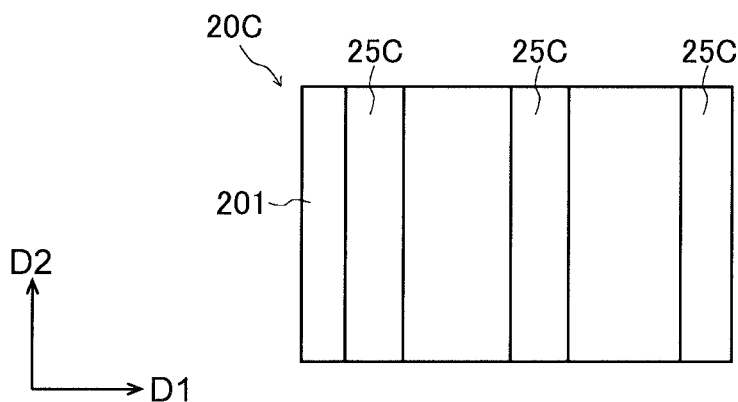
FIG. 59 is a plan view showing an example of the third deposition mask.

FIG. 59 is a plan view showing the third deposition mask 20C seen from the first surface 201 side. As shown in FIG. 59, the third deposition mask 20C may include a plurality of the third through holes 25C arranged in the first direction D1 and extending in the second direction D2.

Figure 60:
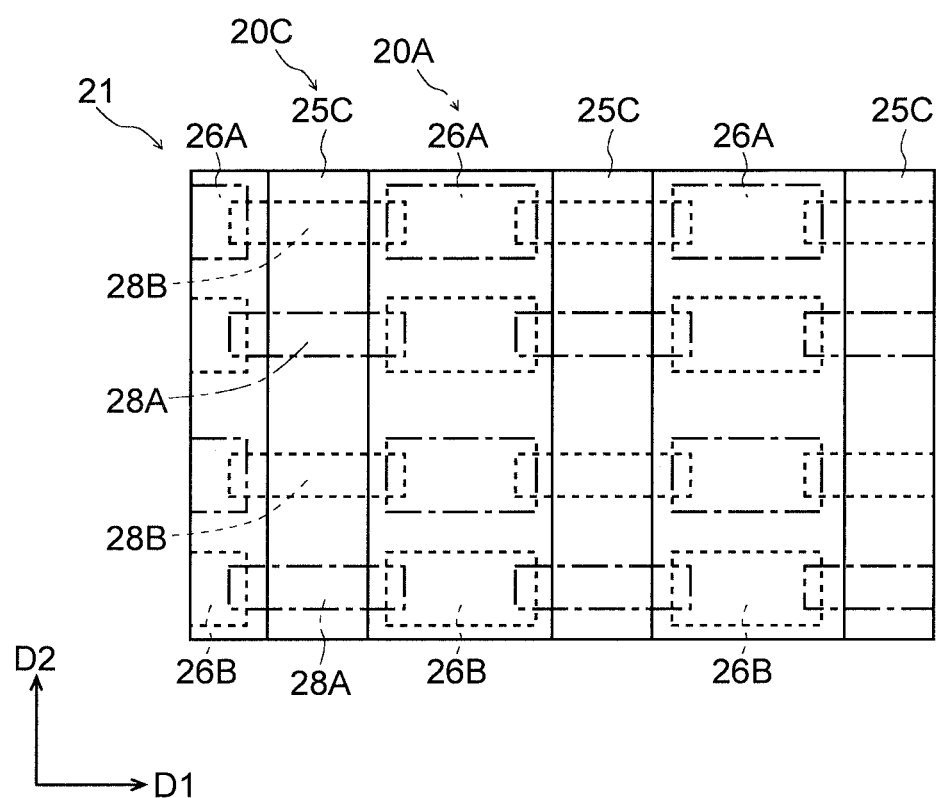
FIG. 60 is a view showing a state in which the first deposition mask, the second deposition mask and the third deposition mask are overlapped.

FIG. 60 is a view showing the laminate 21 obtained by overlapping the first deposition mask 20A shown in FIG. 57, the second deposition mask 20B shown in FIG. 58 and the third deposition mask 20C shown in FIG. 59. Also in the embodiment shown in FIGS. 55 to 60, when the first deposition mask 20A, the second deposition mask 20B and the third deposition mask 20C are overlapped, the first through hole 25A of the first deposition mask 20A partly overlaps the second through hole 25B of the second deposition mask 20B or the third through hole 25C of the third deposition mask 25C. Thus, the first layer 140A can be electrically connected to the second layer 140B or the third layer 140C, whereby it is easy to stably control an electric potential of the second electrode 140. The first layer 140A can partly overlap the second layer 140B or the third layer 140C. Thus, an electric resistance of the second electrode 140 in the in-plane direction of the substrate 91 can be reduced.

The overlap of the first through hole 25A of the first deposition mask 20A, the second through hole 25B of the second deposition mask 20B and the third through hole 25C of the third deposition mask 20C is described in detail. As shown in FIG. 60, when the first deposition mask 20A, the second deposition mask 20B and the third deposition mask 20C are overlapped, the mask first auxiliary area 28A of the first deposition mask 20A may extend between the two mask second main areas 26B adjacent to each other in the first direction D1 to partly overlap the two mask second main areas 26B. Thus, the electrode first auxiliary area 143A of the first layer 140A can partly overlap the two electrode second main areas 141B adjacent to each other in the first direction D1. The mask second auxiliary area 28B of the second deposition mask 20B may extend between the two mask first main areas 26A adjacent to each other in the first direction D1 to partly overlap the two mask first main areas 26A. Thus, the electrode second auxiliary area 143B of the second layer 140B can partly overlap the two electrode first main areas 141A adjacent to each other in the first direction D1.

As shown in FIG. 60, the third through hole 25C of the third deposition mask 20C may extend in the second direction D2 to overlap the mask first auxiliary areas 28A and the mask second auxiliary areas 28B alternately arranged in the second direction D2. Thus, the third layer 140C can overlap the electrode first auxiliary areas 143A and the electrode second auxiliary areas 143B alternately arranged in the second direction D2.

Next, another example of using the deposition mask group to form the second electrode 140 of the electronic device 100 is described with reference to FIGS. 61 to 66. In the embodiment shown in FIGS. 61 to 66, a part that can be similarly constituted to the embodiment shown in FIGS. 17 to 25 has the same reference numeral as that of corresponding part the embodiment shown in FIGS. 17 to 25, and overlapped description is omitted.

Figure 61:
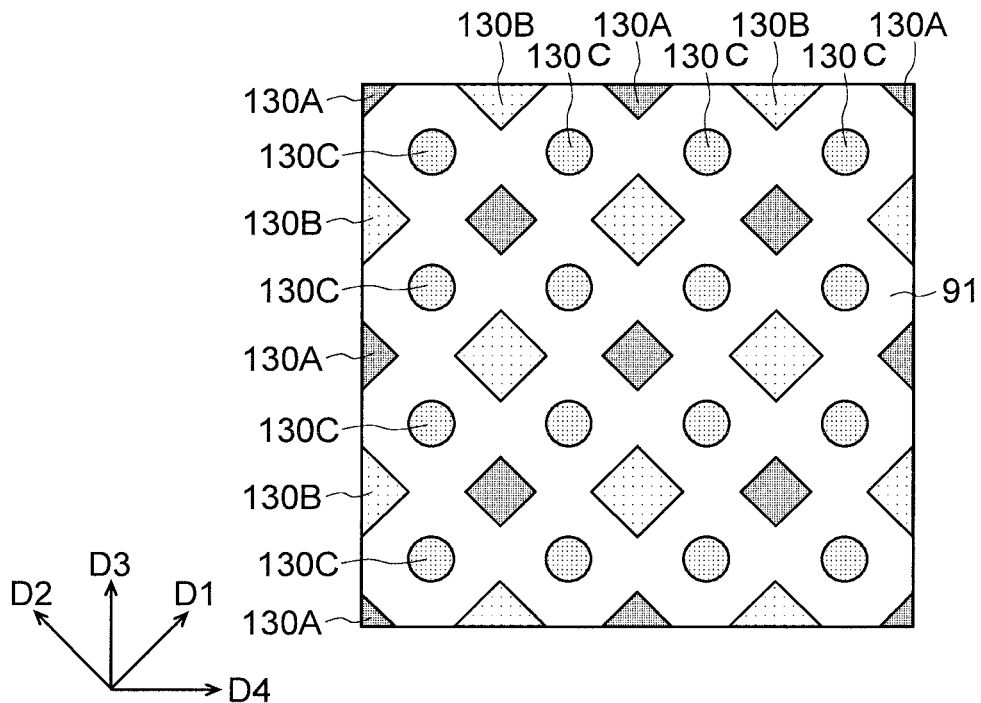
FIG. 61 is a plan view showing an example of the substrate on which the first energizing layer, the second energizing layer and the third energizing are formed.

FIG. 61 is a partial enlarged view showing the substrate 91 on which the first energizing layers 130A, the second energizing layers 130B and the third energizing layers 130C are formed. In the example shown in FIG. 61, the first energizing layers 130A, the second energizing layers 130B and the third energizing layers 130C are arranged respectively along the first direction D1 and the second direction D2. A position of the first energizing layer 130A in the first direction D1 is displaced from the second energizing layer 130B by half a distance of an arrangement cycle of the first energizing layers 130A in the first direction D1. A position of the first energizing layer 130A in the second direction D2 is displaced from the second energizing layer 130B by half a distance of the arrangement cycle of the first energizing layers 130A in the second direction D2. The third energizing layer 130C is located between the two first energizing layers 130A adjacent to each other in the first direction D1, between the two first energizing layers 130A adjacent to each other in the second direction D2, between the two second energizing layers 130B adjacent to each other in the first direction D1 and between the two second energizing layers 130B adjacent to each other in the second direction D2.

Figure 62:
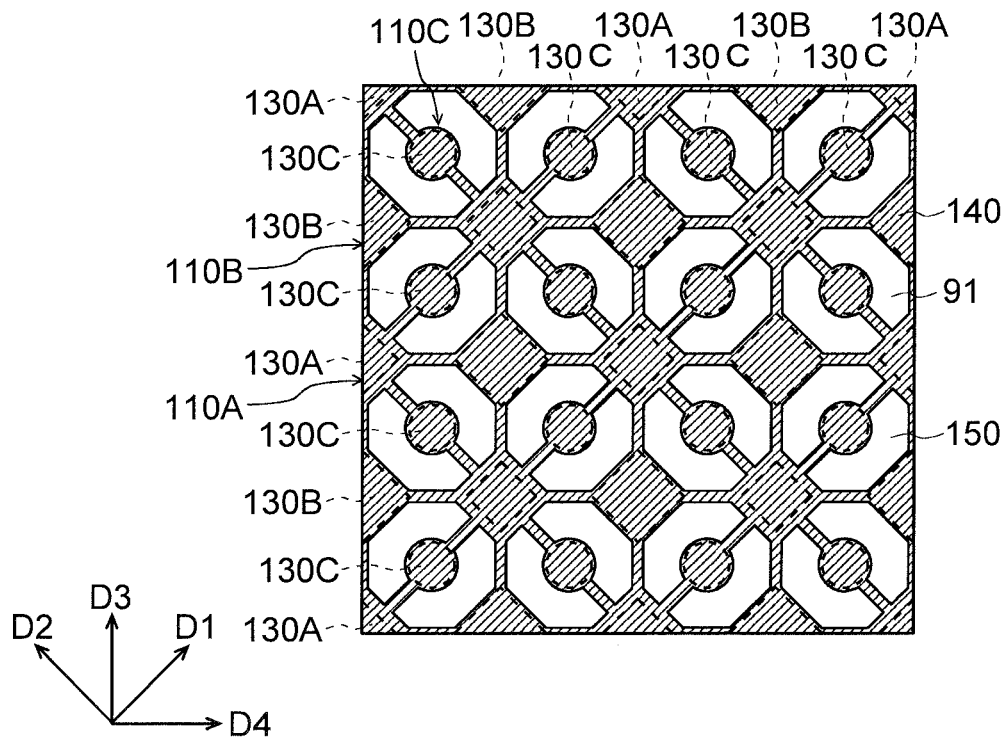
FIG. 62 is a plan view showing an example of the substrate with the second electrode being formed on the first energizing layer, the second energizing layer and the third energizing layer.

FIG. 62 is a plan view showing the substrate 91 with the second electrode 140 being formed on the first energizing layers 130A, the second energizing layers 130B and the third energizing layers 130C shown in FIG. 61. The electronic device 100 includes the electrode-free area 150 free of the second electrode 140.

Next, the first deposition mask 20A, the second deposition mask 20B and the third deposition mask 20C used for forming the first layer 140A, the second layer 140B and the third layer 140C of the second electrode 140 shown in FIG. 62 are described.

Figure 63:
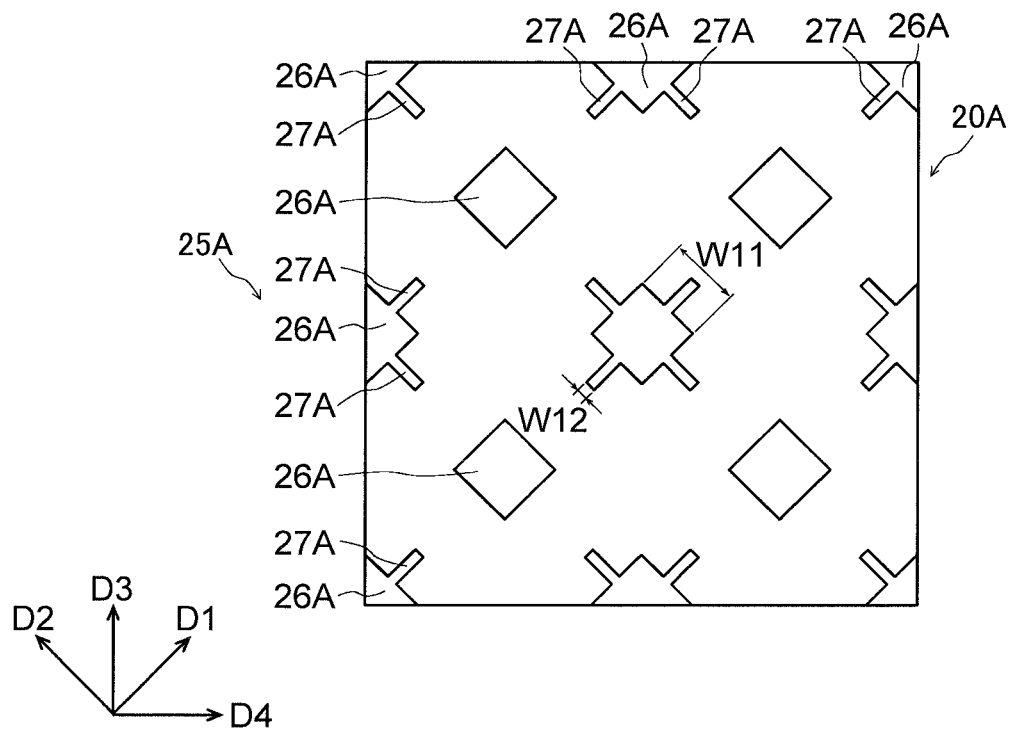
FIG. 63 is a plan view showing an example of the first deposition mask.

FIG. 63 is a plan view showing the first deposition mask 20A seen from the first surface 201 side. As shown in FIG. 63, the first deposition mask 20A includes a plurality of the mask first main areas 26A arranged along the first direction D1 and the second direction D2. The first deposition mask 20A may include the mask first extension area 27A extending to one side of the first direction D1 from the mask first main area 26A and the mask first extension area 27A extending to the other side of the first direction D1 from the mask first main area 26A. The first deposition mask 20A may include the mask first extension area 27A extending to one side of the second direction D2 from the mask first main area 26A and the mask first extension area 27A extending to the other side of the second direction D2 from the mask first main area 26A.

The dimension W12 of the mask first extension area 27A may be smaller than the dimension W11 of the mask first main area 26A in a direction orthogonal to the first direction D1 or the second direction in which the mask first extension area 27A extends from the mask first main area 26A. Since a relationship between the dimension W12 and the dimension W11 is similar to that of the example shown in FIG. 22, description is omitted.

As shown in FIG. 63, the first through hole 25A of the first deposition mask 20A may include the mask first main area 26A to which the mask first extension area 27A is not connected. For example, the mask first main areas 26A to which the mask first extension areas 27A are not connected and the mask first main areas 26A to which the mask first extension areas 27A are connected may be alternately arranged in the first direction D1 and the second direction D2.

Figure 64:
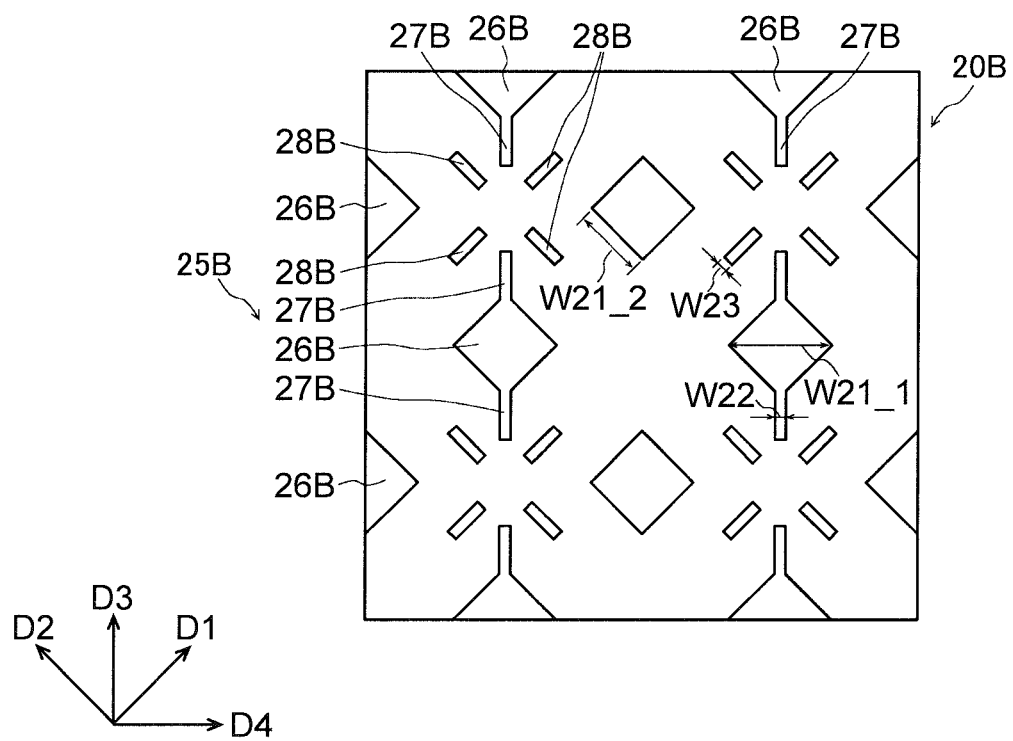
FIG. 64 is a plan view showing an example of the second deposition mask.

FIG. 64 is a plan view showing the second deposition mask 20B seen from the first surface 201 side. As shown in FIG. 64, the second deposition mask 20B includes a plurality of the mask second main areas 26B arranged along the first direction D1 and the second direction D2. The second deposition mask 20B may include the mask second extension area 27B extending to one side of the third direction D3 intersecting the first direction D1 and the second direction D2 from the mask second main area 26B, and the mask second extension area 27B extending to the other side of the third direction D3 from the mask second main area 26B. The third direction D3 may be a direction forming 45° with respect to the first direction D1 and the second direction D2.

The dimension W22 of the mask second extension area 27B may be smaller than a dimension W21_1 of the mask second main area 26B in a direction orthogonal to the third direction D3 in which the mask second extension area 27B extends from the mask second main area 26B. Since a relationship between the dimension W22 and the dimension W21_1 is similar to the relationship between the dimension W22 and the dimension W21 in the example shown in FIG. 23, description is omitted.

As shown in FIG. 64, the second through hole 25B of the second deposition mask 20B may include the mask second main area 26B to which the mask second extension area 27B is not connected. For example, the mask second main areas 26B to which the mask second extension areas 27B are not connected and the mask second main areas 26B to which the mask second extension areas 27B are connected may be alternately arranged in the first direction D1 and the second direction D2.

The dimension W23 of the mask second extension area 27B may be smaller than a dimension W21_2 of the mask second main area 26B in a direction orthogonal to the first direction D1 or the second direction D2 in which the mask second extension area 27B extends. Since a relationship between the dimension W23 and the dimension W21_2 is similar to the relationship between the dimension W23 and the dimension W21 in the example shown in FIG. 23, description is omitted.

As shown in FIG. 64, the second through hole 25B of the second deposition mask 20B may include a plurality of the mask second auxiliary areas 28B extending in the first direction D1 or the second direction D2. The mask second auxiliary area 28B may not be connected to the mask second main area 26B.

Figure 65:
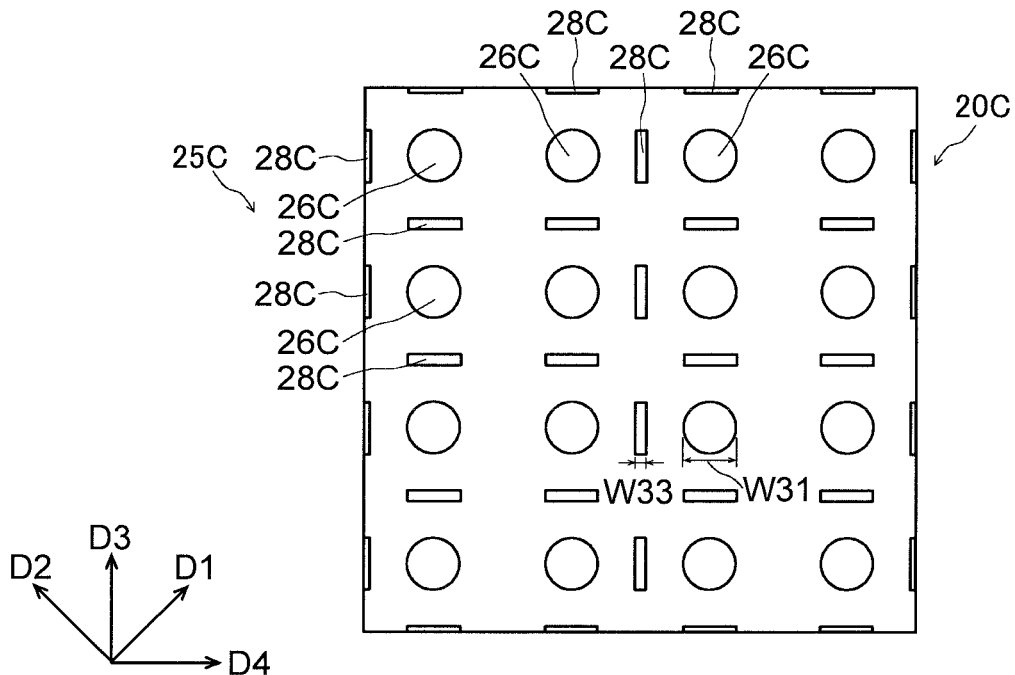
FIG. 65 is a plan view showing an example of the third deposition mask.

FIG. 65 is a plan view showing the third deposition mask 20C seen from the first surface 201 side. As shown in FIG. 65, the third deposition mask 20C includes a plurality of the mask third main areas 26C arranged along the third direction D3 and the fourth direction D4. The third deposition mask 20C may include a plurality of the mask third auxiliary areas 28C located between the two mask third main areas 26C adjacent to each other in the third direction D3 and extending in the fourth direction D4 orthogonal to the third direction D3. The third deposition mask 20C may include a plurality of the mask third auxiliary areas 28C located between the two mask third main areas 26C adjacent to each other in the fourth direction D4 and extending in the third direction D3.

The dimension W33 of the mask third auxiliary area 28C may be smaller than the dimension W31 of the mask third main area 26C in a direction orthogonal to the third direction D3 or the fourth direction D4 in which the mask third auxiliary area 28C extends. Since a relationship between the dimension W33 and dimension W31 is similar to the relationship between the dimension W13 and the dimension W11 in the example shown in FIG. 22, description is omitted.

Figure 66:
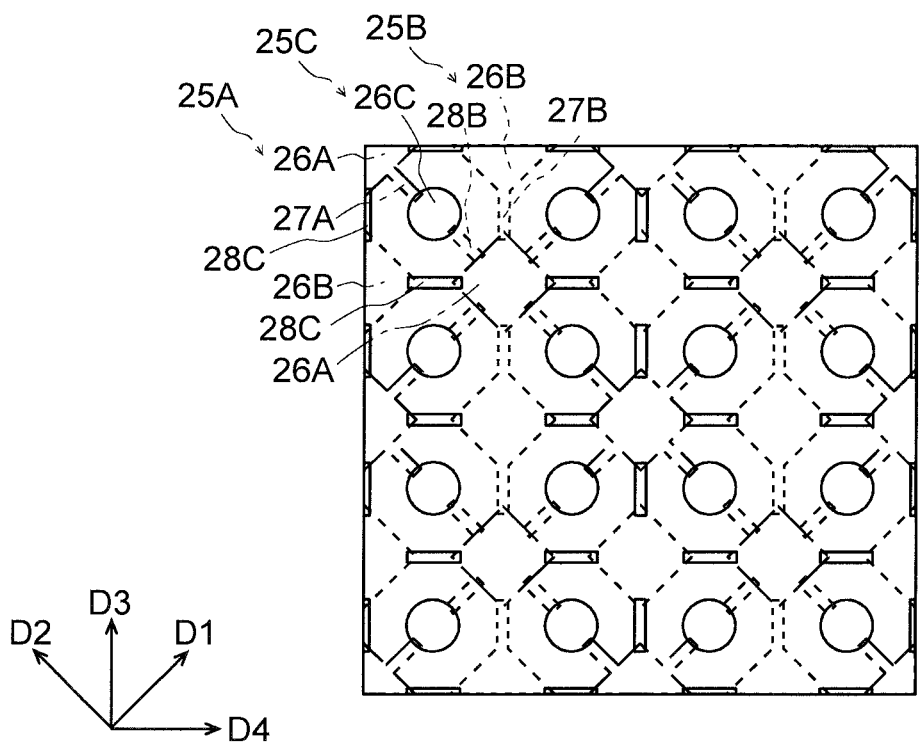
FIG. 66 is a view showing a state in which the first deposition mask, the second deposition mask and the third deposition mask are overlapped.

FIG. 66 is a view showing the laminate 21 obtained by overlapping the first deposition mask 20A shown in FIG. 63, the second deposition mask 20B shown in FIG. 64 and the third deposition mask 20C shown in FIG. 65. Also in the embodiment shown in FIGS. 61 to 66, when the first deposition mask 20A, the second deposition mask 20B and the third deposition mask 20C are overlapped, the first through hole 25A of the first deposition mask 20A partly overlaps the second through hole 25B of the second deposition mask 20B or the third through hole 25C of the third deposition mask 25C. Thus, the first layer 140A can be electrically connected to the second layer 140B or the third layer 140C, whereby it is easy to stably control an electric potential of the second electrode 140. The first layer 140A can partly overlap the second layer 1408 or the third layer 140C. Thus, an electric resistance of the second electrode 140 in the in-plane direction of the substrate 91 can be reduced.

The overlap of the first through hole 25A of the first deposition mask 20A, the second through hole 25B of the second deposition mask 20B and the third through hole 25C of the third deposition mask 20C is described in detail. As shown in FIG. 66, when the first deposition mask 20A, the second deposition mask 20B and the third deposition mask 20C are overlapped, the mask first extension area 27A of the first deposition mask 20A may extend from the mask first main area 26A in the first direction D1 or the second direction D2 to partly overlap the mask third main area 26C of the third deposition mask 20C. Thus, the electrode first extension area 142A of the first layer 140A can partly overlap the electrode third main area 141C of the third layer 140C.

As shown in FIG. 66. the mask second extension area 27B of the second deposition mask 20B may extend from the mask second main area 26B in the third direction D3 to partly overlap the mask third main area 26C of the third deposition mask 20C. Thus, the electrode second extension area 142B of the second layer 140B can partly overlap the electrode third main area 141C of the third layer 140C. The mask second auxiliary area 28B of the second deposition mask 20B may extend between the mask first main area 26A of the first deposition mask 20A and the mask third main area 26C of the third deposition mask 20C in the first direction D1 or the second direction D2 to partly overlap the mask first main area 26A and the mask third main area 26C. Thus, the electrode second auxiliary area 143B of the second layer 140B can partly overlap the electrode first main area 141A of the first layer 140A and the electrode third main area 141C of the third layer 140C.

As shown in FIG. 66, the mask third auxiliary area 28C of the third deposition mask 20C may extend between the mask first main area 26A of the first deposition mask 20A and the mask second main area 26B of the second deposition mask 20B in the third direction D3 or the fourth direction D4 to partly overlap the mask first main area 26A and the mask second main area 26B. Thus, the electrode third auxiliary area 143C of the third layer 140C can partly overlap the electrode first main area 141A of the first layer 140A and the electrode second main area 141B of the second layer 140B.

Next, another example of using the deposition mask group to form the second electrode 140 of the electronic device 100 is described with reference to FIGS. 67 to 70. In the embodiment shown in FIGS. 67 to 70, a part that can be similarly constituted to the embodiment shown in FIGS. 17 to 25 has the same reference numeral as that of corresponding part the embodiment shown in FIGS. 17 to 25, and overlapped description is omitted.

Figure 67:
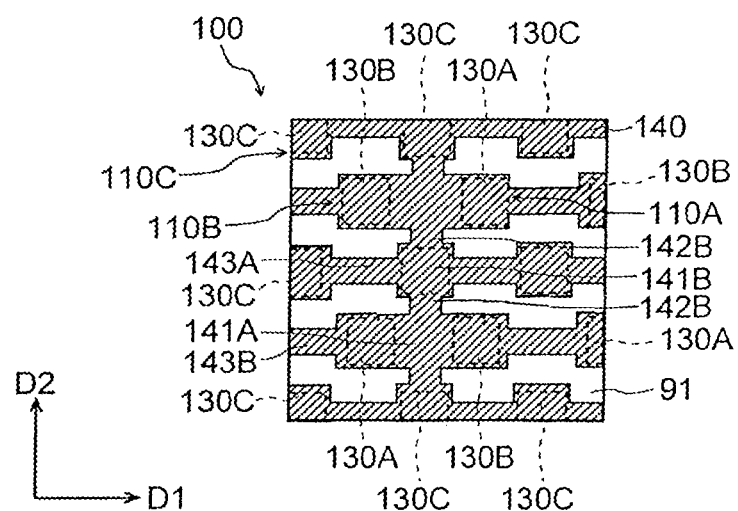
FIG. 67 is a plan view showing an example of the substrate with the second electrode being formed on the first energizing layer, the second energizing layer and the third energizing layer.

FIG. 67 is a plan view showing the substrate 91 with the second electrode 140 being formed on the first energizing layers 130A, the second energizing layers 130B and the third energizing layers 130C shown in FIG. 17.

Next, the first deposition mask 20A, the second deposition mask 20B and the third deposition mask 20C used for forming the first layer 140A, the second layer 140B and the third layer 140C of the second electrode 140 shown in FIG. 67 are described. In the embodiment shown in FIGS. 17 to 25, the example in which three deposition masks are used is described. In this embodiment, an example in which two deposition masks are used is described. The deposition mask group in this embodiment includes the first deposition mask 20A and the second deposition mask 20B.

Figure 68:
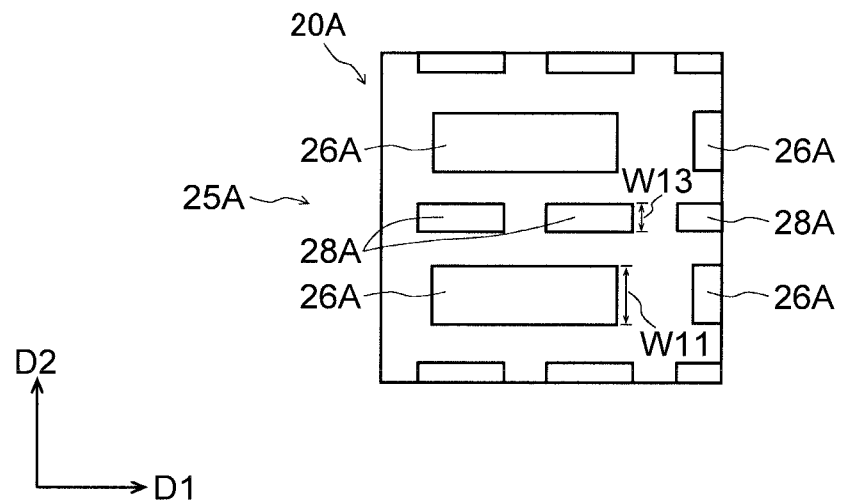
FIG. 68 is a plan view showing an example of the first deposition mask.

FIG. 68 is a plan view showing the first deposition mask 20A seen from the first surface 201 side. As shown in FIG. 68, the first deposition mask 20A may include a plurality of the mask first main areas 26A arranged along the first direction D1 and the second direction D2 and a plurality of the mask first auxiliary areas 28A arranged along the first direction D1 and the second direction D2. The dimension W13 of the mask first auxiliary area 28A may be smaller than the dimension W11 of the mask first main area 26A in a direction orthogonal to the first direction D1 in which the mask first auxiliary area 28A extends. Since a relationship between the dimension W13 and the dimension S11 is similar to that of the example shown in FIG. 22, description is omitted. The mask first auxiliary area 28A may not be connected to the mask first main area 26A.

As shown in FIG. 68, the two mask first auxiliary areas 28A may be arranged in the first direction D1 between the two mask first main areas 26A adjacent to each other in the second direction D2. As shown in FIGS. 67 and 68, the electrode first main area 141A formed correspondingly to the mask first main area 26A may overlap both the first energizing layer 130A and the second energizing layer 130B adjacent to each other in the first direction D1.

Figure 69:
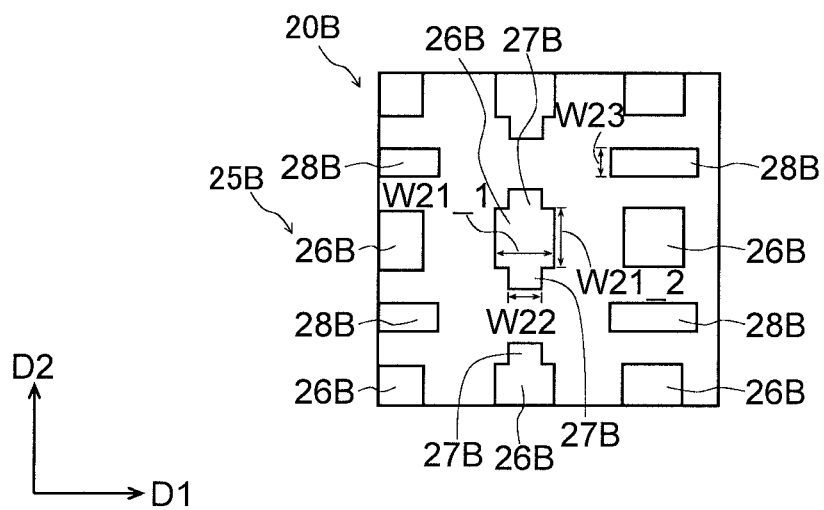
FIG. 69 is a plan view showing an example of the second deposition mask.

FIG. 69 is a plan view showing the second deposition mask 20B seen from the first surface 201 side. As shown in FIG. 69, the second deposition mask 20B may include a plurality of the mask second main areas 26B arranged along the first direction D1 and the second direction D2. As shown in FIGS. 67 and 69, the electrode second main area 141B formed correspondingly to the mask second main area 26B may overlap the third energizing layer 130C.

As shown in FIG. 69, the second deposition mask 20B may include the mask second extension area 27B extending to one side of the second direction D2 from the mask second main area 26B, and the mask second extension area 27B extending to the other side of the second direction D2 from the mask second main area 26B. The dimension W22 of the mask second extension area 27B may be smaller than a dimension W21_1 of the mask second main area 26B in a direction orthogonal to the second direction D2 in which the mask second extension area 27B extends from the mask second main area 26B. Since a relationship between the dimension W22 and the dimension W21_1 is similar to the relationship between the dimension W22 and the dimension W21 in the example shown in FIG. 23, description is omitted.

As shown in FIG. 69, the second deposition mask 20B may include a plurality of the mask second auxiliary area 28B arranged along the first direction D1 and the second direction D2. The dimension W23 of the mask second auxiliary area 28B may be smaller than a dimension W21_2 of the mask second main area 26B in a direction orthogonal to the first direction D1 in which the mask second auxiliary area 28B extends. Since a relationship between the dimension W23 and the dimension W21_2 is similar to the relationship between the dimension W23 and the dimension W21 in the example shown in FIG. 23, description is omitted. The mask second auxiliary area 28B may not be connected to the mask first auxiliary area 28A.

Figure 70:
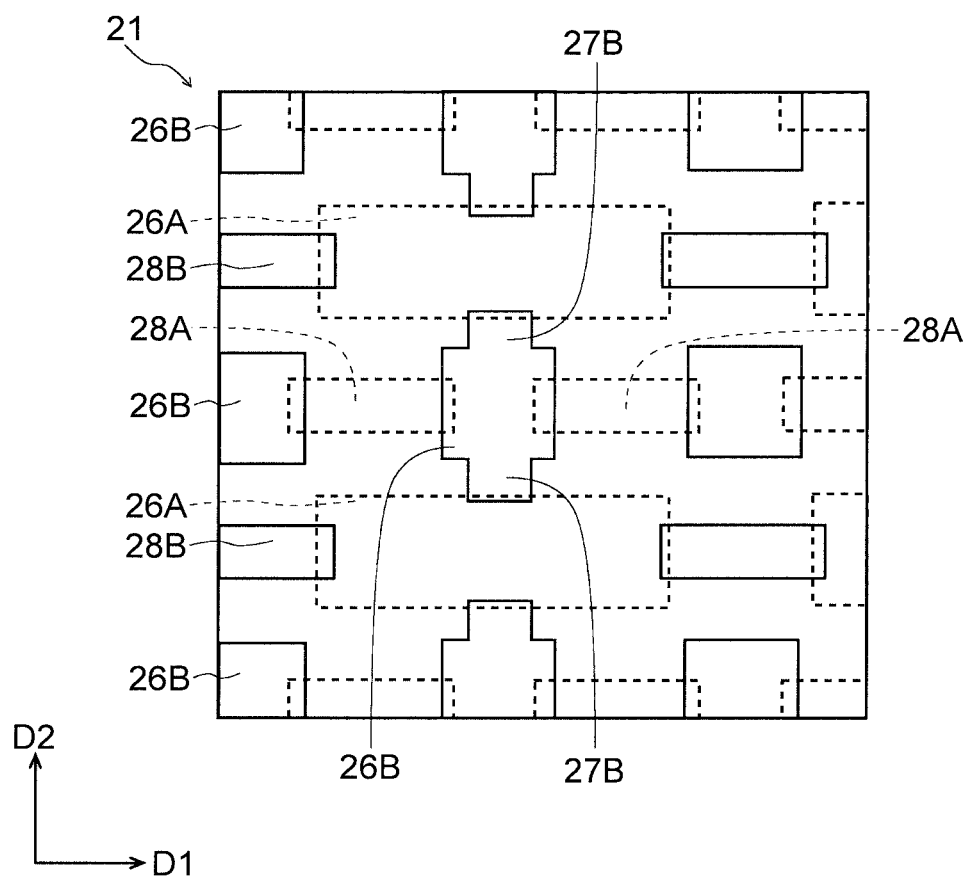
FIG. 70 is a view showing a state in which the first deposition mask and the second deposition mask are overlapped.

FIG. 70 is a view showing the laminate 21 obtained by overlapping the first deposition mask 20A shown in FIG. 68 and the second deposition mask 20B shown in FIG. 69. Also in the embodiment shown in FIGS. 67 to 70, when the first deposition mask 20A and the second deposition mask 20B are overlapped, the first through hole 25A of the first deposition mask 20A and the second through hole 25B of the second deposition mask 20B partly overlap. Thus, the first layer 140A and the second layer 140B can be electrically connected, whereby it is easy to stably control an electric potential of the second electrode 140. The first layer 140A and the second layer 140B can partly overlap. Thus, an electric resistance of the second electrode 140 in the in-plane direction of the substrate 91 can be reduced.

The overlap of the first through hole 25A of the first deposition mask 20A and the second through hole 25B of the second deposition mask 20B is described in detail. As shown in FIG. 70, when the first deposition mask 20A and the second deposition mask 20B are overlapped, the mask first auxiliary area 28A of the first deposition mask 20A may extend in the first direction D1 to partly overlap the two mask second main areas 26B adjacent to each other in the first direction D1. Thus, the electrode first auxiliary area 143A of the first layer 140A, which is formed correspondingly to the mask first auxiliary area 28A, can partly overlap the electrode second main area 141B of the second layer 140B.

As shown in FIG. 70, the mask second extension area 27B of the second deposition mask 20B may extend from the mask second main area 26B in the second direction D2 to partly overlap the mask first main area 26A. Thus, the electrode second extension area 142B of the second layer 140B can partly overlap the electrode first main area 141A of the first layer 140A. The mask second auxiliary area 28B of the second deposition mask 20B may extend in the first direction D1 to partly overlap the two mask first main areas 26A adjacent to each other in the first direction D1. Thus, the electrode second auxiliary area 143B can partly overlap the two electrode first main areas 141A adjacent to each other in the first direction D1.

An example of a shape of the first through hole 25A of the first deposition mask 20A is described with reference to FIG. 71. The first through hole 25A shown in FIG. 71 is the same as the first through hole 25 shown in FIG. 13, except its corner shape.

Figure 71:
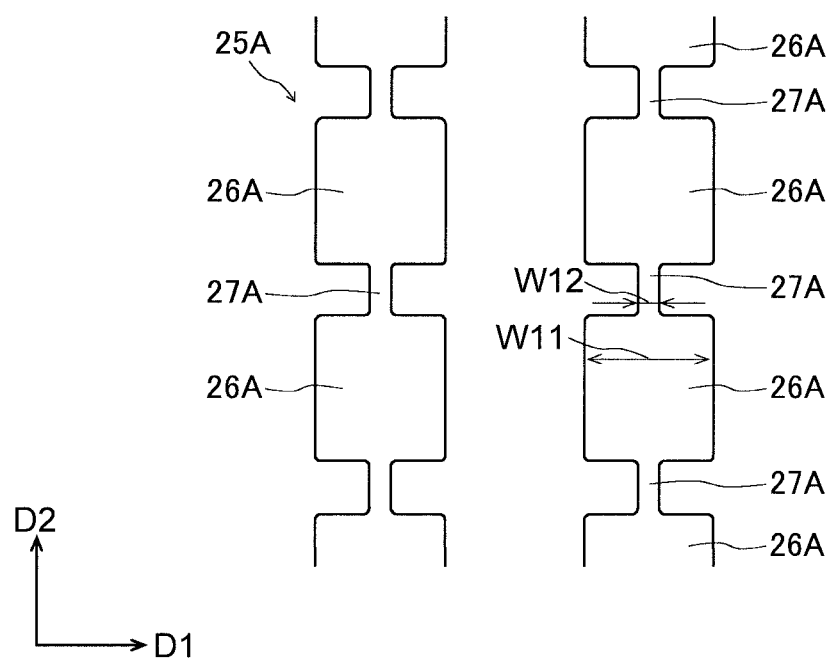
FIG. 71 is a plan view showing an example of the first deposition mask.

As shown in FIG. 71, the corner of the mask first main area 26A of the first through hole 25A may include a curved profile. The corner is a portion where two straight lines constituting the profile of the through hole 25 cross. Although not shown, the corner of the mask first main area 26A of the first through hole of each aforementioned embodiment may include a curved profile. In addition, although not shown, the corners of other areas, such as the mask first extension area 27A, the mask first auxiliary area 28A, etc., of each aforementioned embodiment may include a curved profile. Although not shown, the corner of the area of the second through hole 256 of the second deposition mask 20B and the corner of the area of the third through hole 25C of the third deposition mask 20C may include a curved profile.

Next, an example of a structure of the electronic device 100 is described with reference to FIG. 72. When the electronic device 100 is an organic EL display, the elements 110 function as pixels. The electronic device 100 includes a display area 105 including the elements 110 functioning as pixels. The display area 105 may include a first display area 106 and a second display area 107.

A planar dimension of the first display area 106 may be smaller than a planar dimension of the second display area 107. The first display area 106 may include the electrode-free area 150 free of the second electrode 140. Thus, a light transmittance of the electronic device 100 can be improved, as compared with a case in which the second electrode 140 is formed entirely over the first display area 106. The use of the aforementioned deposition mask group enables the second electrode 140 of the first display area 106 to be formed.

Similarly to the first display area 106, the second display area 107 may include the electrode-free area 150 free of the second electrode 140. In this case, the use of the aforementioned deposition mask group enables the second electrode 140 of the second display area 107 to be formed. The shape and the arrangement of the through holes 25 of the deposition mask 20 for forming the second electrode 140 of the second display area 107 may be the same as the shape and the arrangement of the through holes 25 of the deposition mask 20 for forming the second electrode 140 of the first display area 106, or may be different therefrom.

One deposition mask 20 may include the through holes 25 for forming the second electrode 140 of the first display area 106 and the through holes 25 for forming the second electrode 140 of the second display area 107.

The second display area 107 may not include the electrode-free area 150 free of the second electrode 140. In other words, the second electrode 140 may be formed entirely over the second display area 107. In this manner, the technique of forming the electrode-free area 150 on the electronic device 100 to improve a light transmittance thereof may be applied partly to the electronic device 100 instead of entirely.

Figure 73:
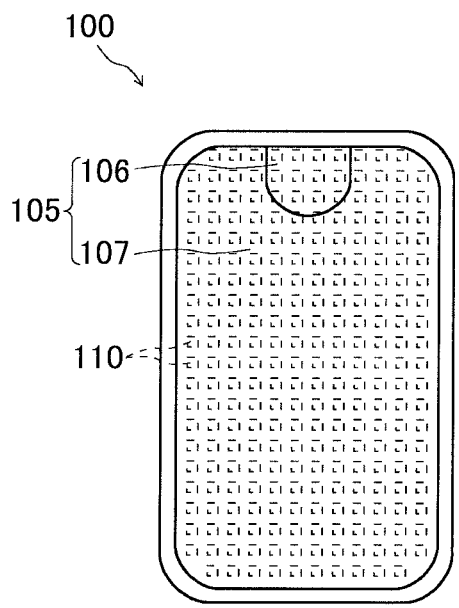
FIG. 73 is a plan view showing an example of the electronic device.

An example of the structure of the electronic device 100 is described with reference to FIG. 73.

Figure 72:
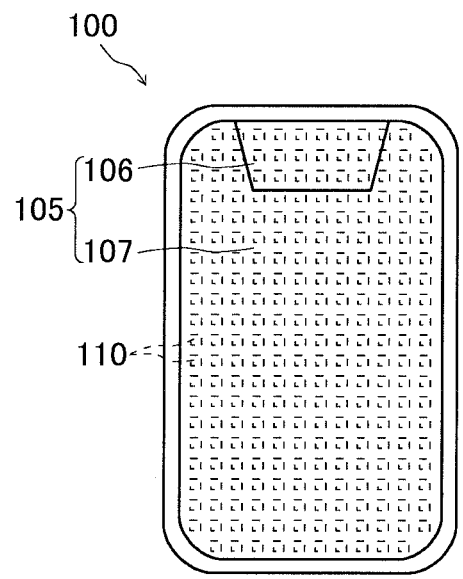
FIG. 72 is a plan view showing an example of the electronic device.

FIG. 72 shows the example in which the boundary between the first display area 106 and the second display area 107 is formed of straight lines in a plan view. However, not limited thereto, as shown in FIG. 73, the boundary between the first display area 106 and the second display area 107 may include a curved line.

The invention claimed is:

1. A manufacturing method of an electronic device comprising:
    providing a deposition mask group comprising
        a first deposition mask having two or more first through holes arranged along a first direction, and
        a second deposition mask having two or more second through holes,
        wherein the first through hole includes two or more mask first main areas arranged along a second direction intersecting the first direction and a mask first extension area extending to connect the two mask first main areas adjacent to each other in the second direction, the mask first extension area having a dimension smaller than the mask first main area in a direction orthogonal to the second direction, and
        wherein the first through hole partly overlaps the second through hole when the first deposition mask and the second deposition mask are overlapped; and
    a second-electrode forming step of forming a second electrode on an energizing layer on a first electrode on a substrate using the deposition mask group, the second-electrode forming step comprising
        a step of forming a first layer of the second electrode by a deposition method using the first deposition mask, and
        a step of forming a second layer of the second electrode by a deposition method using the second deposition mask.

2. The method of manufacturing an electronic device according to claim 1, wherein at least one of the two or more mask first main areas is connected to another one of the mask first main areas via the second through hole when the first deposition mask and the second deposition mask are overlapped.

3. The method of manufacturing an electronic device according to claim 1, wherein the mask first extension area entirely or partly overlaps the second through hole when the first deposition mask and the second deposition mask are overlapped.

4. The method of manufacturing an electronic device according to claim 3, wherein the second through hole entirely or partly overlaps the two mask first main areas adjacent to each other in the second direction and the mask first extension area connected to the two mask first main areas when the first deposition mask and the second deposition mask are overlapped.

5. The method of manufacturing an electronic device according to claim 1, wherein a dimension of the mask first extension area is 0.9 times or less a dimension of the mask first main area in a direction orthogonal to the second direction.

6. A manufacturing method of an electronic device comprising:
    providing a deposition mask group comprising
        a first deposition mask having two or more first through holes, and
        a second deposition mask having two or more second through holes,
        wherein the two or more first through holes include two or more mask first main areas arranged along a first direction and arranged along a second direction intersecting the first direction and two or more mask first auxiliary areas located between the two mask first main areas adjacent to each other in the second direction, the mask first auxiliary area having a dimension smaller than the mask first main area in the second direction,
        wherein the two or more second through holes are arranged along the first direction and the second direction, and
        wherein the mask first auxiliary area extends to partly overlap the two second through holes adjacent to each other in the first direction when the first deposition mask and the second deposition mask are overlapped;
    a second-electrode forming step of forming a second electrode on an energizing layer on a first electrode on a substrate by using the deposition mask group, the second-electrode forming step comprising
        a step of forming a first layer of the second electrode by a deposition method using the first deposition mask, and a step of forming a second layer of the second electrode by a deposition method using the second deposition mask.

7. The method of manufacturing an electronic device according to claim 6, wherein the second through hole extends to partly overlap the two mask first main areas adjacent to each other in the second direction when the first deposition mask and the second deposition mask are overlapped.

8. The method of manufacturing an electronic device according to claim 6, wherein a dimension of the mask first auxiliary area is 0.9 times or less a dimension of the mask first main area in the second direction.

\* \* \* \* \*